(12) United States Patent
Lue et al.

(10) Patent No.: US 9,214,236 B2
(45) Date of Patent: Dec. 15, 2015

(54) THERMALLY ASSISTED FLASH MEMORY WITH DIODE STRAPPING

(71) Applicant: Macronix International Co., Ltd., Hsinchu (TW)

(72) Inventors: Hang-Ting Lue, Zhubei (TW); Chun Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/275,464

(22) Filed: May 12, 2014

(65) Prior Publication Data

US 2014/0286097 A1    Sep. 25, 2014

Related U.S. Application Data

(63) Continuation of application No. 13/458,970, filed on Apr. 27, 2012, now Pat. No. 8,724,393, which is a continuation-in-part of application No. 13/099,298, filed on May 2, 2011, now Pat. No. 8,488,387.

(60) Provisional application No. 61/596,886, filed on Feb. 9, 2012, provisional application No. 61/603,810, filed on Feb. 27, 2012.

(51) Int. Cl.
*G11C 16/04* (2006.01)
*G11C 16/12* (2006.01)
(Continued)

(52) U.S. Cl.
CPC ............ *G11C 16/08* (2013.01); *G11C 16/3495* (2013.01); *H01L 21/28273* (2013.01); *H01L 21/28282* (2013.01); *H01L 21/84* (2013.01);
(Continued)

(58) Field of Classification Search
CPC ................................ G11C 16/12; G11C 5/025
USPC ......................................... 365/185.18, 51, 63
See application file for complete search history.

(56) References Cited

U.S. PATENT DOCUMENTS 5,956,350 A    9/1999  Irrinki et al.
6,009,033 A   12/1999  Li et al.
(Continued)

FOREIGN PATENT DOCUMENTS

EP         2048709 A2    4/2009
WO      2008067494 A1    6/2008
WO      2011022123 A1    2/2011

OTHER PUBLICATIONS

U.S. Appl. No. 13/458,975, filed Apr. 27, 2012, "Thermally Assisted Flash Memory with Segmented Word Lines," H-T Lue. (cited in parent).

(Continued)

*Primary Examiner* — Son Mai
(74) *Attorney, Agent, or Firm* — Kenta Suzue; Haynes Beffel & Wolfeld LLP

(57) ABSTRACT

A memory includes an array of memory cells including rows and columns. The memory includes circuitry coupled to the word lines applying a first bias voltage to a first set of spaced-apart locations on a word line or word lines in the array, while applying a second bias voltage different than the first bias voltage, to a second set of spaced-apart locations on the word line or word lines, locations in the first set of spaced-apart locations being interleaved among locations in the second set of spaced-apart locations, whereby current flow is induced between locations in the first and second sets of locations that cause heating of the word line or word lines.

26 Claims, 61 Drawing Sheets

(51) Int. Cl.

| | |
|---|---|
| *G11C 16/08* | (2006.01) |
| *H01L 21/28* | (2006.01) |
| *H01L 21/84* | (2006.01) |
| *H01L 27/102* | (2006.01) |
| *H01L 27/115* | (2006.01) |
| *H01L 27/12* | (2006.01) |
| *H01L 29/423* | (2006.01) |
| *H01L 29/66* | (2006.01) |
| *H01L 29/788* | (2006.01) |
| *H01L 29/792* | (2006.01) |
| *G11C 16/34* | (2006.01) |
| *G11C 5/02* | (2006.01) |

(52) U.S. Cl.
CPC ........ *H01L 27/1021* (2013.01); *H01L 27/1157* (2013.01); *H01L 27/11524* (2013.01); *H01L 27/11565* (2013.01); *H01L 27/11578* (2013.01); *H01L 27/11582* (2013.01); *H01L 27/1203* (2013.01); *H01L 29/4234* (2013.01); *H01L 29/42324* (2013.01); *H01L 29/42328* (2013.01); *H01L 29/42344* (2013.01); *H01L 29/66825* (2013.01); *H01L 29/66833* (2013.01); *H01L 29/788* (2013.01); *H01L 29/792* (2013.01); *H01L 29/7926* (2013.01); *G11C 5/025* (2013.01); *G11C 16/0408* (2013.01); *G11C 16/0466* (2013.01); *G11C 16/0483* (2013.01); *H01L 2924/0002* (2013.01)

(56) References Cited

U.S. PATENT DOCUMENTS

| | | | |
|---|---|---|---|
| 6,251,717 | B1 | 6/2001 | Ramsbey et al. |
| 6,603,678 | B2 | 8/2003 | Nickel et al. |
| 6,750,101 | B2 | 6/2004 | Lung |
| 7,248,524 | B2 | 7/2007 | Nordal et al. |
| 7,301,818 | B2 | 11/2007 | Lu et al. |
| 7,315,474 | B2 | 1/2008 | Lue |
| 7,382,654 | B2 | 6/2008 | Hsu et al. |
| 7,626,228 | B2 | 12/2009 | Park et al. |
| 7,704,847 | B2 | 4/2010 | Cannon et al. |
| 7,709,334 | B2 | 5/2010 | Lai et al. |
| 8,004,918 | B2 | 8/2011 | Gouin |
| 8,085,615 | B2 | 12/2011 | Taguchi |
| 8,102,699 | B2 | 1/2012 | Toda |
| 8,138,573 | B2 | 3/2012 | Cannon et al. |
| 8,193,573 | B2 | 6/2012 | Bronner et al. |
| 8,247,862 | B2 | 8/2012 | Babcock et al. |
| 8,344,475 | B2 | 1/2013 | Shaeffer et al. |
| 8,351,240 | B2 | 1/2013 | Park et al. |
| 8,724,393 | B2 | 5/2014 | Lue et al. |
| 2004/0174728 | A1 | 9/2004 | Takano et al. |
| 2005/0052893 | A1* | 3/2005 | Perner et al. .................. 365/104 |
| 2008/0084729 | A1 | 4/2008 | Cho et al. |
| 2009/0039414 | A1 | 2/2009 | Lue et al. |
| 2010/0025811 | A1 | 2/2010 | Bronner et al. |
| 2010/0155784 | A1* | 6/2010 | Scheuerlein et al. ......... 257/209 |
| 2010/0246235 | A1 | 9/2010 | Gouin |
| 2010/0259960 | A1* | 10/2010 | Samachisa ...................... 365/51 |
| 2012/0182804 | A1 | 7/2012 | Hung et al. |
| 2012/0281481 | A1 | 11/2012 | Lue et al. |
| 2012/0327719 | A1 | 12/2012 | Lue |

OTHER PUBLICATIONS

U.S. Appl. No. 13/099,298, filed May 2, 2011, "Thermally Assisted Dielectric Charge Trapping Flash," H-T Lue et al. (cited in parent).
Extended EP Search Report in application No. ep12163608.8, mailed Sep 20, 2012, 8 pages. (cited in parent).
Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, Jun. 16-18, 2009, pp. 136-137. (cited in parent).
Kim, et al., Multi-Layered Vertical Gate NAND Flash Overcoming Stacking Limit for Terabit Density Storage, 2009 Symposium on VLSI Technology Digest of Technical Papers, Jun. 16-18, 2009, pp. 188-189.(cited in parent).
Kim, et al., Novel Vertical-Stacked-Array-Transistor (VSAT) for ultra-high-density and cost-effective NAND Flash memory devices and SSD (Solid State Drive), 2009 Symposium on VLSI Technology Digest of Technical Papers, Jun. 16-18, 2009, pp. 186-187.(cited in parent).
Lee J-D et al., "Effects of Interface Trap Generation and Annihilation on the Data Retention Characteristics of Flash Memory Cells," IEEE Trans. on Device and Materials Reliability, vol. 4, No. 1, Mar. 2004, pp. 110-117.(cited in parent).
Lue, Hang-Ting et al., Scaling Evaluation of BE-SONOS NAND Flash Beyond 20nm, 2008 Symposium on VLSI technology, Digest of Papers, Jun. 2008, 116-117.(cited in parent).
Lue, Hang-Ting, et al, BE-SONOS: A Bandgap engineered SONOS with excellent performance and reliability, Electron Devices Meeting, 2005 IEDM Technical Digest, IEEE International, Dec. 5-7, 2005 pp. 547-550.(cited in parent).
Mielke N et al., "Flash EEPROM Treshold Instabilities due to Charge Trapping During Program/Erase Cycling," IEEE Trans. on Device and Materials Realiability, vol. 4, No. 3, Sep. 2004, pp. 335-344. (cited in parent).
Partial EP Search Report from Application No. EP 121661993.5 mailed Oct. 26, 2012, 6 pages.(cited in parent).
Shin et al., "High Reliable SONOS-type NAND Flash Memory Cell with Al2O3 or Top Oxide," IEEE IEDM, Feb. 16-20, 2003 (MANOS).(cited in parent).
Shin et al., A Novel NAND-type Monos Memory using 63 nm Process Technology for a Multi-Gigabit Flash EEPROMs, IEEE IEDM Technical Digest Dec. 5, 2005, pp. 327-330.(cited in parent).
Wu Q et al., "A First Study on Self-Healing Solid-State Drives," IEEE Int'l Memory Workshop (IMW), May 2011, 4pp. (cited in parent).
European search report dated Jun. 10, 2013 for related application EP 13154198, 6 pp. (cited in parent).

* cited by examiner

- WL/BL formed before cell array.
- Source and Vbb are electrically tied to CSL for body erase.
- Multi-SSLs is for Common BL and WL structure.
- 4F2 structure.

THERMALLY ASSISTED FLASH MEMORY WITH DIODE STRAPPING

RELATED APPLICATIONS

This application is a continuation of co-pending U.S. patent application Ser. No. 13/458,970 filed on 27 Apr. 2012, entitled "Thermally Assisted Flash Memory With Diode Strapping," which application is a continuation-in-part of U.S. patent application Ser. No. 13/099,298 filed on 2 May 2011 entitled "Thermally Assisted Dielectric Charge Trapping Flash" (now U.S. Pat. No. 8,488,387); and which application claims the benefit of U.S. Provisional Patent Application No. 61/596,886 filed on 9 Feb. 2012, entitled "Self Healing Flash Memory"; and which application claims the benefit of U.S. Provisional Patent Application 61/603,810 filed on 27 Feb. 2012, entitled "Thermally Assisted Flash Memory"; which applications are all incorporated by reference as if fully set forth herein.

BACKGROUND OF THE INVENTION

1. Field of the Invention

The present invention relates to flash memory technology.

2. Description of Related Art

Flash memory is a class of non-volatile integrated circuit memory technology. The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S). More advanced flash memory technology has been developed, using bandgap engineered tunneling dielectrics in dielectric charge trapping cells. One bandgap engineered cell technology is known as BE-SONOS, as described in Hang-Ting Lue et al., "Scaling Evaluation of BE-SONOS NAND Flash Beyond 20 nm", 2008 Symposium on VLSI technology, Digest of Papers, June 2008, and in H. T. Lue et al., IEDM Tech. Dig., 2005, pp. 547-550.

It is desirable to provide technology improving the speed of operation and endurance of flash memory.

SUMMARY OF THE INVENTION

A memory device is described which includes resources for thermally annealing flash memory cells on the device. A method for operating flash memory can be applied that includes performing read, program and erase operations; and either interleaved among, or during, the read, program and erase operations, thermally annealing charge trapping structures in the memory cells in the array. Experimental results discussed below show that suitable annealing operations can improve endurance by repairing damage accumulated during program and erase cycling. For example, by periodically annealing memory cells in the array, the effective endurance of the device can be greatly improved, including achieving endurance cycling performance of 1 million cycles and more. Also, by applying the annealing during operations, such as during an erase operation, performance of the affected operation can be improved. During an erase operation for example, thermal annealing can assist electron de-trapping, and thereby improve erase speed.

Integrated circuit memory can be implemented with word line drivers and word line termination circuits, responsive to decoder circuitry and optionally other control circuits, to drive a current on corresponding word lines. The current can cause resistive heating of the selected word lines, that is transferred to the dielectric charge trapping structures for the anneal operation. This and other techniques can be applied to allow flexible delivery of the annealing operation.

Also, a memory can be implemented using a circuit that operates by applying a first bias voltage to a first set of spaced-apart locations on a word line or word lines in the array, while applying a second bias voltage different than the first bias voltage, to a second set of spaced-apart locations on the word line or word lines, in the first set of spaced-apart locations being interleaved among locations in the second set of spaced-apart locations, whereby current flow is induced between locations in the first and second sets of locations that cause heating of the word line or word lines.

The technology described herein is suitable for use with BE-SONOS memory technologies, and other flash memory technologies.

Other aspects and advantages of the present technology can be seen on review of the drawings, the detailed description and the claims which follow.

DETAILED DESCRIPTION

Figure 58:
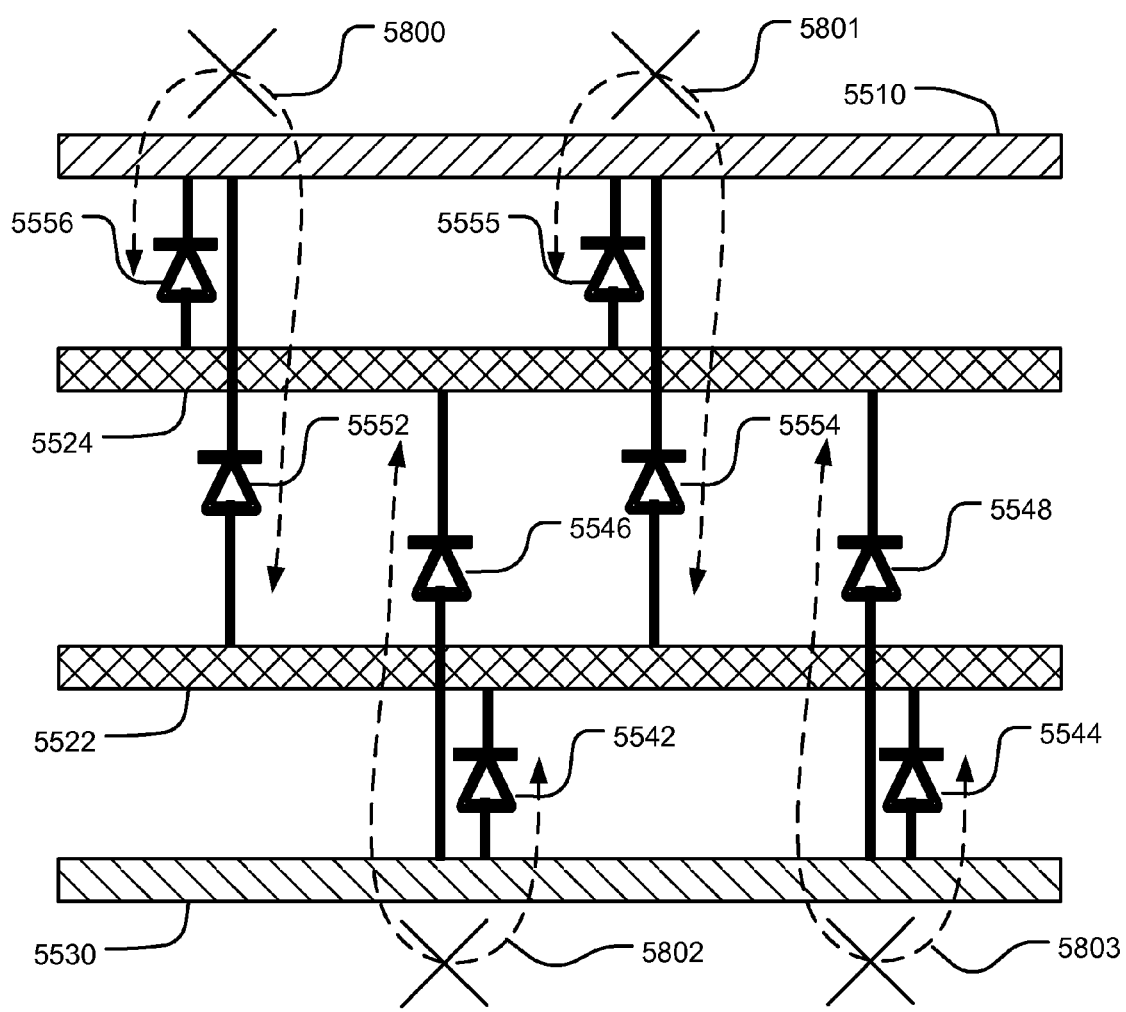
FIG. 58 is a simplified view of multiple local word lines between first and second conductors with diode strapping, showing elimination of sneak paths.

A detailed description of implementations of the present technology is provided with reference to the FIGS. 1-58.

Figure 1A:
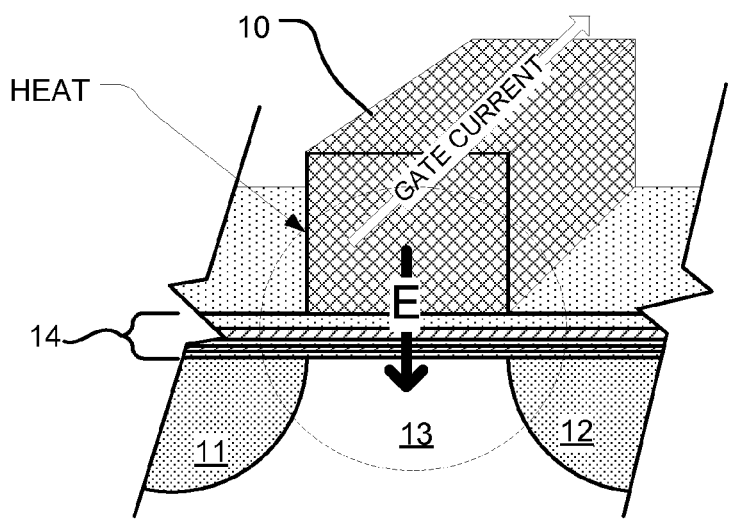
FIGS. 1A, 1B, 1C are simplified perspective views of dielectric charge trapping memory cells arranged for thermal anneal operations.
Figure 1B:
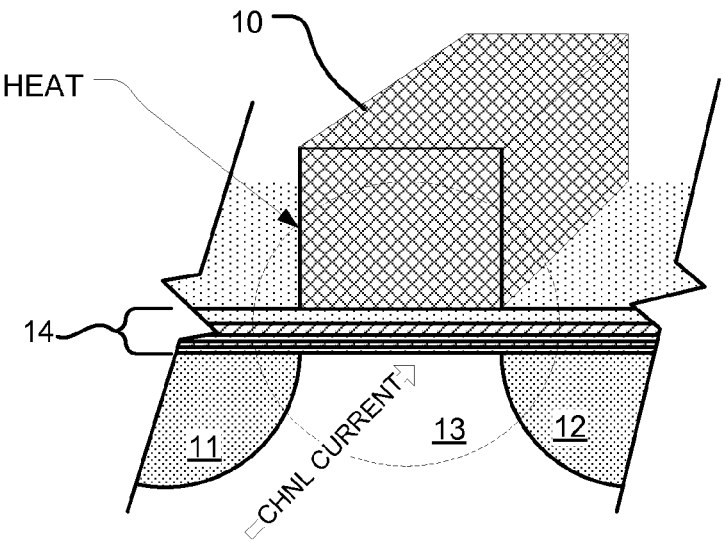
Figure 1C:
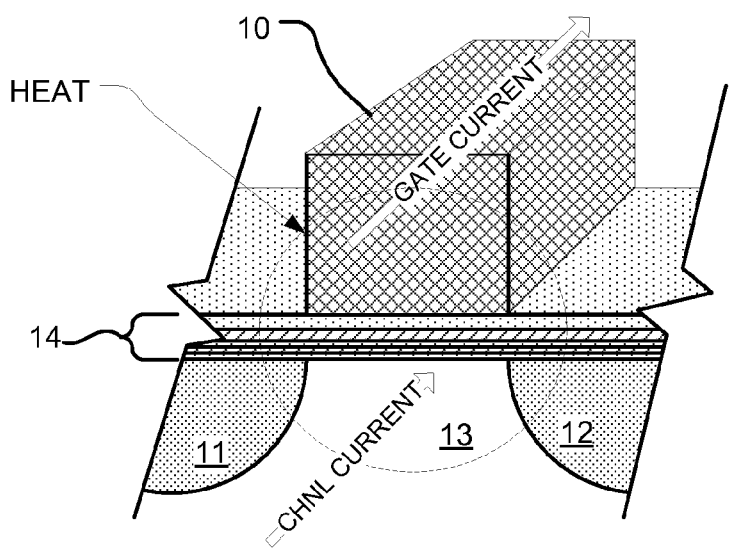

FIG. 1A is a simplified perspective view of a memory cell having a source 11 and a drain 12 in a semiconductor body 13 with a channel region between the source and drain. The word line 10 provides a gate over the channel region of the body 13. A multilayer dielectric stack 14 is interposed between the gate and the channel region of the body 13, and acts as a dielectric charge trapping structure. In the example illustrated in FIG. 1A, gate current (or word line current) is shown as the source of power for heating the charge trapping structure. FIG. 1B, having like reference numerals as the structure of FIG. 1A, illustrates an example in which channel current (or bit line current) is the source of power for heating the charge trapping structure. FIG. 1C, having like reference numerals as the structure of FIGS. 1A and 1B, illustrates an example in which a combination of gate current (or word line current) and channel current (or bit line current) is the source of power for heating the charge trapping structure.

One technology for implementation of multilayer dielectric stack 14 is known as bandgap engineered SONOS (BE-SONOS) charge trapping technology. See, for example U.S. Pat. No. 7,315,474 by Lue, which is incorporated by reference as if fully set forth herein.

An example of a BE-SONOS multilayer dielectric stack includes a multilayer tunneling layer on the channel. The multilayer tunneling layer is implemented using a layer of silicon oxide or silicon oxynitride that is less than 2 nm thick in the central region of the channel, a second layer of silicon nitride that is less than 3 nm thick in the central region, and a third layer comprising silicon oxide or silicon oxynitride that is less than 4 nm thick in the central region. The charge trapping layer is formed on the tunneling layer that comprises silicon nitride having a thickness of greater than 5 nm in the central region. The blocking layer is formed between the charge trapping layer and a gate which comprises an insulation material, which has an effective oxide thickness greater than 5 nm in the central region. In other implementations, the dielectric charge trapping structure can be arranged with the tunneling layer adjacent the gate, and the blocking layer adjacent the channel.

Alternative memory cells may use different charge trapping structures, including for example more traditional nitride structures; charge trapping structures as described in Shin et al., "A Highly Reliable SONOS-type NAND Flash Memory Cell with Al2O3 or Top Oxide," IEDM, 2003 (MANOS); Shin et al., "A Novel NAND-type MONOS Memory using 63 nm Process Technology for a Multi-Gigabit Flash EEPROMs", IEEE 2005; and commonly owned and co-pending U.S. patent application Ser. No. 11/845,276, filed 27 Aug. 2007, which is incorporated by reference as if fully set forth herein. Yet other flash memory technologies to which the technology described herein can be applied are described below, with reference to FIGS. 38-45.

BE-SONOS technology, and other dielectric charge trapping technologies and floating gate charge trapping technologies, can have significant temperature sensitivity. The temperature sensitivity can include the ability to recover from damage to the structure that occurs during program and erase cycling, by a thermal anneal. Therefore by applying a thermal anneal, the charge storage characteristics of the dielectric charge trapping structure can be restored or improved. Also the temperature sensitivity can include improved performance. For example, in the case of some dielectric charge trapping memory structures, if heat can be applied during Fowler Nordheim (FN) tunneling, under a negative gate bias, thermally assisted electron de-trapping can be enhanced, and become a significant factor in combination with hole tunneling to improve erase speed.

One technique of applying heat to a memory cell includes resistive heating generated using current in a word line, as illustrated in FIG. 1A. Word lines are typically unterminated lines, or terminated with very high impedance, so that a word line driver charges a word line to a target voltage without generating significant current. In order to induce current flow in a word line, the word line receiving the word line voltage needs to be terminated in a manner that allows current flow. Also, in a negative gate voltage FN tunneling operation, electric field is induced across the dielectric charge trapping layer. Thus, a combined erase/anneal operation can be executed by inducing current flow while also inducing electric field to support an erase operation. Current flow can also be induced during read and program operations if desired. Current flow can also be induced while the memory is idle, in operations interleaved with the mission functions of read, program and erase. Therefore, a circuit can be arranged to accomplish the anneal operation interleaved with, or during, read operations, program operations and erase operation.

By suitably inducing current through a word line, the local temperature of the gate for a particular cell can be raised greater than 400° C. Because the gate is in contact with the dielectric charge trapping structure, heat is transferred and accomplishes the anneal. A self-healing flash memory device can break through the bottleneck of flash memory endurance. The memory device can uses a word line (gate) as an internal Joule heater to generate locally high temperatures in a short period of time, thus providing very fast pulse annealing and repair of P/E (program/erase) cycling induced damage. The locally high temperatures are much higher than possible by external heating.

An electrical current can be conducted along the word line (gate) to generate Joule heating. The proximity of the gate can readily heat the tunnel oxide of the flash memory device, annealing out the damage caused by P/E cycling. Owing to the high activation energy (Ea>1.1 eV), and in turn the large temperature acceleration factor, the word line heater can effectively produce thermal annealing in a very short time.

A relatively high electrical current, such as greater than 2 milliAmperes (mA), through a word line can be necessary in some implementations to generate sufficient Joule heating. However, word lines in a flash memory device can have lengths greater than a millimeter. Because of the length, the corresponding word line resistance is very high. As an example, the sheet resistance of a polysilicon word line ($R_s$) can be 30 ohm/square, the channel width of the word line (W) can be 30 nm (nanometers), and the word line length (L) can be 1 mm (millimeter). In this example, a square is (30 nm×30 nm), and the resistance (R) of the word line is calculated to be 1M-ohm:

$$R = L \times W \times R_s = 1 \text{ mm} \times 30 \text{ nm} \times 30 \text{ ohm}/(30 \text{ nm} \times 30 \text{ nm}) = 1 \times 10^6 \text{ ohm}.$$

A word line with 1 M-ohm resistance would produce an electrical current about 2 mA within a word line voltage drop of 500 Volts. Such high voltages are not practical.

It is desirable to reduce the word line resistance as much as possible to reduce the required voltage. One way to reduce the word line resistance is to reduce the word line length. Another way is to reduce the sheet resistance of the word line. If the voltage drop (V) across a word line is reduced to 10V, and the current (I) generated across the word line needs to be 2 mA, then the resistance (R) of the word line is calculated to be 5K-Ohm:

$$R = V/I = 10 \text{V}/2 \text{ mA} = 5 \text{ K-ohm}.$$

If the sheet resistance of a word line ($R_s$) is reduced to 1 ohm/square by using a metal word line for example, and the channel width (W) is still 30 nm, then the word line length (L) is calculated as:

$$L=R/(W \times R_s)=\text{5 K-ohm}/(30 \text{ nm} \times 1 \text{ ohm}/(30 \text{ nm} \times 30 \text{ nm})) = 150 \times 10^{-6} \text{ meter}.$$

Consequently, metal word lines having lengths below 150 μm (micrometers) in this example can be configured provide a current greater than 2 mA for sufficient Joule heating at voltages on the order of 10 V. For a large array, the word lines can be segmented by physically cutting the word lines and using switches to apply voltages for anneal, or electrically without necessarily physically cutting the word lines, and using diode strapping or other circuits to apply the anneal bias, to bring the operating voltage and current ranges to within tolerances for integrated circuit environments. For a physically segmented implementation, local word lines are coupled to global word lines.

In one implementation of the present technology, the tunnel oxide ONO (oxide-nitride-oxide) in BE-SONOS (bandgap engineered silicon-oxide-nitride-oxide-silicon) charge-trapping NAND flash memory cells are quickly annealed with a temperature of greater than 400° C. generated within a few milliseconds by an internal Joule heater. The implementation demonstrates an endurance of greater than 10 million (10M) program/erase cycles and data retention for greater than 10M cycles.

Figure 2:
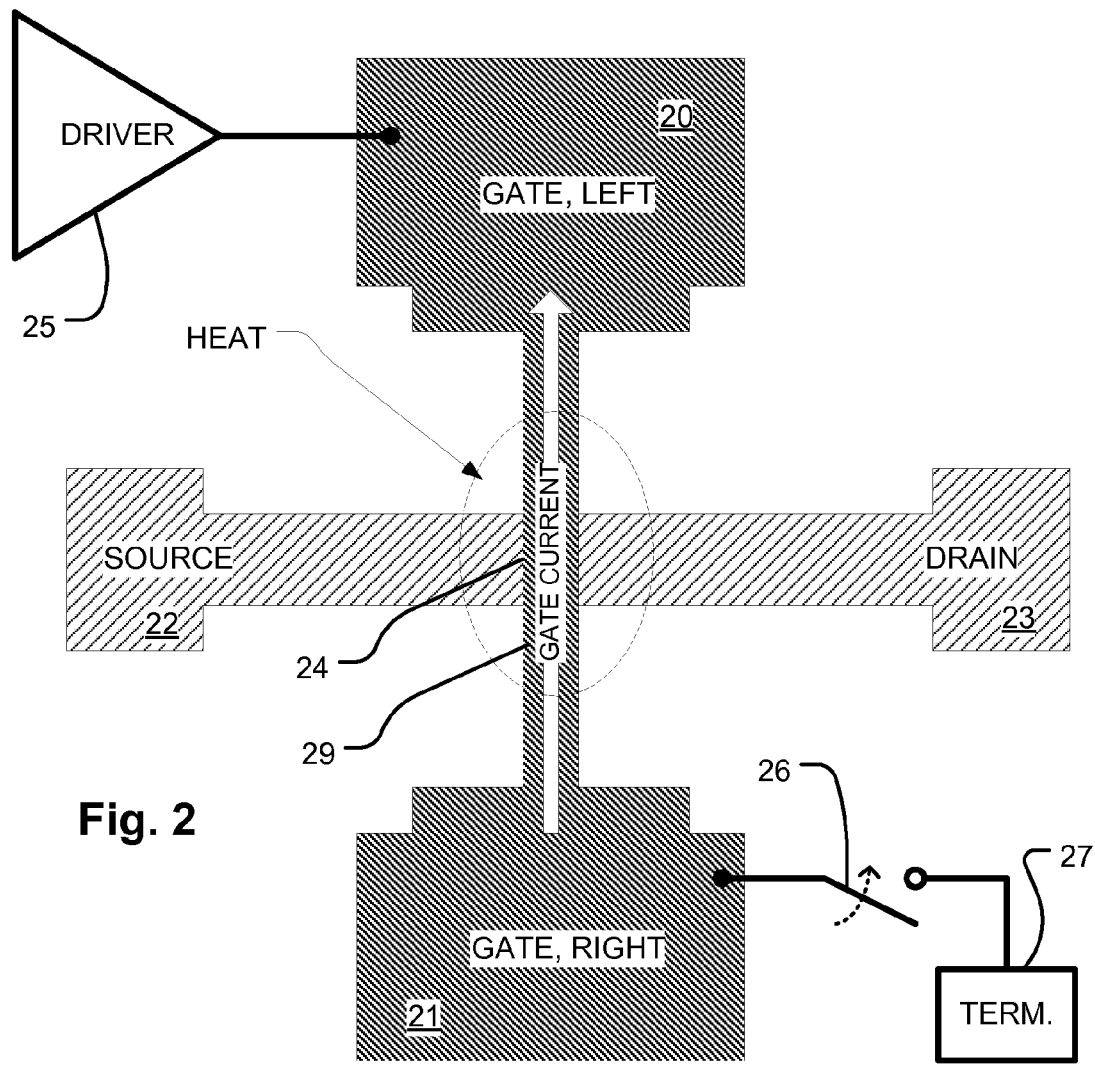
FIG. 2 is a simplified layout diagram of a dielectric charge trapping cell arranged for thermal anneal operations.

FIG. 2 is a simplified single device layout illustration. The device includes a source 22 and a drain 23 implemented by implants in a semiconductor body. The device includes a gate 29. The gate 29 can have locally narrow region in order to locally concentrate current, with wider regions at opposing ends 20 and 21 spaced away from the memory element of the cell. The memory cell is formed at the crosspoint 24 between the gate 29 and the source/drain implant.

As illustrated, annealing can be induced using a word line driver 25 coupled to one end 20 of the gate. A word line termination circuit (which may be similar to a word line driver) is coupled to the opposing end 21 of the gate. The word line termination circuit includes a switch 26 which can be responsive to address decoding or other control circuitry, to selectively couple the word line to a termination circuit 27, which can include bias circuits, to allow current flow or prevent current flow as appropriate. The termination circuits allow for current flow on the gate by applying a voltage difference relative to the voltage applied by the word line driver, across the word line. In one example, the word line drivers and termination circuits can be arranged to apply a voltage of about 1 volt on one side of the word line and a voltage of about 0 volts on the other. This causes a current flow, and induces heat at the memory cells, without establishing a significant electric field. In another example, the termination circuits can be arranged to apply about 20 volts on one side and about 19 volts on the other, causing a current flow to induce heat while also inducing electric fields at the memory cells to support programming, including Fowler Nordheim programming. In another example, the termination circuits can be arranged to apply negative voltages, such as about −16 volts on one side and about −15 volts on the other, causing a current flow to induce heat while also inducing electric fields at the memory cells to support erasing, including negative field Fowler Nordheim erasing.

The means for thermally annealing the memory cells described with reference to FIGS. 1 and 2, includes word lines or other gate structures having drivers and termination circuits selectively controlled to induce resistive heating near the dielectric charge trapping structures of the memory cells. In other implementations, the means for thermally annealing the memory cells can produce heat applied to the dielectric charge trapping structures of the memory cells using current flow in bit lines. Also, the memory cells may be implemented in an array with an additional set of resistive lines, either above the dielectric charge trapping layers, or below. For example, an additional set of thermal anneal lines may be implemented adjacent to or over the standard word lines in a metal layer, and used to heat the cells. Also, the memory cells may be implemented over a substrate that includes a set of thermal anneal lines below the dielectric charge trapping structures. For example, in the case of a silicon-on-insulator substrate a resistor can be buried below the memory cell, implemented using a doped polysilicon line for example below or embedded within the insulator. Word line heating may be most efficient because of the proximity of the word lines to the charge trapping structure. However, other structures can be used to provide the means for thermal annealing, as outlined above.

Flash memory devices generally are implemented using NAND or NOR architectures, although others are known, including for example virtual ground architectures, and AND architectures. The NAND architecture is popular for its high density and high speed when applied to data storage applications. The NOR architecture is better suited to other applications, such as code storage, where random byte access is important. The thermally assisted memory cells described herein can be deployed in NAND, NOR, virtual ground and AND architectures, and in other configurations.

Figure 3:
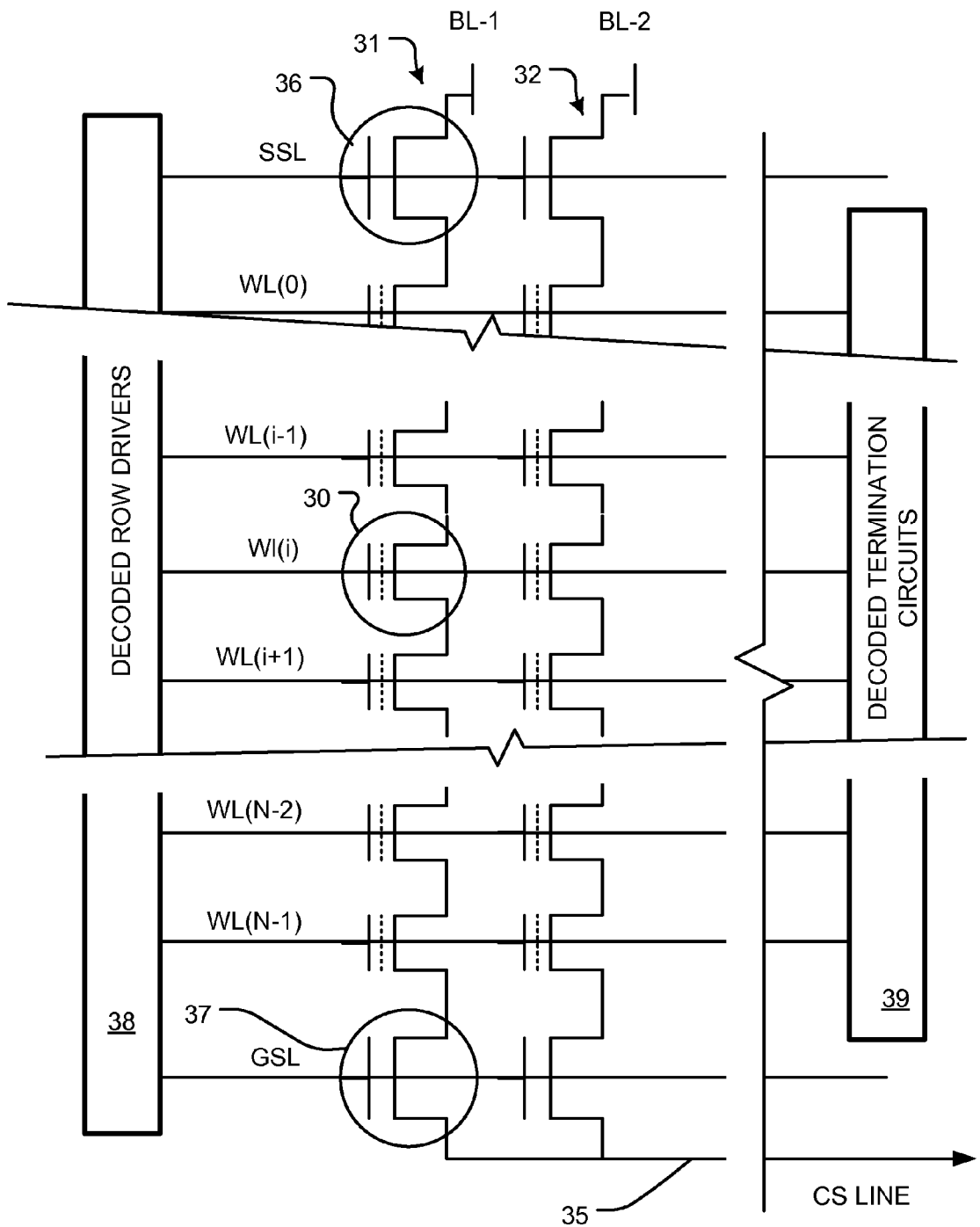
FIG. 3 is a schematic diagram of a common source type NAND-type memory array arranged for thermal anneal operations.

FIG. 3 is a circuit diagram showing layout of a NAND architecture including NAND strings 31, 32 coupled to respective bit lines BL-1 to BL-2 and to a common source CS line 35 by string select transistors (e.g. 36) and ground select transistors (e.g. 37), respectively. For the purpose of illustration, for read of a target memory cell 30 on a corresponding word line WL(i) in the NAND string 31, a read bias level is applied to the selected word line WL(i). The unselected word lines are driven with a pass voltage, sufficient to turn on memory cells in the highest threshold state. On the selected bit lines, a read bias is applied. On the unselected bit lines, the bit line voltage is set to ground, or a level close to that of the CS line.

In order to use the word lines to apply heat for a thermal anneal, the array is configured with decoded word line drivers 38 along with decoded termination switches 39 on opposite ends of the word lines. The length of the word lines between the drivers and decoded termination switches 39 can be configured as desired by segmenting the array appropriately. For example, word line driver/termination switch pairs can be implemented for segments of 100 bit lines, segments of 1000 bit lines, or segments of other lengths, as suits a particular implementation. Using decoded termination circuits 39, which selectively couple the word lines to a bias circuit or decouple the word lines from a bias circuit, allows use of the word lines in low current modes during operation of the device, and in higher current modes for thermal anneal. Also, in some operating modes of the device, such as read operations, program operations, and erase operations, the word lines may be operated in a high current mode, with the word lines selectively coupled to termination circuits, to perform thermal anneal during the operation.

Figure 4:
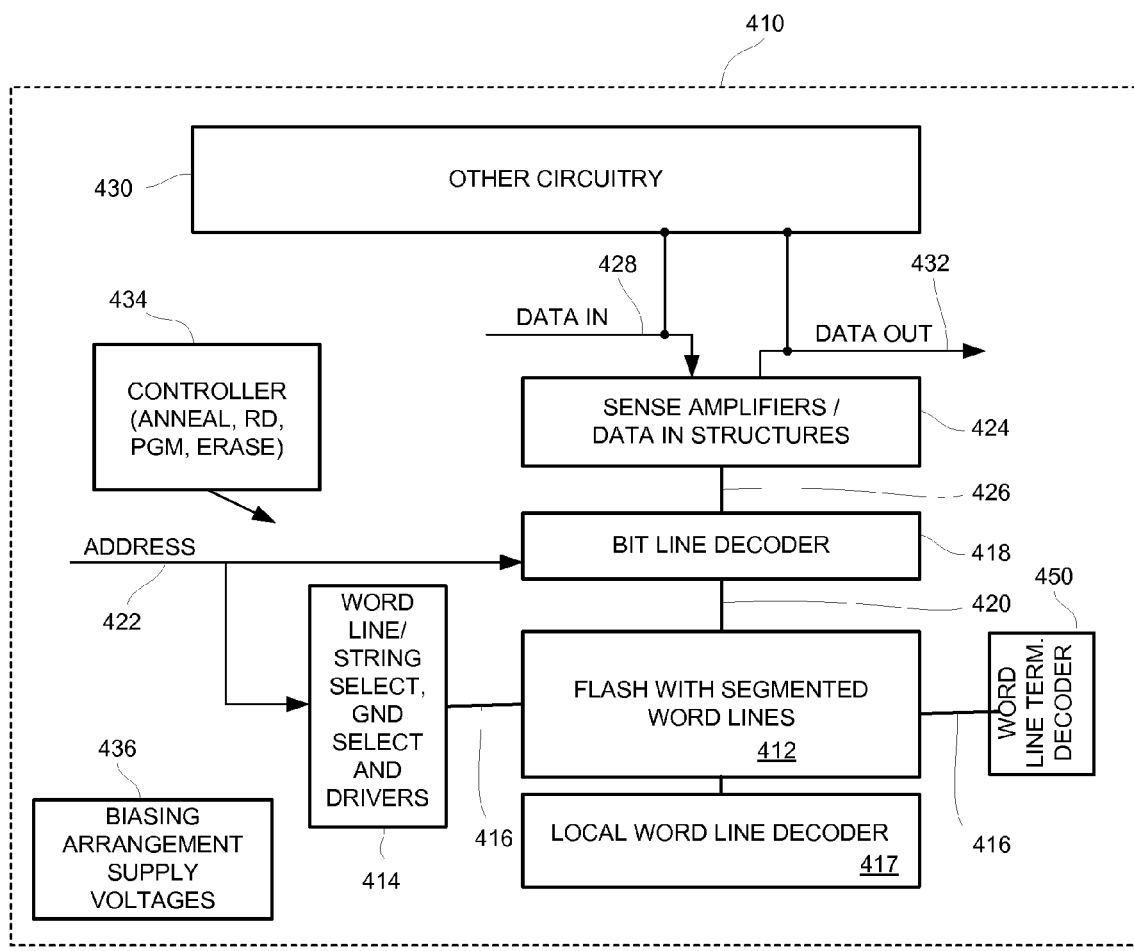
FIG. 4 is a block diagram of an integrated circuit memory including a segmented word line, flash memory array arranged for thermal anneal operations.

FIG. 4 is a simplified block diagram of an integrated circuit employing thermal anneal for flash memory as described herein. The integrated circuit 410 includes a memory array 412 implemented using flash memory cells on an integrated circuit substrate. A ground select and string select decoder 414 (including appropriate drivers) are coupled to, and in electrical communication with, string select lines and ground select lines, arranged along rows in the memory array 412. Also, the decoder 414 includes global word line drivers, which are operated in coordination with global word line termination circuits and decoder 450. A bit line (column) decoder and drivers 418 are coupled to and in electrical communication with a plurality of bit lines 420 arranged along columns in the memory array 412 for reading data from, and writing data to, the memory cells in the memory array 412. Addresses are supplied on bus 422 to the word line decoder and string select decoder 414 and to the bit line decoder 418. Optionally, a local word line decoder 417 can be included, and used for connecting local word lines to global word line pairs, which are coupled to the global word line drivers and global word line termination circuits.

In implementations using current flow on the word lines to induce heat for thermal annealing of the dielectric charge trapping structures, a word line termination decoder 450 is coupled to the word lines 416 of the array. The word line termination decoder 450 can be responsive to addresses and control signals that indicate or are produced during an operating mode for the device to selectively connect word lines to termination circuits, or to enable termination circuits to be coupled to selected word lines, as discussed above.

Sense amplifiers and data-in structures in block 424, including current sources for the read, program and erase modes, are coupled to the bit line decoder 418 via data bus 426. Data is supplied via the data-in line 428 from input/output ports on the integrated circuit 410 or from other data sources internal or external to the integrated circuit 410, to the data-in structures in block 424. Data is supplied via the data-out line 432 from the sense amplifiers in block 424 to input/output ports on the integrated circuit 410, or to other data destinations internal or external to the integrated circuit 410.

A controller 434, implemented in this example using a bias arrangement state machine, controls the application of bias arrangement supply voltages and current sources 436, such as read, program, erase, erase verify, program verify voltages or currents for the word lines and bit lines, and controls the word line/source line operation using an access control process. The controller 434 includes logic used to enable thermal annealing, including to control the use of global word line pairs for applying the bias conditions to the local word lines for performing thermal anneal operations.

The controller 434 can be implemented using special purpose logic circuitry as known in the art. In alternative implementations, the controller 434 comprises a general purpose processor, which may be implemented on the same integrated circuit, which executes a computer program to control the operations of the device. In yet other implementations, a combination of special-purpose logic circuitry and a general-purpose processor may be utilized for implementation of the controller 434.

In the illustrated implementation, other circuitry 430 is included on the integrated circuit 410, such as a general purpose processor or special purpose application circuitry, or a combination of modules providing system-on-a-chip functionality supported by the memory cell array.

Also, in some implementations, the controller includes program/erase cycle counters, and registers for setting up parameters to be applied in the configuration of thermal anneal processes. The controller can execute the procedures described herein, with reference to FIGS. 9-11 and 28-30, along with other processes and mission function operations of read and write.

A common technology for implementation of a NAND array includes the use of shallow trench isolation STI structures between strips of the semiconductor substrate. A series of memory cells is implemented in each strip. The memory cells include channel regions having one of n-type doping (for p-channel devices) or p-type doping (for n-channel devices), and source/drain regions between the channel regions along the strip having the opposite conductivity type. Charge trapping structures are formed over the channel regions, and word lines and bit lines are patterned to establish access to the NAND cells.

Figure 5:
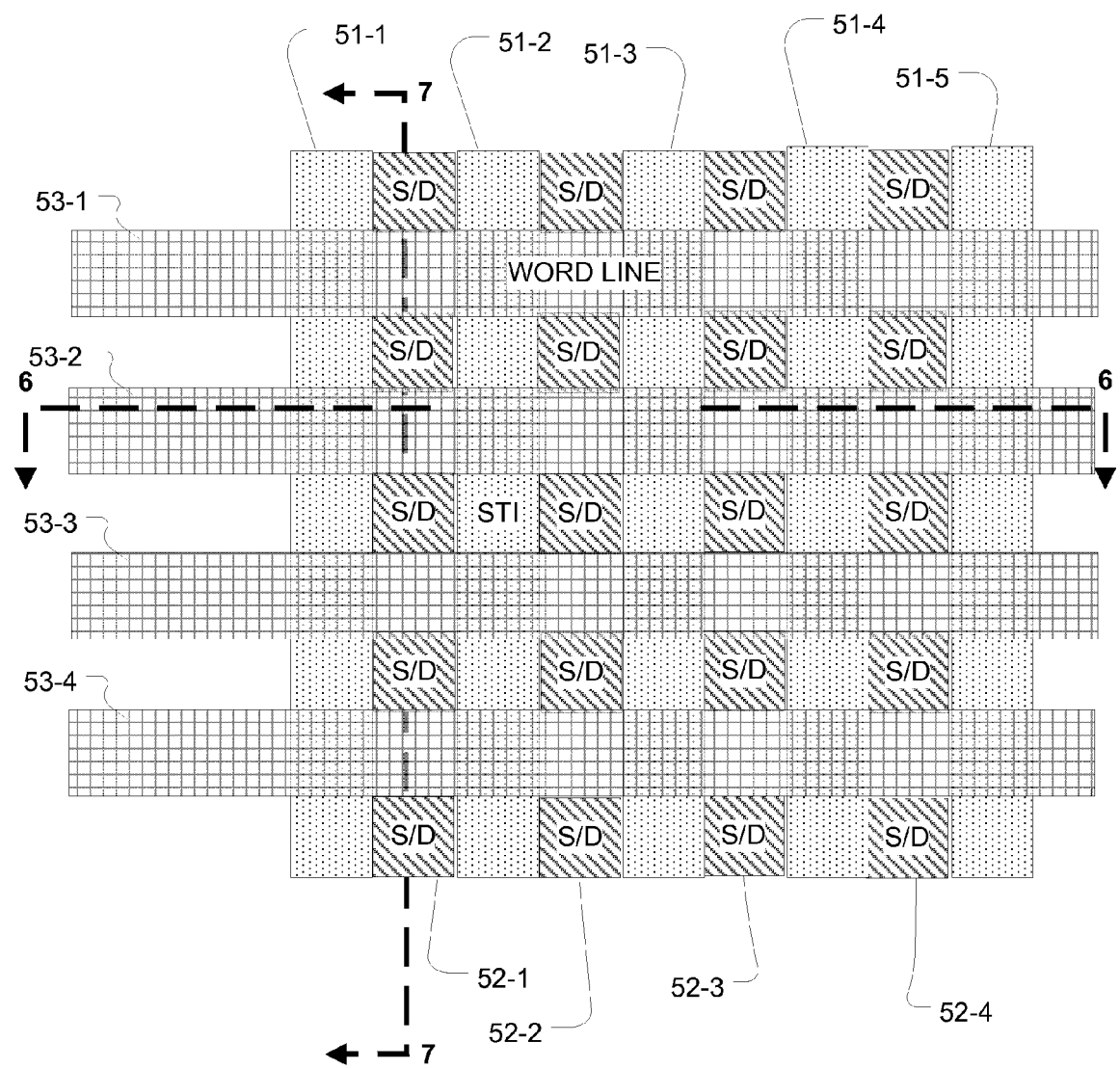
FIG. 5 is a layout view of a NAND array of memory cells, including insulation filled trenches between the columns.

FIG. 5 shows a NAND array layout including shallow trench isolation between columns, suitable for use with the means for thermally annealing described herein. In the layout, a plurality of insulator filled trenches 51-1 through 51-5 is formed in the semiconductor substrate. Semiconductor strips 52-1 through 52-4 lie between pairs of the insulator filled trenches 51-1 through 51-5, such as shallow trench isolation STI structures. Charge trapping structures, not shown, overlie the semiconductor strips. A plurality of word lines 53-1 through 53-4 are formed over the charge trapping structures, and extend orthogonally relative to the semiconductor strips 52-1 through 52-4. The semiconductor strips include a plurality of source/drain regions (labeled S/D) having a first conductivity type and a plurality of channel regions (below the word lines) having a second conductivity type.

Figure 6:
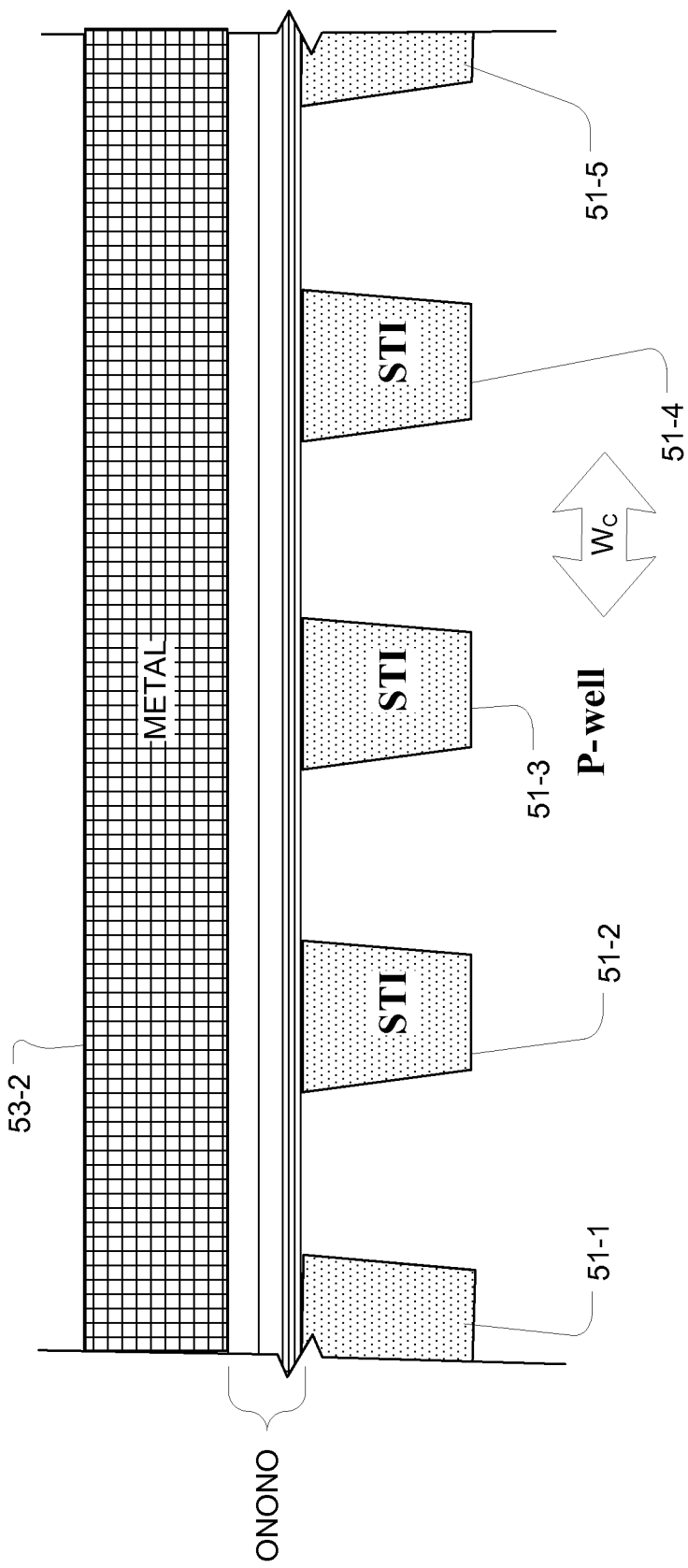
FIG. 6 is cross-section of a NAND array, like that of FIG. 5, using re-channel devices, taken along a word line.

FIG. 6 shows a cross-section of the array of FIG. 5, taken along word line 53-2. The ONONO dielectric charge trapping structure, characteristic of BE-SONOS devices, lies between the word line 53-2 and the P-well in the semiconductor body. Insulator filled trenches 51-1 to 51-5 separate the NAND strings, which run perpendicular to the paper. The word lines may include multilayer structures of polysilicon and silicide, as shown, or other combinations of materials. The materials can be arranged to provide resistive heating during current flow, and for transfer of the resistive heating to the dielectric charge trapping structures for thermal anneal.

Figure 7:
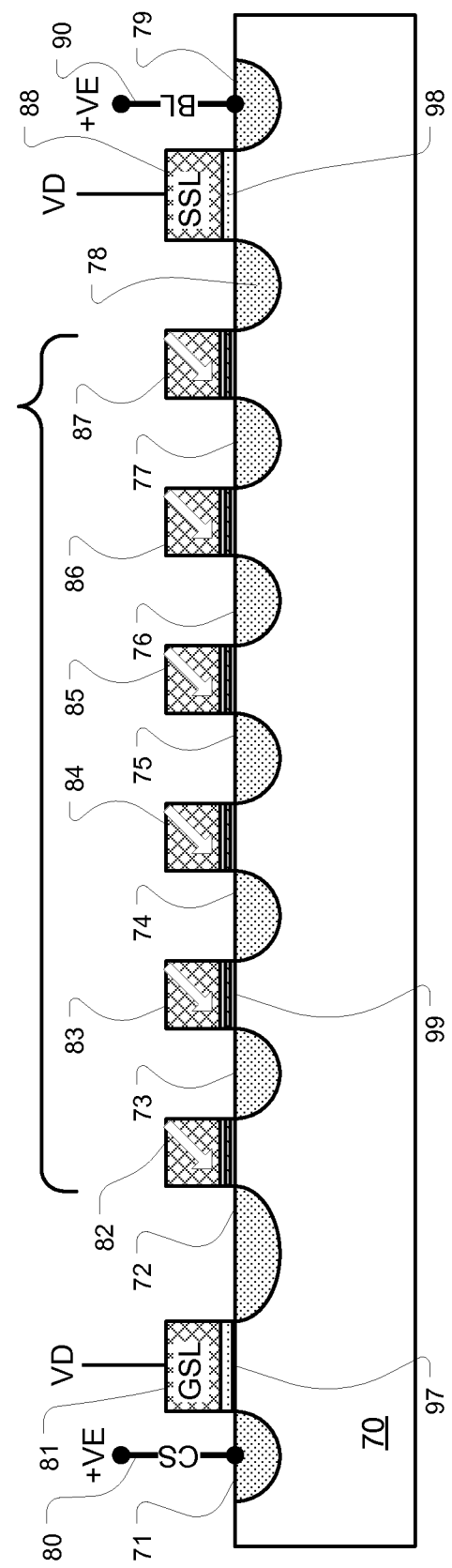
FIG. 7 is a simplified cross-sectional view of a NAND string, taken orthogonal to a word line through cell channels including top and bottom select transistors.

FIG. 7 shows in cross-section a plurality of dielectric charge trapping flash memory cells arranged in series to form a NAND string. The cross-section of FIG. 7 corresponds to a section taken along line 7-7 of FIG. 5, along a NAND string in strip 52-1. However, FIG. 7 shows a string of six memory cells with ground select switches and string select switches, and thus more structure than appears in the layout of FIG. 5.

Referring to FIG. 7, the memory cells are formed in a semiconductor body 70. For n-channel memory cells, the semiconductor body 70 can be an isolated p-well, within a deeper n-well in a semiconductor chip. Alternatively, the semiconductor body 70 can be isolated by an insulating layer or otherwise. Some implementations may employ p-channel memory cells in which the doping for the semiconductor body would be n-type.

The plurality of memory cells is arranged in a string extending in a bit line direction, orthogonal to word lines. Word lines 82-87 extend across a number of parallel NAND strings. Terminals 72-78 are formed by n-type regions (for n-channel devices) in the semiconductor body 70, and act as the source/drain regions for the memory cells. A first switch formed by a MOS transistor having a gate in a ground select line GSL 81 is connected between the memory cell corresponding with first word line 82 and a contact 71 formed by an n-type region in the semiconductor body 70. The contact 71 is connected to common source CS line 80. A second switch formed by a MOS transistor having a gate in a string select line SSL 88 is connected between the memory cell corresponding to the last word line 87 and a contact 79 formed by an n-type region in the semiconductor body 70. The contact 79 is connected to a bit line BL 90. The first and second switches in the illustrated implementation are MOS transistors, having gate dielectrics 97 and 98 formed by, for example, silicon dioxide.

In this illustration, there are six memory cells in the string for simplicity. In typical implementations, a NAND string may comprise 16, 32 or more memory cells arranged in series. The memory cells corresponding to the word lines 82-87 have dielectric charge trapping structures 99 between the word lines and channel regions in the semiconductor body 70. Also, implementations of NAND flash structures have been developed which are junction-free, where the source/drain terminals 73-77, and optionally terminals 72 and 78, may be omitted from the structure.

The charge trapping structure in the illustrated implementation comprises an ONONO multilayer stack as described above. As mentioned above, the word lines are used to induce heat in the charge trapping structures (e.g. 99), and cause thermal anneal to recover from cycling damage. The annealing can also be applied during –FN erase, to improve erase speed.

Bias conditions are illustrated on the NAND string in FIG. 7 for a negative gate voltage FN (–FN) operation. To induce a block erase for example using –FN tunneling, the word lines are biased with a negative erase voltage –VE, and the bit line and common source line are biased with a positive erase voltage +VE or ground, while the string select switches are biased with a voltage to couple the +VE voltage to the semiconductor body 70. This sets up an electric field that induces hole tunneling from the channel to the charge trapping layer in the dielectric charge trapping structure, to erase the memory cells in the block. To improve erase performance, the word lines can be terminated, so that current flows during the block erase, as indicated by the arrows on the gate structures. The current flow induces heat that is transferred to the dielectric charge trapping structures, during the erase operation.

Alternative implementations, including "junction-free" structures as mentioned above, include a plurality of word lines, such as eight or sixteen, between a first n-type source/drain terminal, and a second n-type source/drain terminal, with a continuous p-type channel structure for n-channel devices, and vice versa for p-channel devices. Thus, implementations of the NAND array as described herein may include more than one gate between the source/drain terminals doped with a conductivity type opposite that of the channel. Individual cells are accessed in this alternative by biasing the adjacent word lines in a manner that inverts the channel structure, creating inversion source/drain regions for individual gates. See, commonly owned, U.S. Pat. No. 7,382,654 by Hsu et al., which is incorporated by reference as if fully set forth herein.

NAND strings can be implemented in a variety of configurations, including finFET technology, shallow trench isolation technology, vertical NAND technology and others. See, for an example vertical NAND structures, European Patent Application No. EP 2 048 709 by Kim et al. entitled "Nonvolatile memory device, method of operating same and method of fabricating the same."

Figure 8:
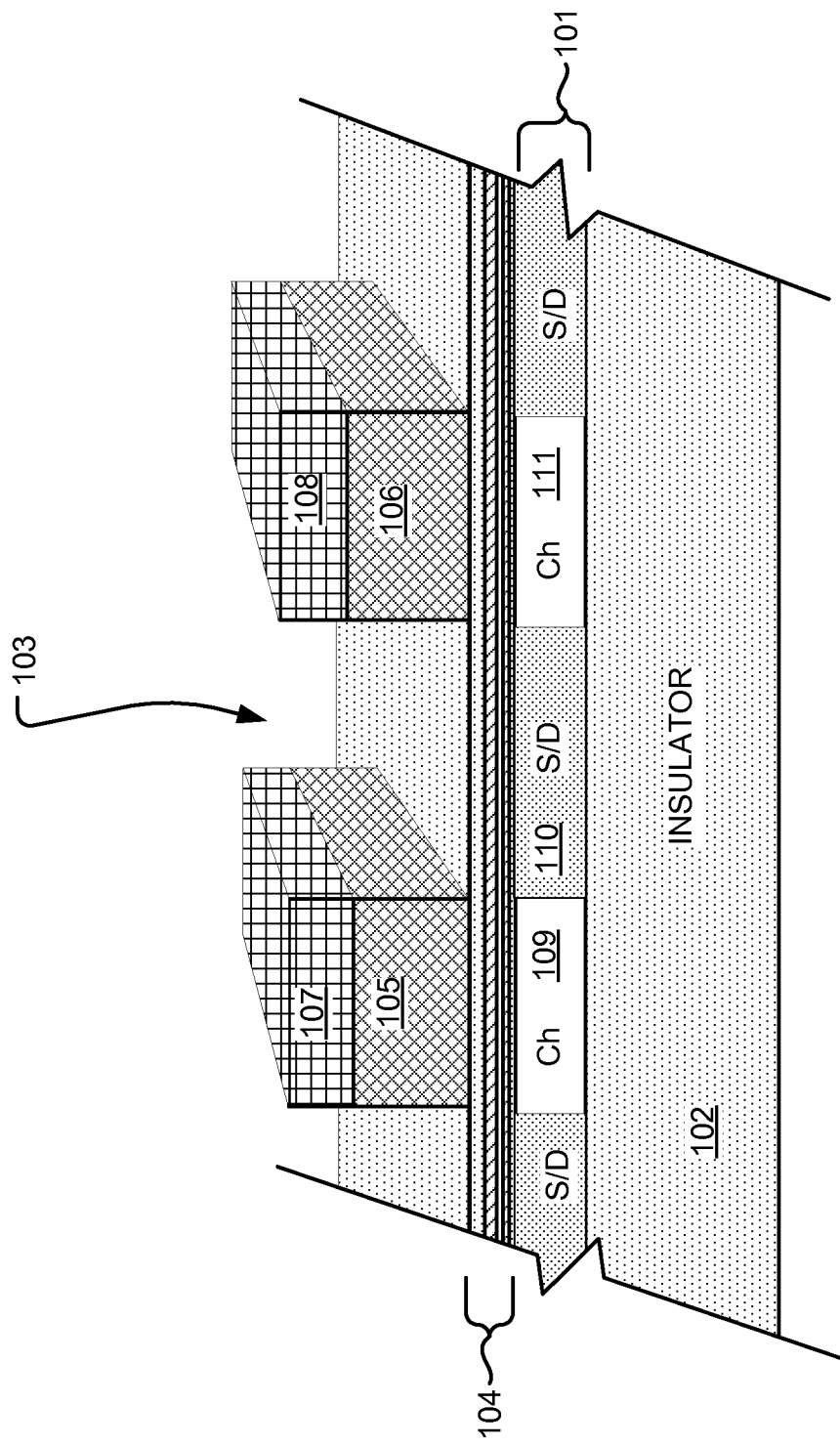
FIG. 8 illustrates an alternative structure of memory cells arranged for thermal anneal, including dielectric charge trapping memory cells arranged on thin film semiconductor bodies for thermal isolation.

FIG. 8 is a simplified perspective drawing of a memory structure including thin film transistor memory cells implemented on insulating substrate. This is a representative structure in which thermal isolation is taken into account in device design to provide for more efficient heat generation and lower power. In the structure, a "silicon on insulator SOI" design approach is implemented. An insulator 102 is formed on a substrate for the integrated circuit, providing both thermal and electrical insulation. A thin film semiconductor body 101 is formed over the insulator 102. Source/drain regions 110 and channel regions 109, 111 are implemented in the semiconductor body 101. A dielectric charge trapping structure 104 is formed over the thin film semiconductor body 101. Word lines are implemented using a multilayer structure, including respective layers of polysilicon 105, 106 and layers of silicide 107, 108. The thickness of the polysilicon/silicide layers can be reduced to increase resistance of the word lines, and thereby increase heat generation. Also, the thin film semiconductor body 101 implemented in an SOI-type structure can reduce the heat absorption by the memory cells, allowing generation of higher temperatures at lower powers. Also, additional thermal insulating techniques can be used. For example, air spacers, and other thermally insulating structures, can be implemented between the word lines in the region 103.

Figure 9:
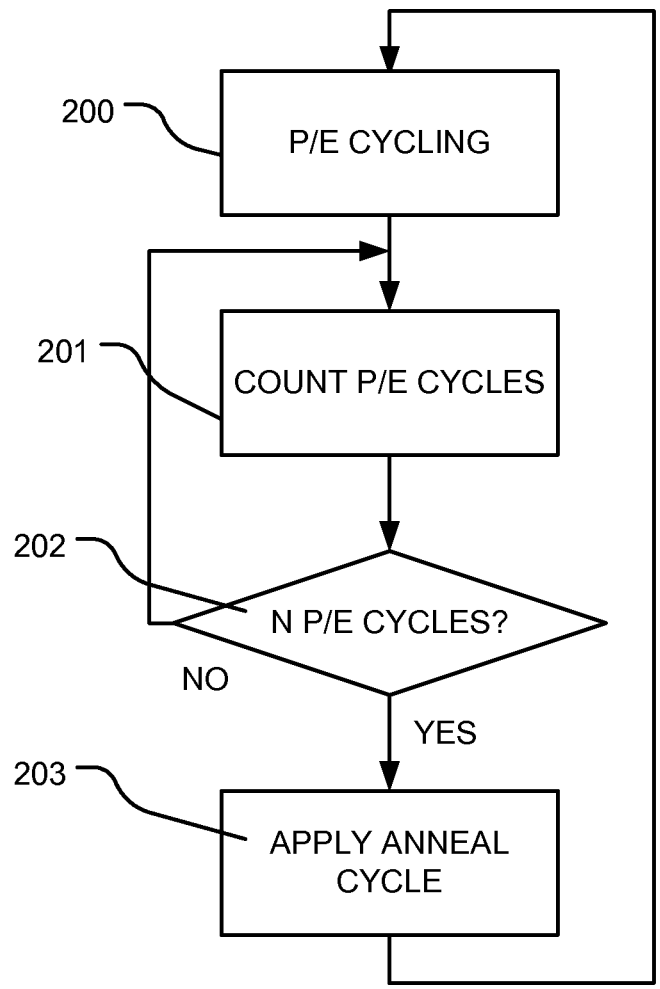
FIG. 9 is a simplified flow diagram of one control sequence for applying thermal anneal cycles.
Figure 10:
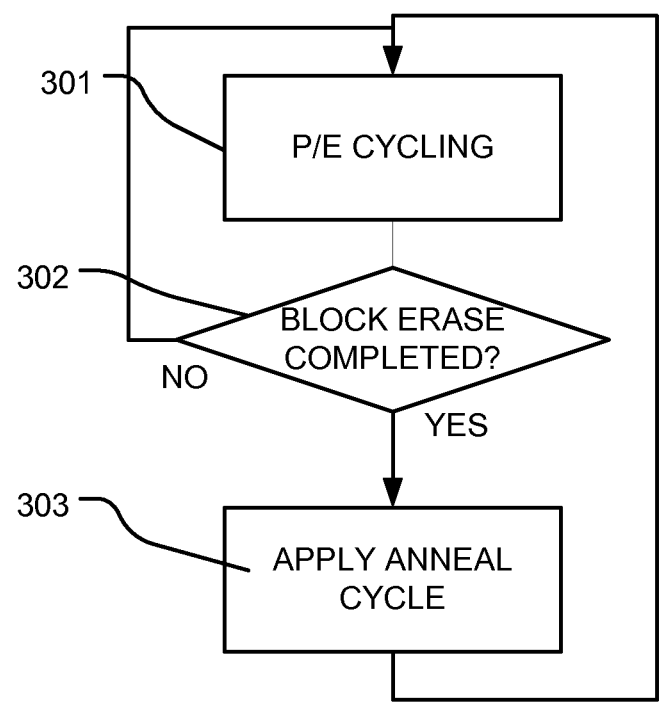
FIG. 10 is a simplified flow diagram of another control sequence for applying thermal anneal cycles.
Figure 11:
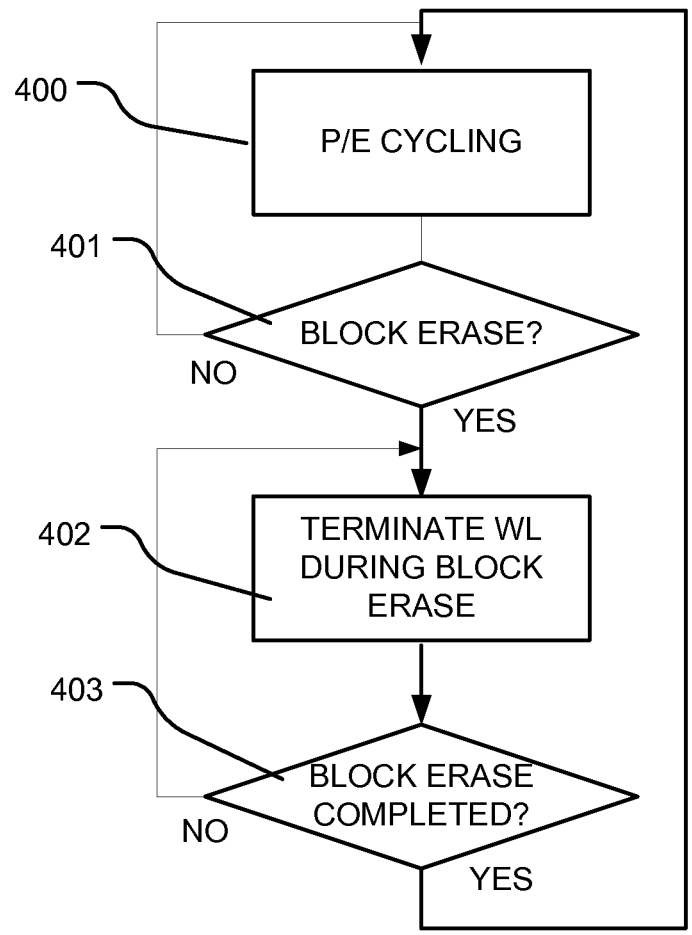
FIG. 11 is a simplified flow diagram of yet another control sequence for applying thermal anneal cycles.

FIGS. 9-11 illustrate alternative operating methods in which thermal anneal cycles are deployed in a flash memory device. These methods can be executed using for example the controller 434 described with reference to FIG. 4.

FIG. 9 illustrates a representative process in which the thermal anneal cycles are interleaved among mission function operations (read, program, erase) for the memory device. During operation of the device, program/erase cycling operations are executed as represented by block 200. A controller for the method of FIG. 9 counts the program/erase cycles (e.g. by counting program operations, by counting erase operations, or by counting pairs of program and erase operations) (block 201), and monitors the count (block 202). If the count has not reached a threshold, then the algorithm loops to continue counting cycles. If the count reaches a threshold, then the controller applies a thermal anneal cycle (block 203). The program/erase cycle counting and thermal anneal cycles can be applied on sets of cells, such as on a row-by-row basis, on a column-by-column basis, on a block-by-block basis, or over an entire array as suits a particular implementation. The annealing can be applied to one row or column of cells at a time, or to larger sets of cells, as suits the power consumption requirements and other requirements of a given implementation. A program-erase cycle can be defined as the combination of the events of writing a memory cell from the programmed state to the erased state and back to the programmed state, and is commonly used as a unit for measuring endurance of flash memory. As mentioned above, to count program-erase cycles during use of an integrated circuit memory, an on-chip counter can be used to count program cycles applied to individual memory cells, program cycles to memory cells within blocks of memory cells, erase cycles applied to individual memory cells, erase cycles to memory cells within blocks of memory cells, or to count the combination of the events of writing a memory cell from the programmed state to the erased state and back to the programmed state. All of these approaches can give an indication of the number of actual program-erase cycles endured, with an accuracy sufficient for deciding when to apply a thermal anneal cycle.

FIG. 10 illustrates another process in which thermal anneal cycles are interleaved among mission function operations. In the process of FIG. 10, program/erase cycling operations are executed during normal operation as represented by block 301. The controller monitors for execution of a block erase function, and determines when a block erase operation has been completed (block 302). If no block erase operation is completed, then the process continues monitoring and normal operation. If a block erase operation successfully completes, then the controller applies a thermal anneal cycle (block 303). This thermal anneal cycle is performed in coordination with the block erase, because it is initiated in response to the detection and completion of the block erase operation. Other logical links between the block erase and thermal anneal cycle can also result in coordinated performance of the block erase and thermal anneal cycling.

FIG. 11 illustrates a representative process which the thermal anneal is applied during a mission function, a block erase in this example, for the memory device. In the process of FIG. 11, normal program/erase cycling for the memory device is taking place as represented by block 400. The process determines whether a block erase has been requested (block 401). If not, the process continues normal operations and monitoring. If a block erase operation is requested, then the controller terminates the word lines during the block erase operation, so that heat generating current is applied to the memory cells being erased, or otherwise applied to the thermal anneal (block 402). As mentioned above, this can improve erase performance, as well as allow the dielectric charge trapping structures to recover from program/erase cycling damage. When the block erase function is completed (block 403), the process returns to normal operations.

Figure 12:
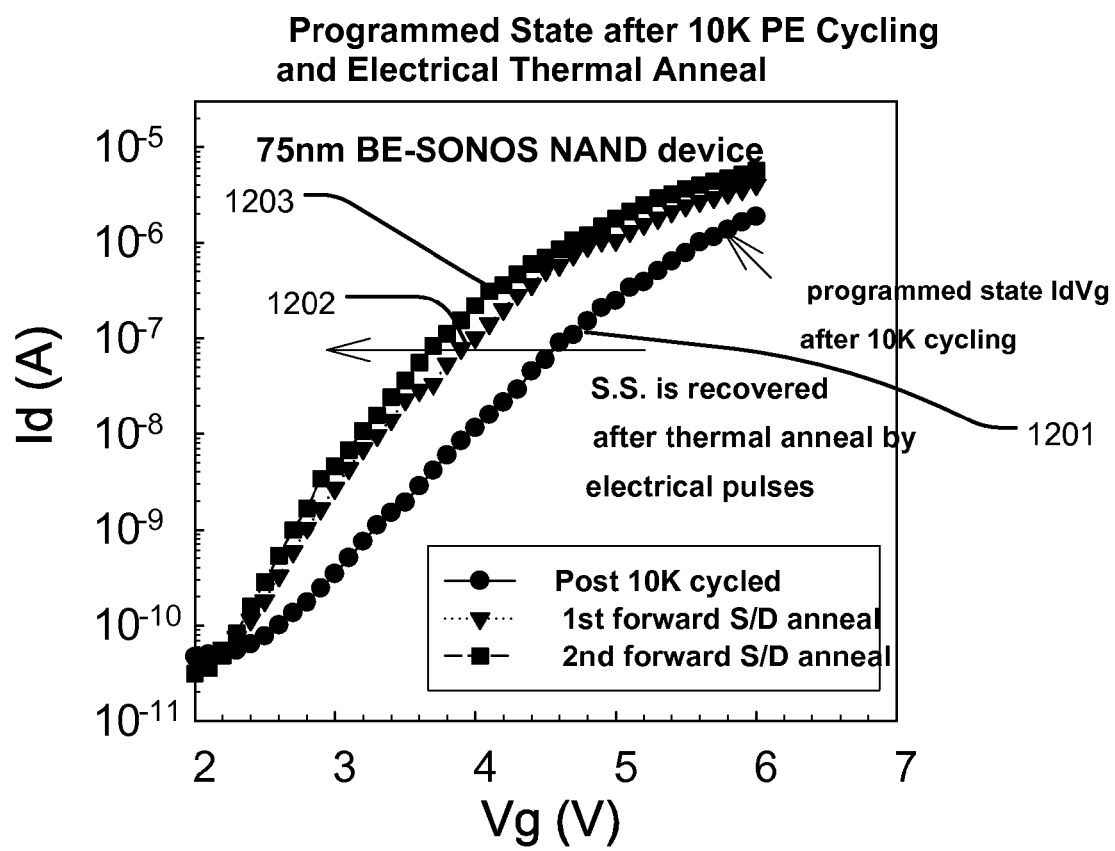
FIG. 12 is a plot of drain current versus control gate voltage showing experimental results of applying thermal anneal.
Figure 13:
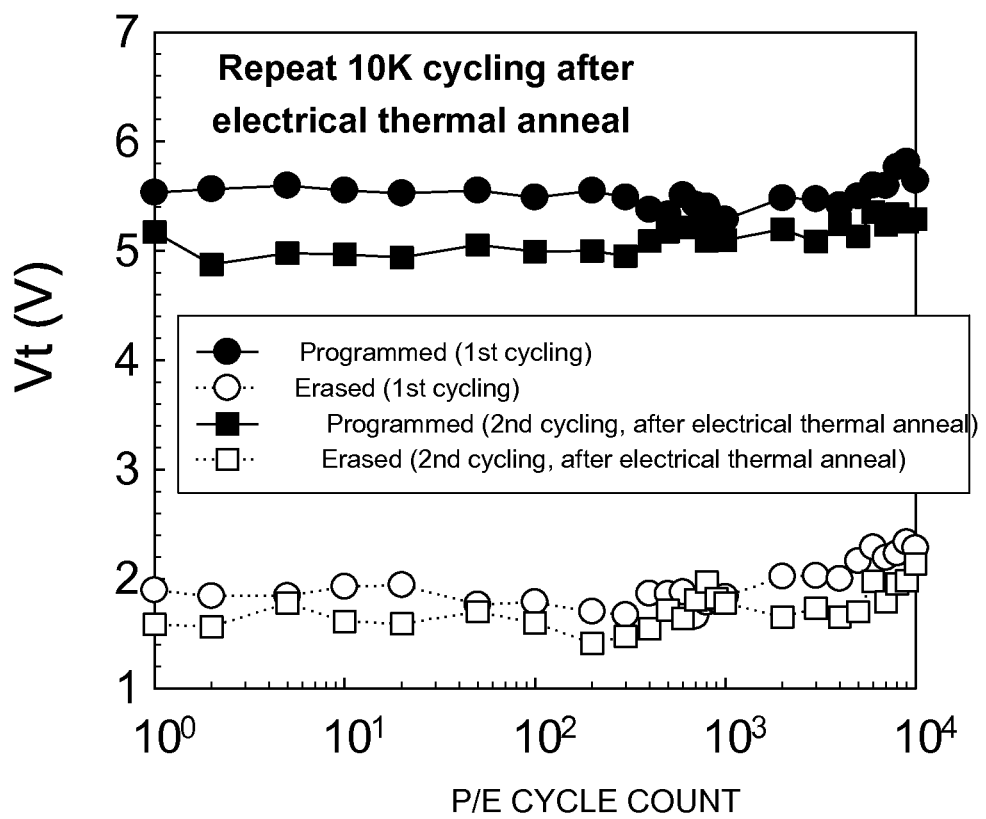
FIG. 13 is a plot of threshold voltage versus program/erase cycle count showing experimental results of applying thermal anneal.

FIGS. 12 and 13 illustrate measurements taken on an experimental device that comprises NAND architecture BE-SONOS memory cells made with a 75 nm manufacturing node, in which current to induce thermal anneal is generated by forward source/drain anneal, by which the junction between the source/drain terminal and the semiconductor body of the cell was forward biased to induce current flow. This emulates the behavior of other heating structures as discussed above. In FIG. 12, the drain current versus gate voltage plot is shown. Trace 1201 shows the performance of a memory cell after 10,000 program/erase cycles, illustrating a slight degradation in performance, presumably arising as result of the cycling damages. Trace 1202 and trace 1203 show the performance after a first anneal and a second anneal, respectively. After the anneal steps, the sub-threshold slope for the device is significantly improved, indicating that interface state damage (Dit) is suppressed using thermal anneal.

FIG. 13 shows threshold voltage versus cycle count for program/erase cycling of the tested memory cell, for 10,000 cycles before anneal, and 10,000 cycles after anneal. The figure illustrates that the device performs equally well both for the 10,000 cycles before anneal and the next 10,000 cycles after anneal.

Figure 14:
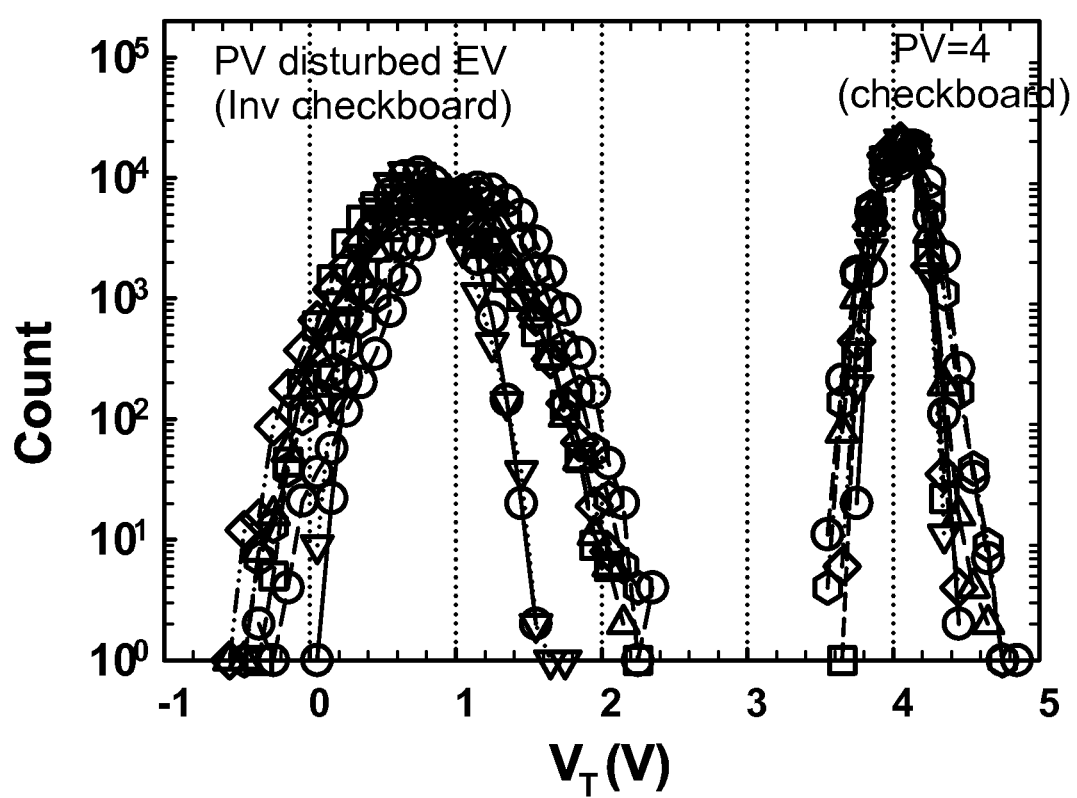
FIG. 14 is a plot of threshold voltage distribution for programmed and erased cells after a first cycling sequence.
Figure 15:
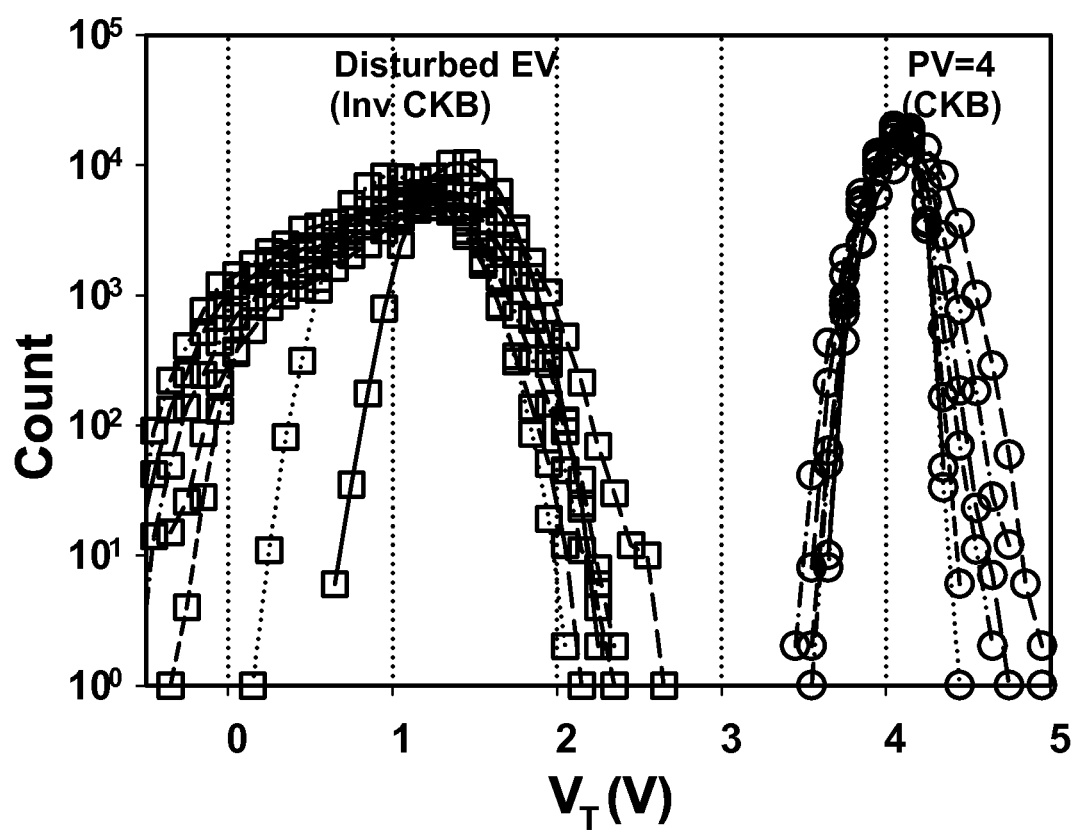
FIG. 15 is a plot of threshold voltage distribution for programmed and erased cells after a second cycling sequence following a thermal anneal.
Figure 16:
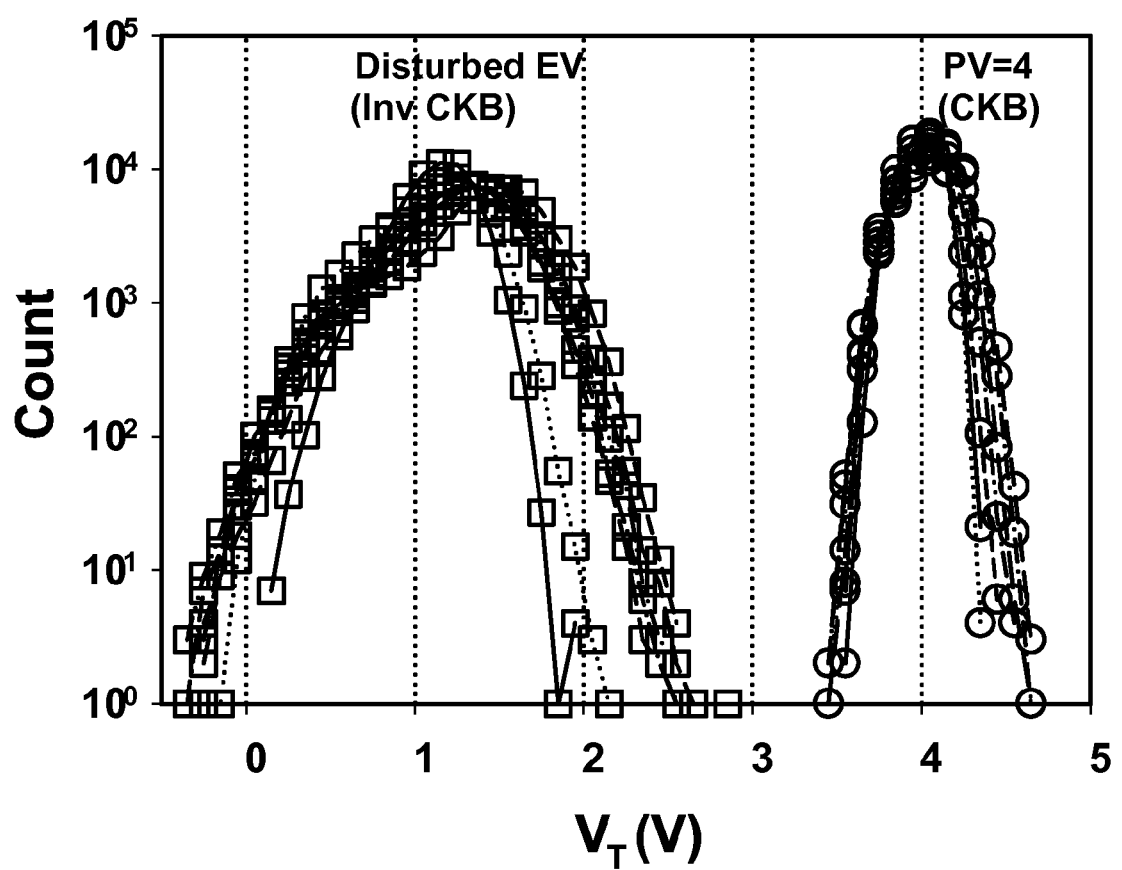
FIG. 16 is a plot of threshold voltage distribution for programmed and erased cells after ten cycling and annealing sequences.

FIGS. 14-16 shows threshold distribution for a first set of 100,000 program/erase cycles on the tested NAND architecture BE-SONOS memory cells, for a second set of 100,000 program/erase cycles after a thermal anneal, and for a tenth set of 100,000 program/erase cycles after thermal anneal, respectively. In FIG. 14, seven plots are shown that are not readily distinguished. The plots correspond to performance at 10 cycles, performance at 100 cycles, performance at 1000 cycles, performance at 10,000 cycles, performance at 50,000 cycles, and performance at 100,000 cycles. FIG. 14 shows that as the cycling count increases, to about 100, the upper edge of the erase state window reaches about 2.3 V. The program state window remains relatively constant, having a lower edge at about 3.5 V.

FIG. 15 shows that for a second set of 100,000 cycles after a thermal anneal, the upper edge of the erase state window stays below about 2.6 V while the program state window stays above about 3.5 V. FIG. 16 shows that for the tenth set of 100,000 cycles after thermal anneal, the erase state window remains below about 2.9 V, while the program state window remains above about 3.4 V.

The results illustrated in FIGS. 14-16 illustrate that device performance can be maintained over 1 million cycles using the thermal annealing process every 100,000 cycles.

Figure 17:
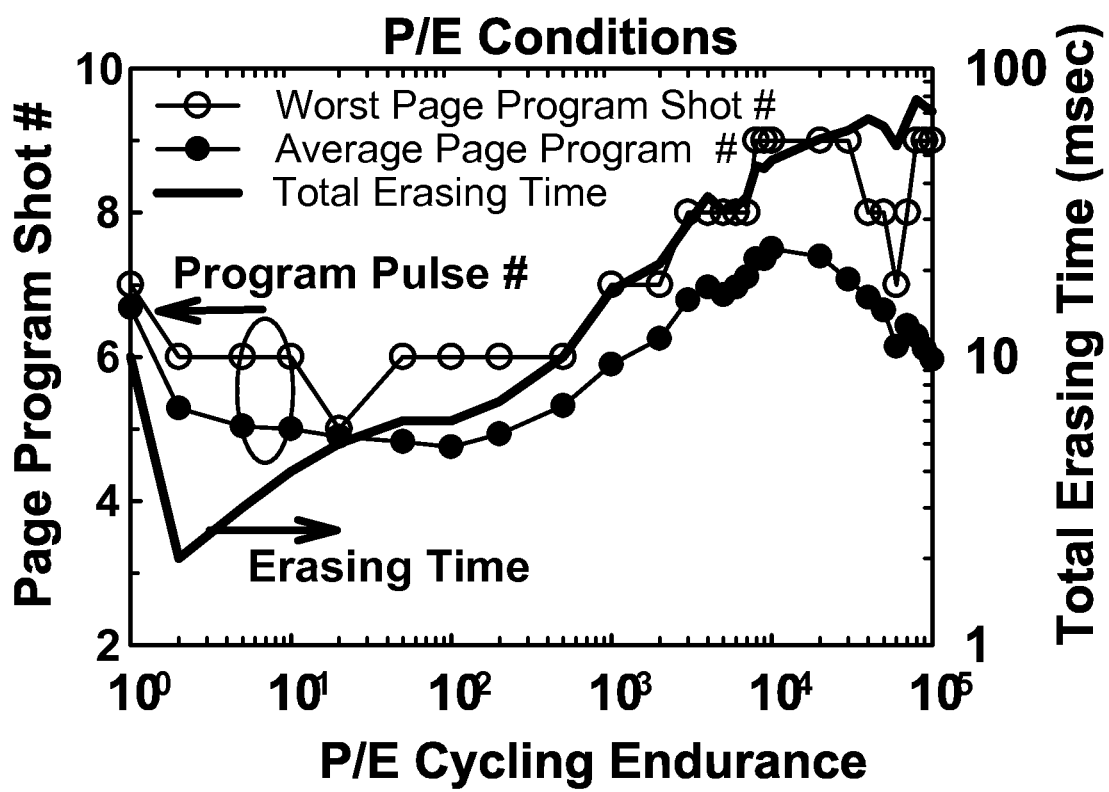
FIG. 17 is a plot showing program and erase conditions after a first cycling sequence.
Figure 18:
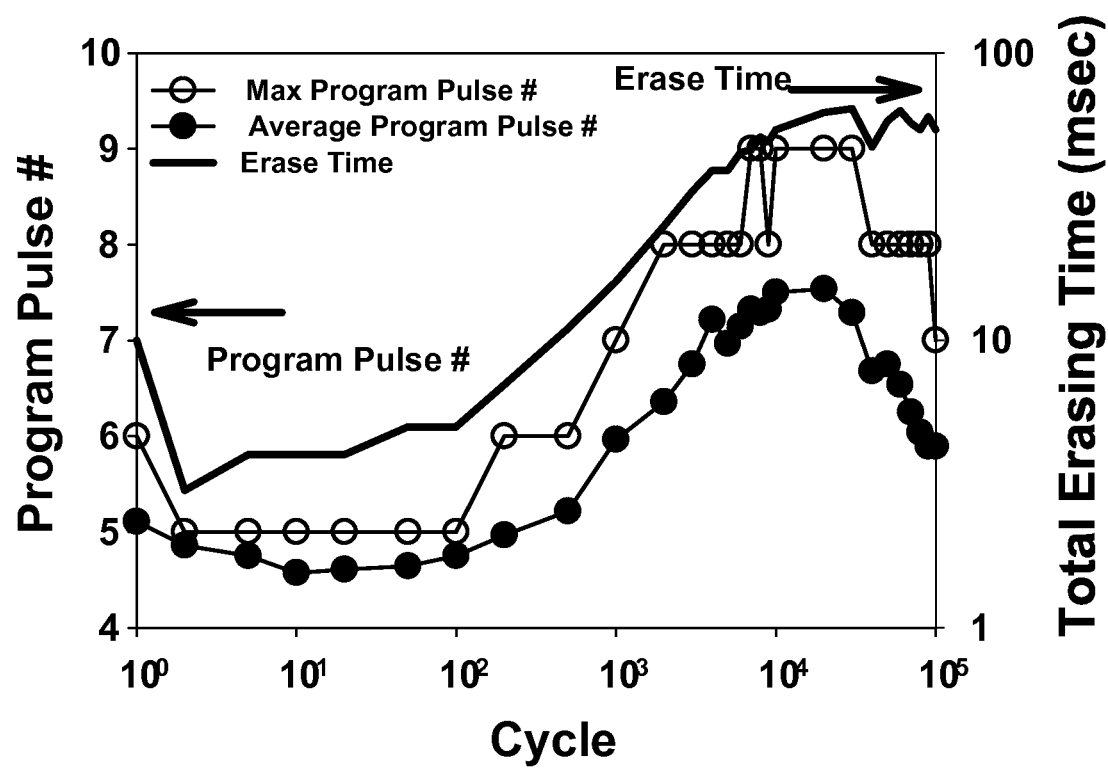
FIG. 18 is a plot showing program and erase conditions after a second cycling sequence following a thermal anneal.
Figure 19:
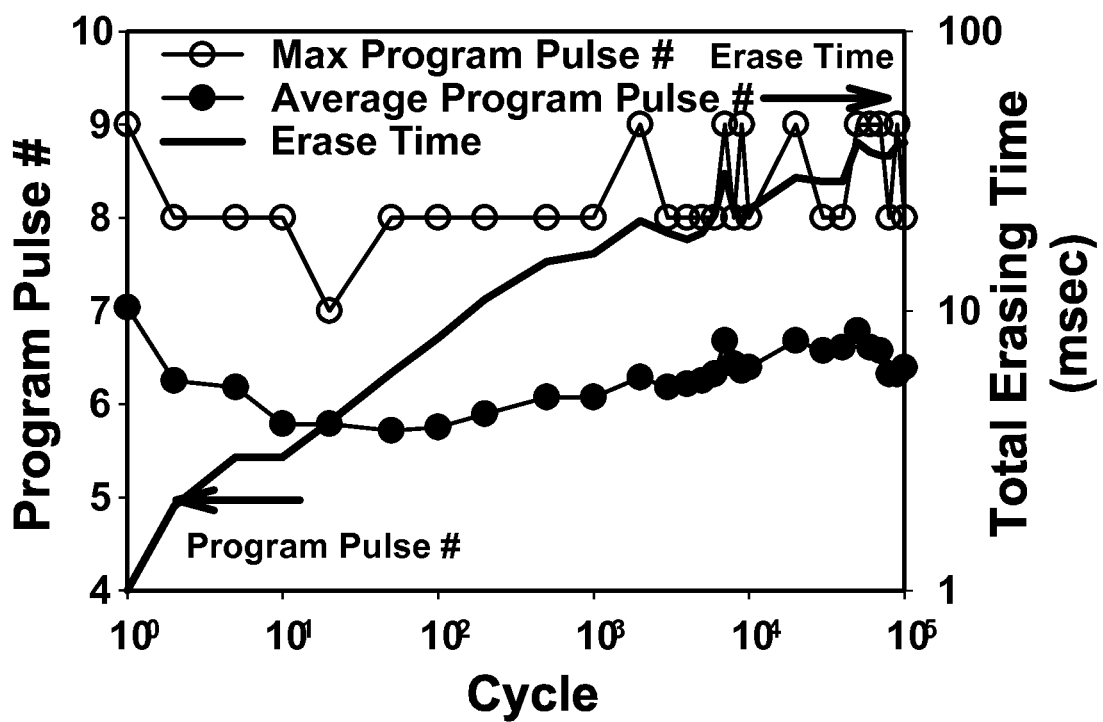
FIG. 19 is a plot showing program and erase conditions after ten cycling and annealing sequences.

FIGS. 17-19 show page program shot count (i.e. the number of program pulses required for successful programming in a program, verify, retry cycling algorithm) and total erasing time variations over 100,000 program/erase cycles. The figures show traces for worst case count of page program shots, an average number of page program shots, and a total erasing time traces. FIG. 17 shows the performance for a first set of 100,000 cycles. FIG. 18 shows the performance for a second set of 100,000 cycles after thermal anneal. FIG. 19 shows the performance for a tenth set of 100,000 cycles with thermal annealing. These figures illustrate that the program/erase cycling conditions are almost fully recovered after the tenth set of 100,000 P/E cycles, followed by a thermal anneal, showing endurance of over one million cycles.

Figure 20:
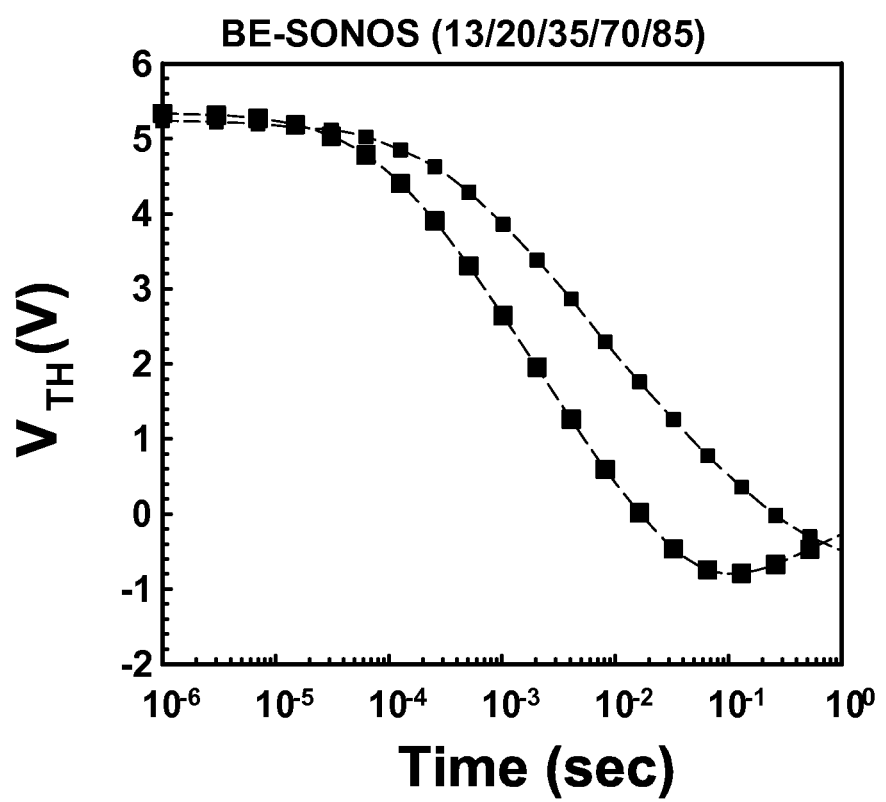
FIG. 20 showing erase performance at room temperature and at elevated temperatures for a charge trapping memory cell.

FIG. 20 illustrates erase performance with and without thermal anneal for a BE-SONOS memory cell having a multilayer tunneling layer that comprises 1.3 nm of silicon oxide, 2 nm of silicon nitride, and 3.5 nm of silicon oxide, a charge trapping layer that comprises 7 nanometers of silicon nitride, and a blocking layer that comprises 8.5 nm of silicon oxide. A −FN erase bias of −17 volts is applied across the gate and body of the device. The erase time at 25° C. for a threshold drop from about 5 V to about 0 V under these conditions is close to 1 second. At an elevated temperature of 250°, the erase time under these conditions falls to about 11 milliseconds. Thus, FIG. 20 shows that applying thermal annealing during an erase operation can improve erase performance.

Figure 21:
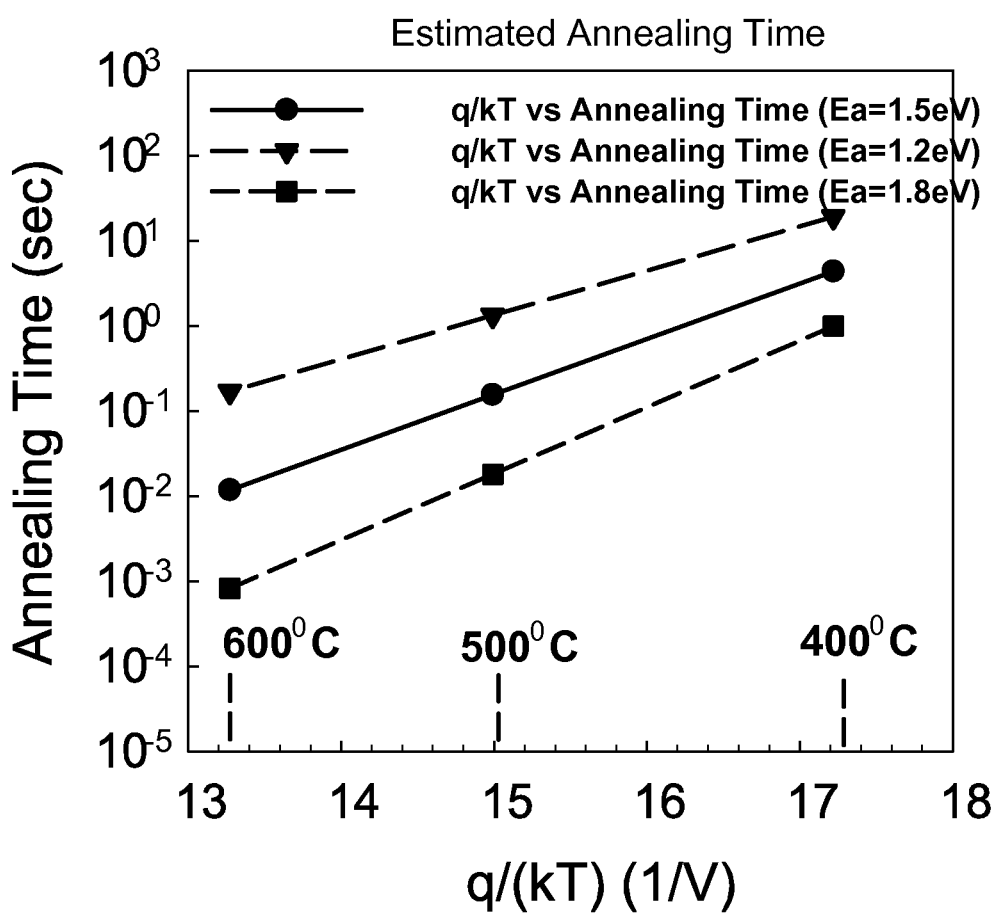
FIG. 21 is a graph of estimated annealing time for charge trapping memory cells undergoing an erase operation.

FIG. 21 is an Arrhenius plot of annealing time in seconds versus $q/(kT)$, showing an estimated annealing time for thermally assisted erase operations in a BE-SONOS device. Three traces are shown, where the uppermost trace assumes an activation energy of 1.2 electron volts, the trace in the middle assumes activation energy of 1.5 electron volts, and the lower trace assumes activation energy of 1.8 electron volts. Also, for the calculations, it is assumed, based on experimentation that the annealing time required for recovery is about two hours at 250° C. Based on the calculation shown in the plot, at a temperature of about 600° C., the annealing time required will be only a few milliseconds, and is therefore suitable for use within the erase speed requirement of current flash memory specifications. Temperatures on the order of 600° C. can be achieved using resistive heating as described herein.

Figure 22:
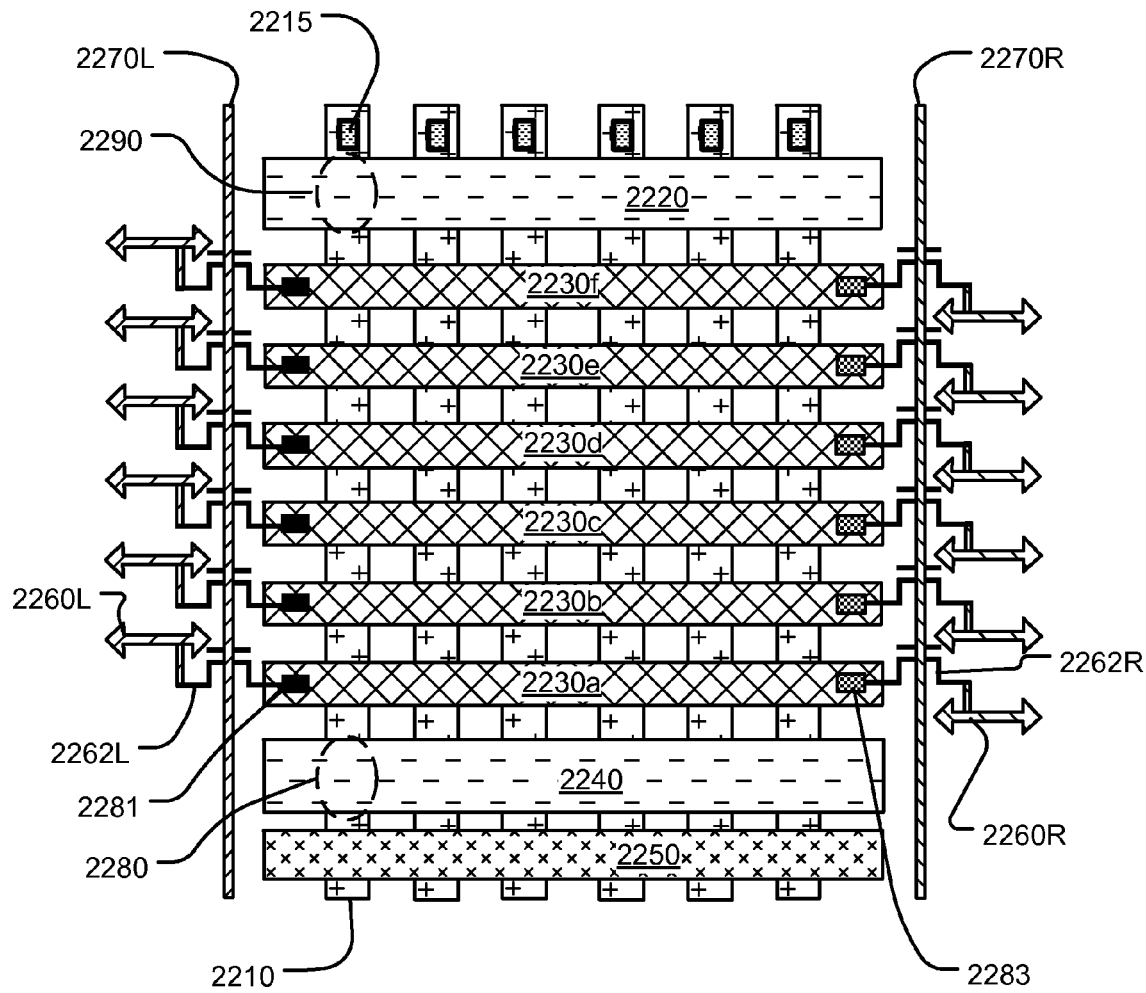
FIG. 22 is a simplified view of a section of a segmented word line flash memory array, including first global word lines, second global word lines, and local word lines.

FIG. 22 is a simplified view of a sector of a memory array on an integrated circuit. The memory comprises an array of memory cells that includes rows and columns. The array of memory cells may be arranged in a NAND structure. Memory cells in the array may comprise semiconductor bodies on an insulating substrate.

The sector shown in FIG. 22 includes word line segments arranged as local word lines 2230a through 2230f. The local word lines are coupled with corresponding pairs of global word lines (represented by two ended arrows on opposite sides of the sector) in an arrangement which can be understood with reference to local word line 2230a. A first switch 2262L is used to connect a first global word line 2260L in a pair via a contact 2281 to the local word line 2230a. A second switch 2262R is used to connect a second global word line 2260R in the pair via a contact 2283 to the local word line 2230a. This arrangement is repeated in a pattern for each local word line and its corresponding pair of global word lines in the illustrated block of memory cells in the array. Thus, first (or left side) switches 2262L and second (or right side) switches 2262R are coupled to corresponding first (left) and second (right) ends of local word lines 2230*a* through 2230*f*. The memory also comprises bit lines 2210 along corresponding columns. Bit lines can comprise local bit lines 2210 that are coupled to global bit lines (not shown) via contacts 2215.

The circuitry to connect bias voltages to the local word lines includes switches 2262L, 2262R which are coupled to a pair of global word lines. The pairs of global word lines include first global word lines 2260L coupled to the first switches 2262L for the local word lines 2230*a* through 2230*f* along the corresponding rows, and second global word lines 2260R coupled to the second switches 2262R for the local word lines 2230*a* through 2230*f* along the corresponding rows.

The memory includes an address decoder (not shown) coupled to the array illustrated in FIG. 22, including a local word line decoder coupled to the first switches 2262L and second switches 2262R for the local word lines 2230*a* through 2230*f*, to couple selected local word lines to the corresponding pairs of global word lines 2260L and 2260R. The local word line decoder in this example is coupled to first local word line select lines 2270L and second local word line select lines 2270R that control the first switches 2262L and second switches 2262R, respectively, for a block or a column of blocks of cells in the array illustrated in FIG. 22. Each first switch 2262L can comprise an FET transistor having a gate, an input and an output. The first local word line select lines 2270L are coupled to gates of the first switches 2262L. The inputs of first switches 2262L are coupled to the first global word lines 2260L. The outputs of first switches 2262L are coupled to first ends of the local word lines 2230*a* through 2230*f*.

Similarly, each second switch 2262R can comprise an FET transistor, such as a metal-oxide-semiconductor field-effect transistors (MOSFET), having a gate, an input and an output. The second local word line select lines 2270R are coupled to gates of the second switches 2262R. The inputs of second switches 2262R are coupled to the second global word lines 2260R. The outputs of second switches 2262R are coupled to second ends of the local word lines 2230*a* through 2230*f*.

The memory includes a plurality of paired word line drivers and word line termination circuits coupled to corresponding pairs of global word lines as discussed above, for example in connection with FIGS. 3 and 4. The paired word line drivers and word line termination circuits include a word line driver coupled to a first global word line 2260L in the corresponding pair, and a word line termination circuit coupled to the second global word line 2260R in the corresponding pair. The word line driver circuits and the word line termination circuits are adapted to apply different bias conditions to the first and second global word lines, so as to induce a selected bias arrangement on selected local word lines. The word line drivers and termination circuits can be implemented using similar circuits to apply selected bias conditions to the local word lines, including voltage levels, current sources, bias circuits and so on. The labels "driver" and "termination circuit" are used herein to suggest that the roles of the circuits in any given operation can be different, where one applies a higher voltage than the other for example, and do not suggest necessarily that they are implemented using different circuit designs.

In the illustrated example, the block of memory cells includes six local bit lines and six local word lines for the purposes of illustration. Implementations of the technology can include various sizes of blocks. For example, in a NAND architecture each block may include 16, 32 or 64 local word lines between string select transistors and ground select transistors. Also, the width of the block, in terms of the number of local bit lines can be selected according to the desired thermal anneal characteristics to be carried out, and the resistance of the local word lines.

The resistance of the local word lines is a function of the material used, the cross-sectional area of the local word line, and the length of the local word line. In a representative implementation, the material of the local word lines can comprise a metal, or other material, having a sheet resistance of about 1 ohm/square with a cross-sectional area of about 30 nm×30 nm. The length of the local word lines can be on the order of 150μ, which would accommodate for example 1500 local bit lines given a 100 nm pitch. Of course these values depend on a variety of factors that can be taken into account in the design of the integrated circuit.

The array of memory cells in the example shown is arranged in a NAND configuration, where the local bit lines 2210 include the channels of the memory cells in a string of cells. Each NAND string includes a string select switch 2290 to couple the string (i.e. local bit line 2210) to a global bit line via contact 2215, and a ground select switch 2280 to couple the string (i.e. local bit line 2210) to a common source line 2250, or other reference. The string select switches can be formed by a MOS transistor having a gate in a string select line SSL 2220. The ground select switches can be formed by a MOS transistor having a gate in a ground select line GSL 2240.

In operation, both the first global word lines 2260L and the second global word lines 2260R are controlled to connect bias conditions via the first switches 2262L and the second switches 2262R to the local word lines 2230*a* through 2230*f*, including in combination bias arrangements to induce current flow for thermal anneal, and for other operations involving selected memory cells.

Figure 23:
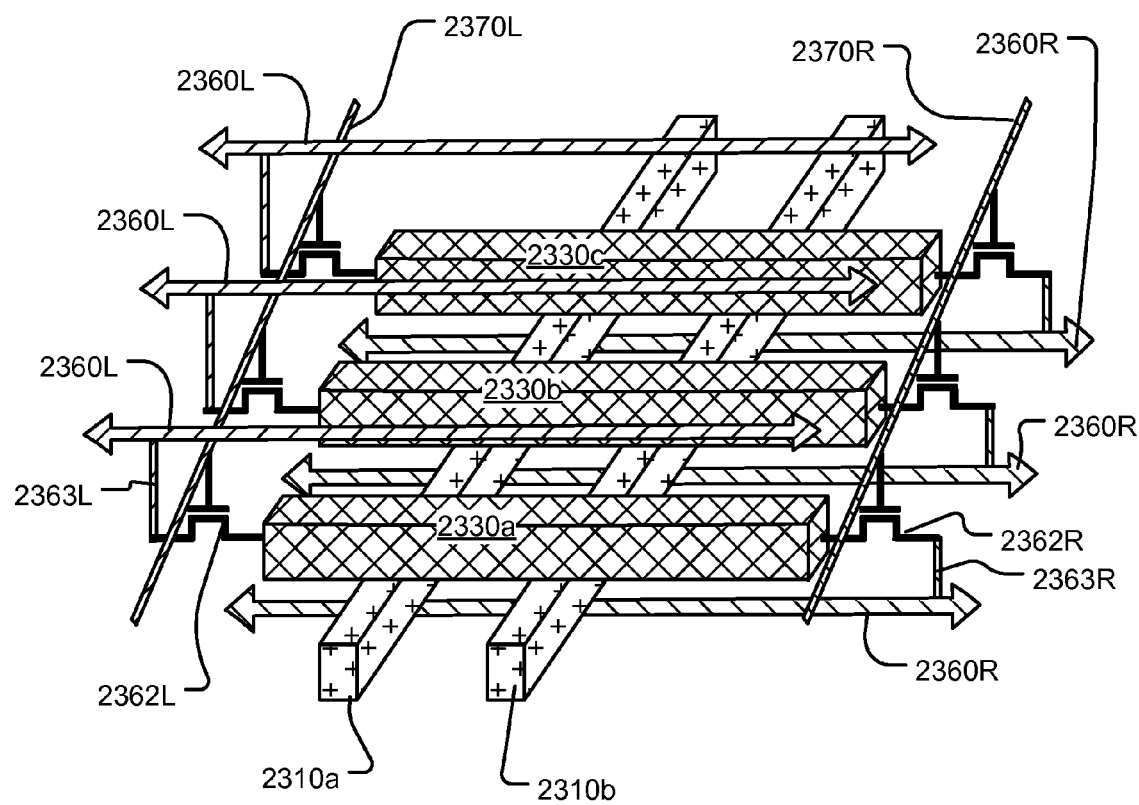
FIG. 23 is a perspective view of the memory array showing first global word lines above the memory array and second global word lines below the memory array.

FIG. 23 is a perspective view of circuitry to apply bias voltages for an array of memory cells. The circuitry includes a plurality of local bit lines 2310*a*, 2310*b*, and a plurality of local word lines 2330*a*, 2330*b*, 2330*c*. The memory cells occur at the crosspoints of the local bit lines 2310*a*, 2310*b* and the local word lines 2330*a*, 2330*b*, 2330*c*. First and second switches, such as switches 2362L and 2362R on the local word line 2330*a*, are coupled to the first and second ends of each of the local word lines 2330*a*, 2330*b*, 2330*c*. In this implementation, switches 2362L on the left end of the local word lines are coupled to contact structures 2363L, by which they are connected to global word lines 2360L which overlie the local word lines. Also, switches 2362R on the right end of the local word lines are coupled to contact structures 2363R, by which they are connected to global word lines 2360R that underlie the local word lines. A local word line decoder in this example is coupled to first local word line select lines 2370L and second local word line select lines 2370R that control the switches 2362L and switches 2362R, respectively. This arrangement of the circuitry for applying a bias arrangement to blocks of memory cells can be implemented in devices utilizing an insulating layer beneath an array of memory cells, such as in implementations using thin-film memory cells.

Figure 24:
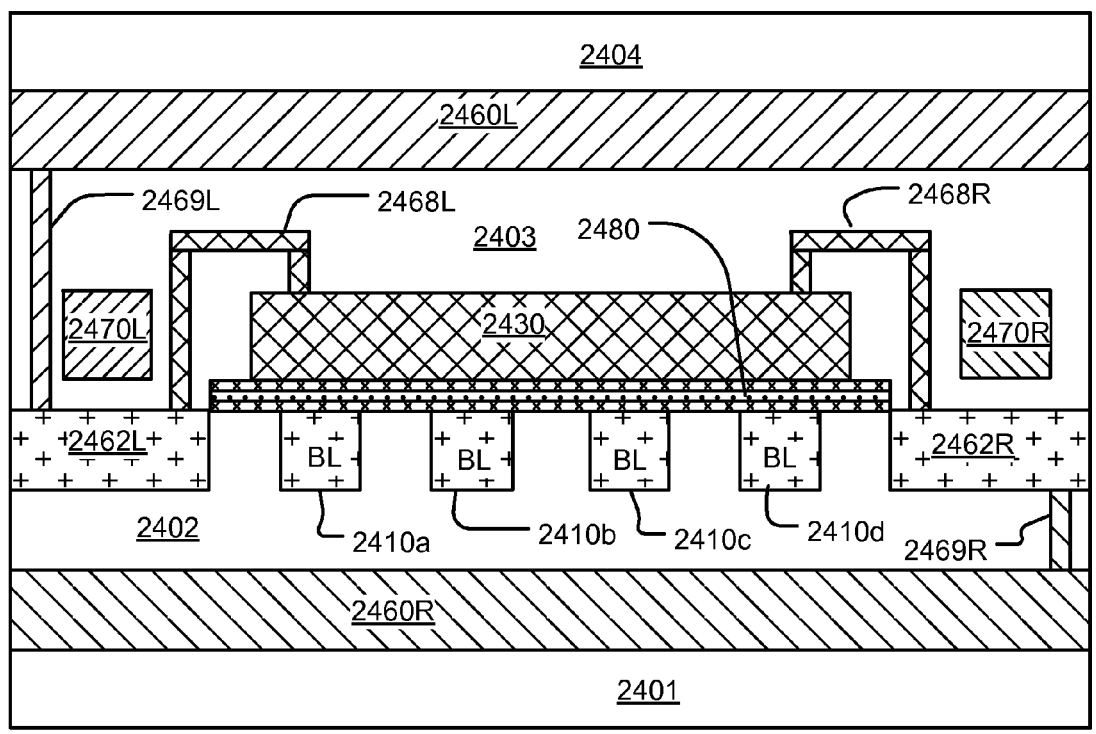
FIG. 24 is a cross-sectional view of the memory array showing first global word lines above the memory array and second global word lines below the memory array.

FIG. 24 is a cross-sectional view of an array structure in which a first global word line 2460L is disposed above a local word line 2430 and a second global word line 2460R is disposed below the local word line 2430. The cross-sectional view of the array is taken along the first global word line 2460L, the second global word line 2460R, and the local word line 2430. In this structure, an insulating layer 2401 overlies a substrate (not shown) which may include multiple layers of memory arrays, logic circuits and other integrated circuit features. A first patterned conductor layer overlies the insulating layer 2401, in which the "second" global word lines including the global word line 2460R are laid out. Insulating layer 2402 overlies the patterned conductor layer including global word line 2460R. Overlying the insulating layer 2402, is an array layer that includes a plurality of local bit lines 2410a, 2410b, 2410c, 2410d along with transistor bodies 2462L and 2462R for switches used to select the local word line 2430. The plurality of local bit lines 2410a, 2410b, 2410c, 2410d is arranged in this view so that the bit lines extend into and out of the plane of the paper.

A memory element layer 2480, such as a multilayer dielectric charge trapping structure, overlies the plurality of local bit lines 2410a, 2410b, 2410c, 2410d. The local word line 2430 overlies the memory element layer 2480. Local word line select lines 2470L and 2470R overlie the transistor bodies 2462L and 2462R, respectively. The local word line select lines 2470L and 2470R are arranged in this view so that they extend into and out of the plane of the paper.

The transistor bodies 2462L and 2462R include source, channel and drain regions (not illustrated). The local word line select lines 2470L and 2470R are arranged as gates over the channels of the transistor bodies 2462L and 2462R. One of the source and drain terminals of the transistor body 2462L is connected to a conductive plug 2469L which extends above the local word lines, while the other of the source and drain terminals of the transistor body 2462L is connected via a connector 2468L to a first end of the local word line 2430. Likewise, one of the source and drain terminals of the transistor body 2462R is connected to a conductive plug 2469R which extends below the local word lines, while the other of the source and drain terminals of the transistor body 2462R is connected via a connector 2468R to a second end of the local word line 2430. In some implementations, the local word line 2430 can extend over the transistor bodies 2462L and 2462R, and contacts formed therebetween, as an alternative to the more complex connectors 2468L and 2468R.

The structure including the local word line 2430, and the local word line select lines 2470L and 2470R, is disposed within an insulating fill 2403. A second patterned conductor layer overlies the insulating fill 2403, in which the "first" global word lines including the global word line 2460L are laid out. As illustrated, the conductive plug 2469L connects the transistor body 2462L to the overlying global word line 2460L. Likewise, the conductive plug 2469R connects the transistor body 2462R to the underlying global word line 2460R. Insulating layer 2404 overlies the patterned conductor layer including the global word line 2460L.

Figure 25:
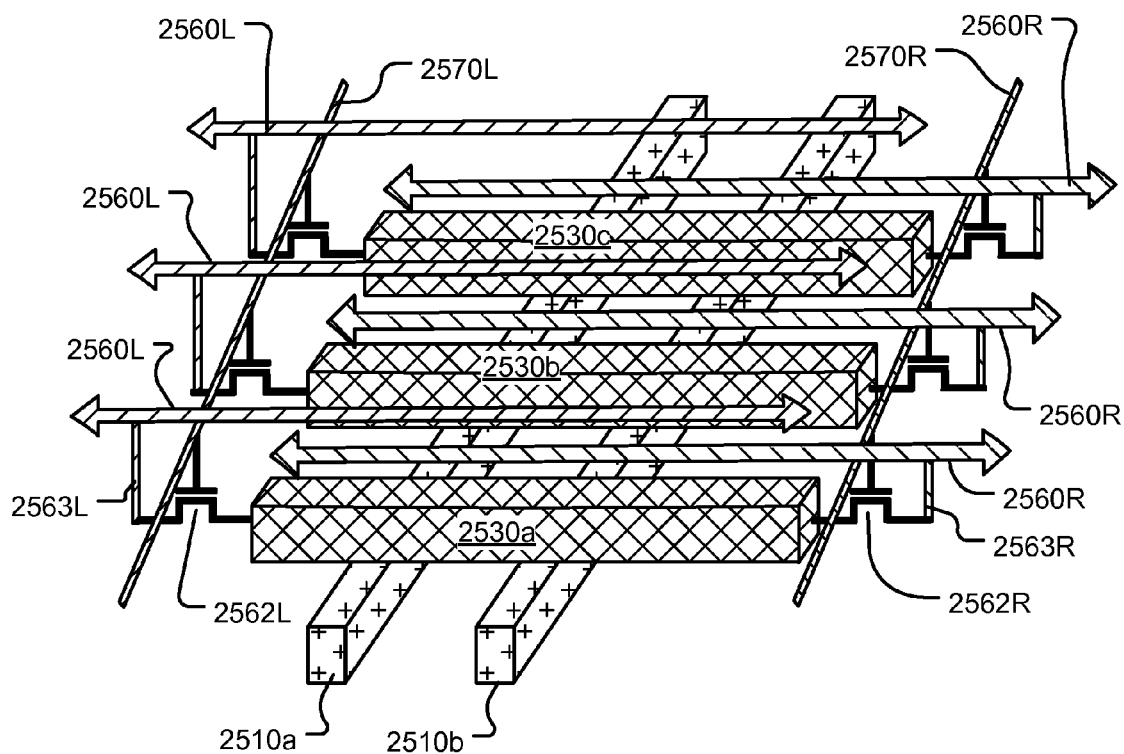
FIG. 25 is a perspective view of the memory array showing both first global word lines and second global word lines on a same side of the memory array.

FIG. 25 is a perspective view of circuitry to apply bias voltages for an array of memory cells. The circuitry includes a plurality of local bit lines 2510a, 2510b, and a plurality of local word lines 2530a, 2530b, 2530c. The memory cells occur at the crosspoints of the local bit lines 2510a, 2510b and the local word lines 2530a, 2530b, 2530c. First and second switches, such as switches 2562L and 2562R on the local word line 2530a, are coupled to the first and second ends of each of the local word lines 2530a, 2530b, 2530c. In this implementation, switches 2562L on the left end of the local word lines are coupled to contact structures 2563L, by which they are connected to global word lines 2560L which overlie the local word lines. Also, switches 2562R on the right end of the local word lines are coupled to contact structures 2563R, by which they are connected to global word lines 2560R, and also overlie the local word lines. A local word line decoder in this example is coupled to first local word line select lines 2570L and second local word line select lines 2570R that control the switches 2562L and switches 2562R, respectively.

Figure 26A:
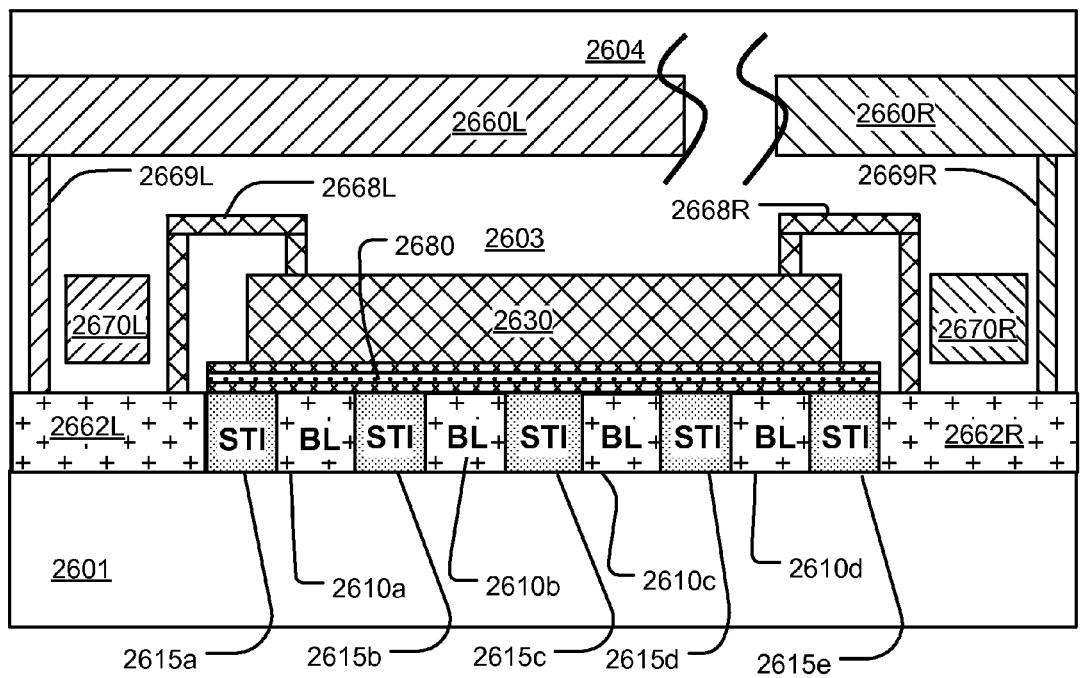
FIG. 26A is a cross-sectional view of the memory array showing both first global word lines and second global word lines above the memory array.

FIG. 26A is a cross-sectional view of an array structure in which both the first global word lines 2660L and the second global word lines 2660R of the global word line pairs are disposed above the local word lines. The cross-sectional view of the array is taken along local word line 2630, with the first and second global word lines aligned in the same level, with a cutout feature in the drawing to reveal both. In this structure, a semiconductor substrate 2601 includes a plurality of local bit lines 2610a, 2610b, 2610c, 2610d separated by trench isolation structures 2615a, 2615b, 2615c, 2615d, 2615e. Also, transistor bodies 2662L and transistor bodies 2662R are formed in the substrate 2601 on each row in the array. The transistor bodies 2662L and transistor bodies 2662R include source, channel and drain regions (not illustrated). A memory element layer 2680, such as a multilayer dielectric charge trapping structure, overlies the plurality of local bit lines 2610a, 2610b, 2610c, 2610d. A local word line 2630 overlies the memory element layer 2680. Local word line select lines 2670L and 2670R overlie the transistor channels in the transistor bodies 2662L and transistor bodies 2662R, respectively. The local word line select lines 2670L and 2670R are arranged in this view so that they extend into and out of the plane of the paper.

The local word line select lines 2670L and 2670R are arranged as gates over the channels of the transistor bodies 2662L and transistor bodies 2662R. One of the source and drain terminals of the transistor body 2662L is connected to a conductive plug 2669L which extends above the local word lines, while the other of the source and drain terminals of the transistor body 2662L is connected via a connector 2668L to a first end of the local word line 2630. Likewise, one of the source and drain terminals of the transistor body 2662R is connected to a conductive plug 2669R which extends above the local word lines while potentially offset in a direction perpendicular to the plane of the paper, while the other of the source and drain terminals of the transistor body 2662R is connected via a connector 2668R to a second end of the local word line 2630. In some implementations, the local word line 2630 can extend over the transistor bodies 2662L and transistor bodies 2662R, and contacts formed therebetween, as an alternative to the more complex connectors 2668L and 2668R.

The structure including the local word lines 2630, and the local word line select lines 2670L and 2670R, is disposed within an insulating fill 2603. A patterned conductor layer overlies the insulating fill 2603, in which the "first" global word lines including global word line 2660L and the "second" global word lines including global word line 2660R, are laid out. As illustrated, the conductive plug 2669L connects the transistor body 2662L to the overlying global word line 2660L. Likewise, the conductive plug 2669R connects the transistor body 2662R to the overlying global word line 2660R. Insulating layer 2604 overlies the patterned conductor layer including the global word line 2660L and global word line 2660R.

Figure 26B:
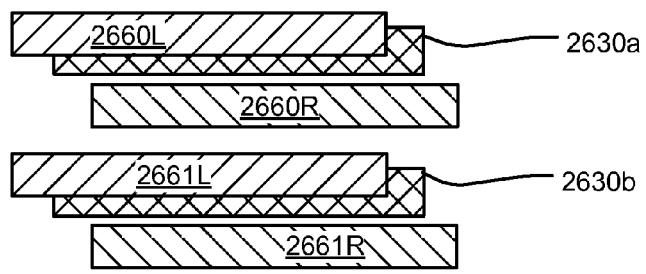
FIG. 26B is a top view of the memory array showing both first global word lines and second global word lines in tight pitch above the memory array.

FIG. 26B illustrates a layout or top view for the local word line 2630a and overlying pair of global word lines 2660L/2660R, and the local word line 2630b and overlying pair of global word lines 2661L/2661R. In implementations in which both of the first and second global word lines in the pairs of global word lines overlie the local word lines, the pitch orthogonal to the local word lines can be increased to accommodate two global word lines for each local word line. The global word lines can have a "twisted" layout which can improve the flexibility in making contacts to the underlying local word line select transistors, or they can be straight as illustrated in FIG. 26B. Also, in some implementations, the first global bit lines can be implemented in a first patterned conductor layer overlying the local word lines, and the second global bit lines in each pair can be implemented in an additional patterned conductor layer overlying the first.

Structures, including first global word lines 2660L and second global word lines 2660R arranged above the memory array, can be implemented using flash memory on bulk silicon devices as well as thin film transistor TFT flash memory and other memory structures on silicon-on-insulator-type devices.

Figure 27A:
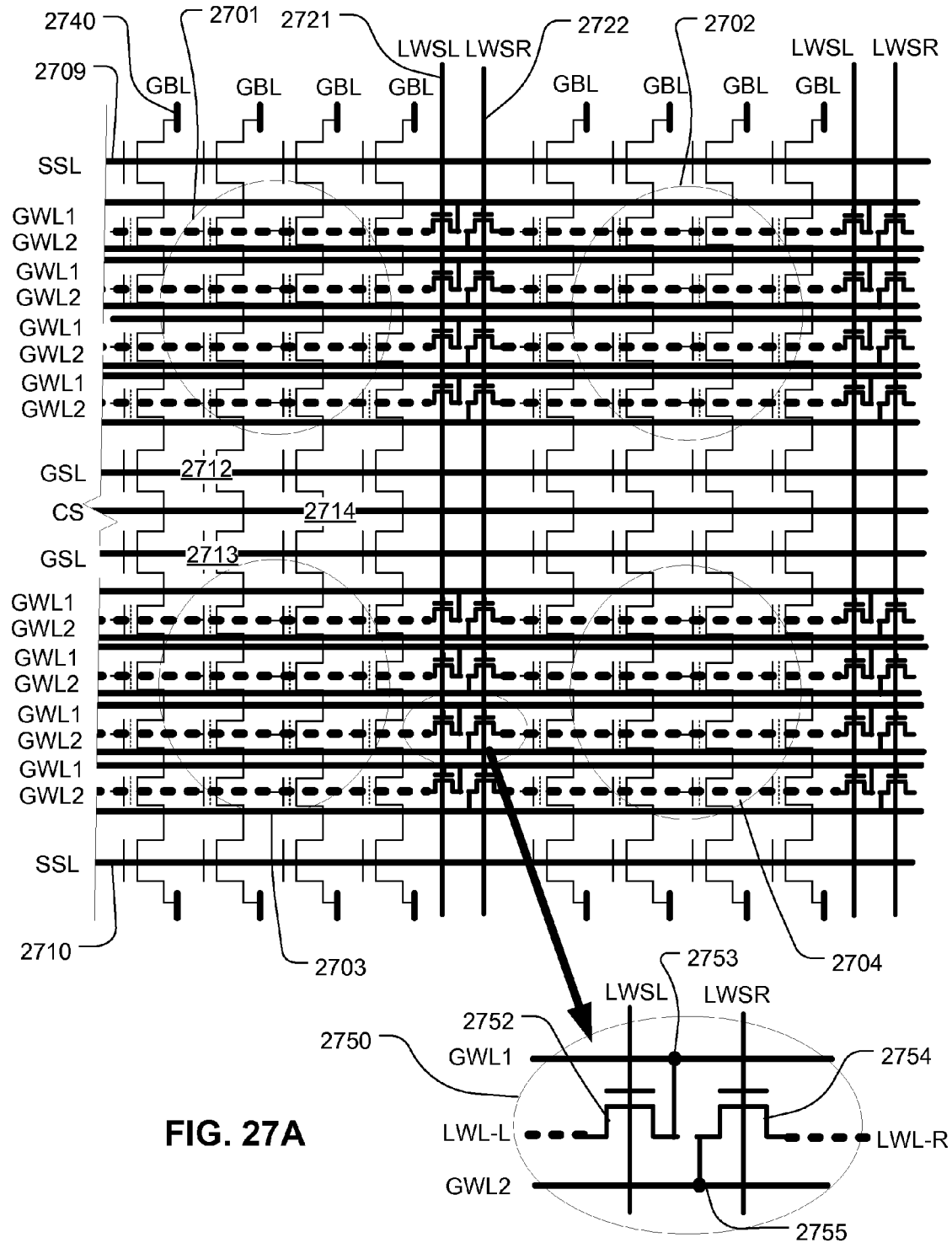
FIG. 27A and FIG. 27B are schematic diagrams showing alternative segmented word line decoding circuitry configurations.

FIGS. 27A through 27D illustrate various configurations of the global word lines/local word line circuitry used for applying bias condition to the memory cells in the array. In FIG. 27A, a NAND architecture array is shown with four sectors including memory cells generally in the areas of the array corresponding with circles 2701, 2702, 2703, 2704. In a NAND architecture, the global bit lines GBL (e.g. 2740) are arranged along columns with string select transistors and ground select transistors used to couple individual strings between a global bit line GBL and a common source CS line 2714. In this drawing, the global bit lines GBL overlie the array and are shown only at the contact points with the string select transistors, to avoid obscuring other parts in the figure. Strings are coupled to their corresponding global bit lines using a string select line SLL 2709 on the top sectors, and a string select line 2710 on the bottom sectors, which are arranged parallel with the word lines and act as the gates for string select transistors as illustrated. Strings are coupled to the common source CS line using a ground select line GSL 2712 for the top sectors, and a ground select line GSL 2713 for the bottom sectors. There are pairs of global word lines GWL1, GWL2 arranged along each row of memory cells in the array as illustrated. This layout can be characterized as a top to bottom mirror image layout along the bit lines, allowing the sector to share common source lines and contacts to the global bit lines. Within each sector, local word lines (represented by the bold dashed lines) are connected to switches in the form of MOS transistors on each end. The switches are controlled using a left local word line select line LWSL (e.g. 2721) and a right local word line select line LWSR (e.g. 2722). The switches can be arranged in a variety of configurations. In this example, an enlarged view of the switch configuration illustrated in FIG. 27A is shown at circle 2750. The switch configuration in circle 2750 shows a first global word line GWL1 and a second global word line GWL2 extending along a row which includes a left side local word line LWL-L and a right side local word line LWL-R. A MOS transistor 2752 has a first source/drain terminal coupled to the left side local word line LWL-L, and second source/drain terminal coupled to a first interlayer connection 2753, which connects to the first global word line GWL1. A MOS transistor 2754 has a first source/drain terminal coupled to the right side local word line LWL-R, and second source/drain terminal coupled to a second interlayer connection 2755, which connects to the second global word line GWL2. The switch configuration illustrated in circle 2750 is repeated on the ends of the local word lines through the array and allows for connection of one end of each local word line to one of the global word lines, and for connection of the other end of each local word line to the other of the global word lines.

Figure 27B:
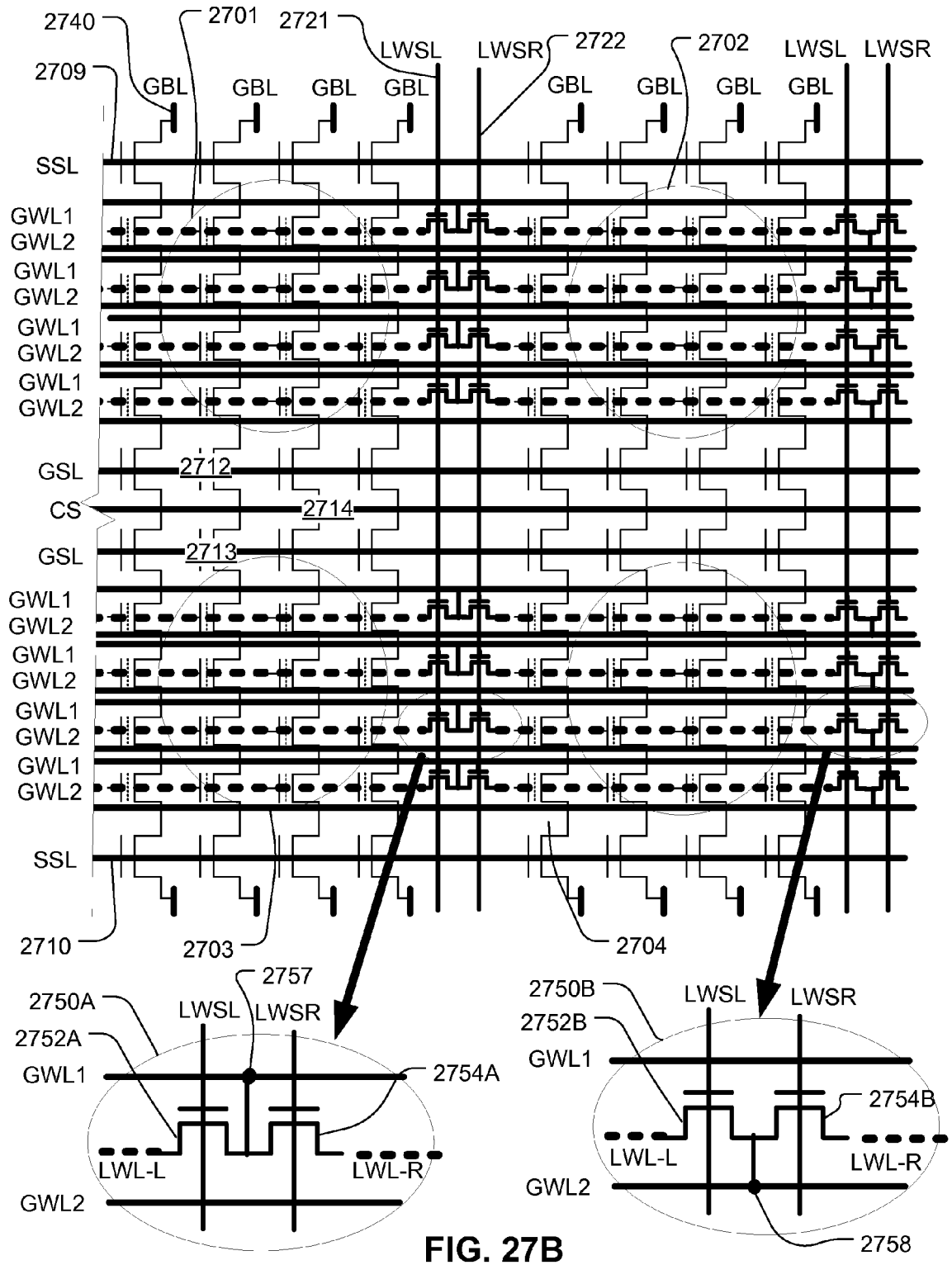

FIG. 27B illustrates an alternative array layout in which the switch configuration in circle 2750A utilizes a single interlayer connection 2757, rather than two as shown in FIG. 27B. The reference numerals used in FIG. 27A are repeated in this figure for like elements, and such elements are not described again. In this example, there are two switch configuration in circle 2750A and 2750B. The switch configuration in circle 2750A shows a first global word line GWL1 and a second global word line GWL2 extending along a row which includes a left side local word line LWL-L and a right side local word line LWL-R. A MOS transistor 2752A has a first source/drain terminal coupled to the left side local word line LWL-L, and second source/drain terminal coupled to the interlayer connection 2757, which connects to the first global word line GWL1. A MOS transistor 2754A has a first source/drain terminal coupled to the right side local word line LWL-R, and second source/drain terminal coupled to the same interlayer connection 2757, which connects to the first global word line GWL1.

The switch configuration in circle 2750A shows a first global word line GWL1 and a second global word line GWL2 extending along a row which includes a left side local word line LWL-L and a right side local word line LWL-R. A MOS transistor 2752A has a first source/drain terminal coupled to the left side local word line LWL-L, and second source/drain terminal coupled to the interlayer connection 2757, which connects to the first global word line GWL1. A MOS transistor 2754A has a first source/drain terminal coupled to the right side local word line LWL-R, and second source/drain terminal coupled to the same interlayer connection 2757, which connects to the first global word line GWL1.

The switch configuration illustrated in circle 2750B is arranged to connect the local word lines to the second global word line GWL2 on the opposite end of each segment. Thus, the configuration 2750B includes a first global word line GWL1 and a second global word line GWL2 extending along a row which includes a left side local word line LWL-L and a right side local word line LWL-R. A MOS transistor 2752B has a first source/drain terminal coupled to the left side local word line LWL-L, and second source/drain terminal coupled to the interlayer connection 2758, which connects to the second global word line GWL2. A MOS transistor 2754B has a first source/drain terminal coupled to the right side local word line LWL-R, and second source/drain terminal coupled to the same interlayer connection 2758, which connects to the second global word line GWL2. The pattern of switch configurations 2750A and 2750B is repeated through the array and allows for connection of one end of each local word line to one of the global word lines, and for connection of the other end of each local word line to the other of the global word lines.

Figure 27C:
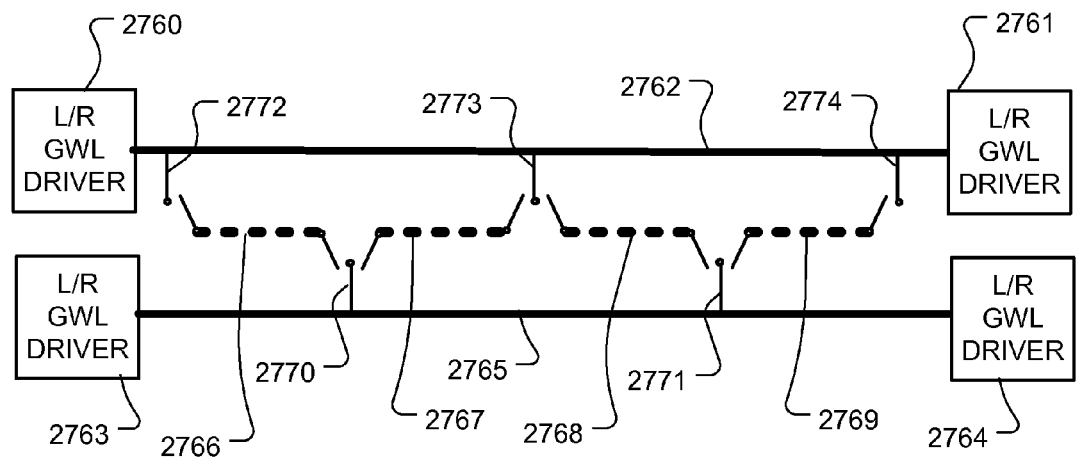
FIG. 27C and FIG. 27D illustrate decoding configurations for a global word line pair along a corresponding row of local word lines.
Figure 27D:
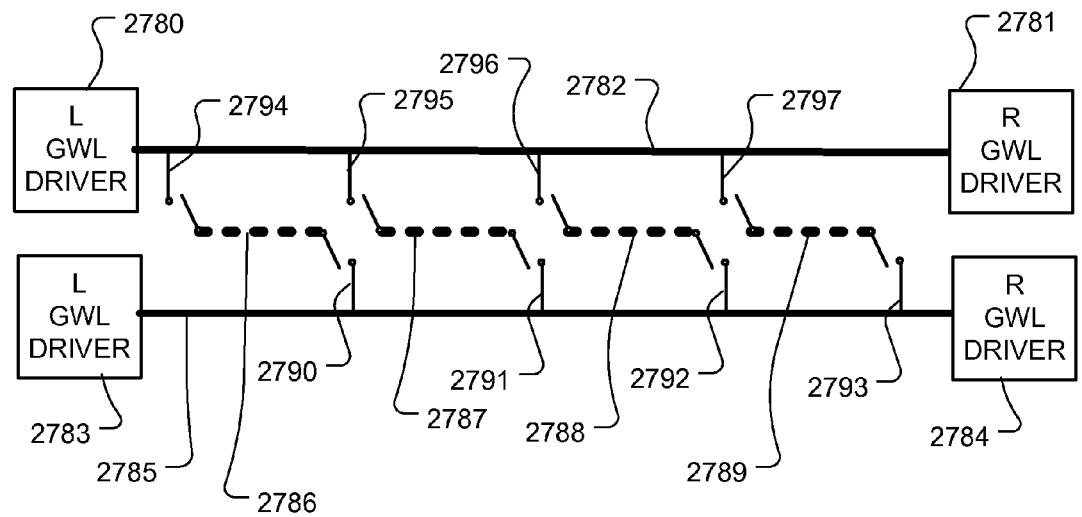

FIGS. 27C and 27D illustrate representative configurations of global word line pairs and local word lines arranged along a row in the memory array, with corresponding global word line drivers, where a driver may also act as a global word line termination circuit.

FIG. 27C shows an arrangement like that of FIG. 27B, including a first global word line pair including global word lines 2762 and 2765. Global word line 2762 is connected between a left/right global word line driver 2760 on one end, and a complementary left/right global word line driver 2761 on the other end. Likewise, global word line 2765 is connected between a left/right global word line driver 2763 on one end, and a complementary left/right global word line driver 2764 on the other end.

In this illustration, there are four word line segments (2766-2769) arranged along the row with the corresponding global word line pair 2762/2765. A contact 2772 on global word line 2762 is connected via a switch to the right end of local word line 2766. The left end of local word line 2766 is connected to contact 2770 on the global word line 2765 via a first switch. Also, contact 2770 on global word line 2765 is connected via a second switch to the left end of local word line 2767. The contact 2773 on global word line 2762 is connected via a first switch to the right end of local word line 2767, and via a second switch to the left end of local word line 2768. The right end of local word line 2768 is connected to contact 2771 on the global word line 2765 via a first switch. Also, contact 2771 on global word line 2765 is connected via a second switch to the left end of local word line 2769. Contact 2774 on global word line 2762 is connected via a switch to the right end of local word line 2769.

In this arrangement, the drivers 2760 and 2761 can be arranged based on local word line selector decoding, so that the bias conditions applied across the local word lines during current conducting modes, such as thermal anneal, maintain the same current flow direction by alternating the higher-voltage and lower-voltage roles depending on the selected local word line. Alternatively, the current conducting modes can be allowed to operate with current flow in opposing directions depending on the selected local word line.

FIG. 27D shows an arrangement like that of FIG. 27A, including a first global word line pair including global word lines 2782 and 2785. Global word line 2782 connected between a left global word line driver 2780 on one end, and a complementary right global word line driver 2781 on the other end. Likewise, global word line 2785 is connected between a left right global word line driver 2783 on one end, and a complementary right global word line driver 2784 on the other end.

In this illustration, there are four word line segments (2786-2789) arranged along the row with the corresponding global word line pair 2782/2785. Contacts 2790, 2791, 2792, and 2793 on the global word line 2785 are connected via respective switches to the right ends of the respective local word lines 2786 through 2789. Contacts 2794, 2795, 2796 and 2797 on the global word line 2782 are connected via respective switches to the left ends of the respective local word lines 2786 through 2789.

In this arrangement, there are twice as many interlayer connections between the global word lines and the switches coupled to the local word lines as the arrangement of FIG. 27C. However, the global word line drivers can be arranged so that they operate exclusively as a left side driver or as a right side driver independently of the selected local word line.

Figure 28:
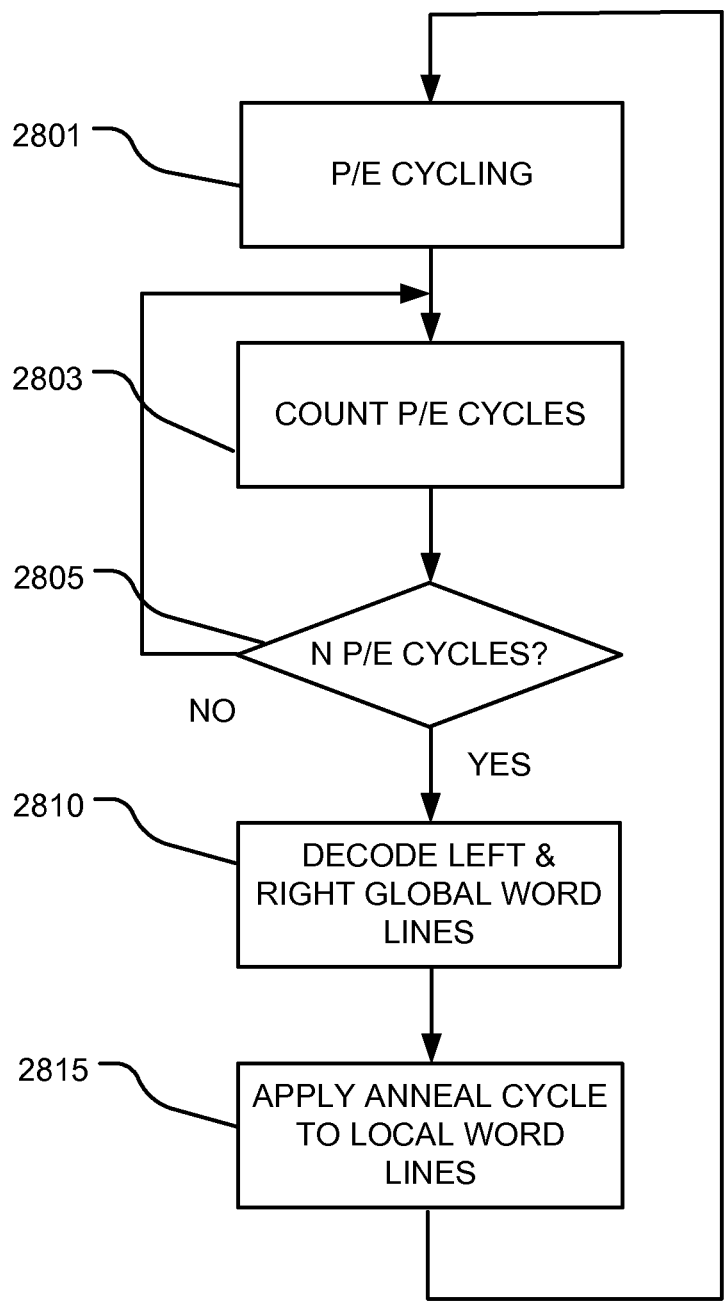
FIG. 28 is a simplified flow diagram of one control sequence for applying thermal anneal cycles with first and second global word lines.

FIG. 28 illustrates a representative process in which the thermal anneal cycles are interleaved among mission function operations (read, program, erase) for the memory device using first and second global word lines. During operation of the device, program/erase cycling operations are executed as represented by block 2801. The control circuitry on the device includes logic to maintain a count of program and erase cycles, program cycles or erase cycles (e.g. by counting program operations, by counting erase operations, or by counting pairs of program and erase operations) (block 2803), and monitors the count (block 2805). The control circuitry also includes the logic to perform the subsequent steps described below. If the count has not reached a threshold, then the control circuitry loops to continue counting cycles. When the count reaches a threshold, the control circuitry then couples first and second global word lines to selected corresponding local word lines (2810) and controls the plurality of paired word line drivers and word line termination circuits to apply bias voltages to the pairs of global bit lines that induce current flow in selected local word lines (2815).

The program and erase cycle counting and thermal anneal cycles can be applied on sets of cells, such as on a row-by-row basis, on a column-by-column basis, on a block-by-block basis, or over an entire array as suits a particular implementation. The annealing can be applied to one row or column of cells at a time, or to larger sets of cells, as suits the power consumption requirements and other requirements of a given implementation.

Figure 29:
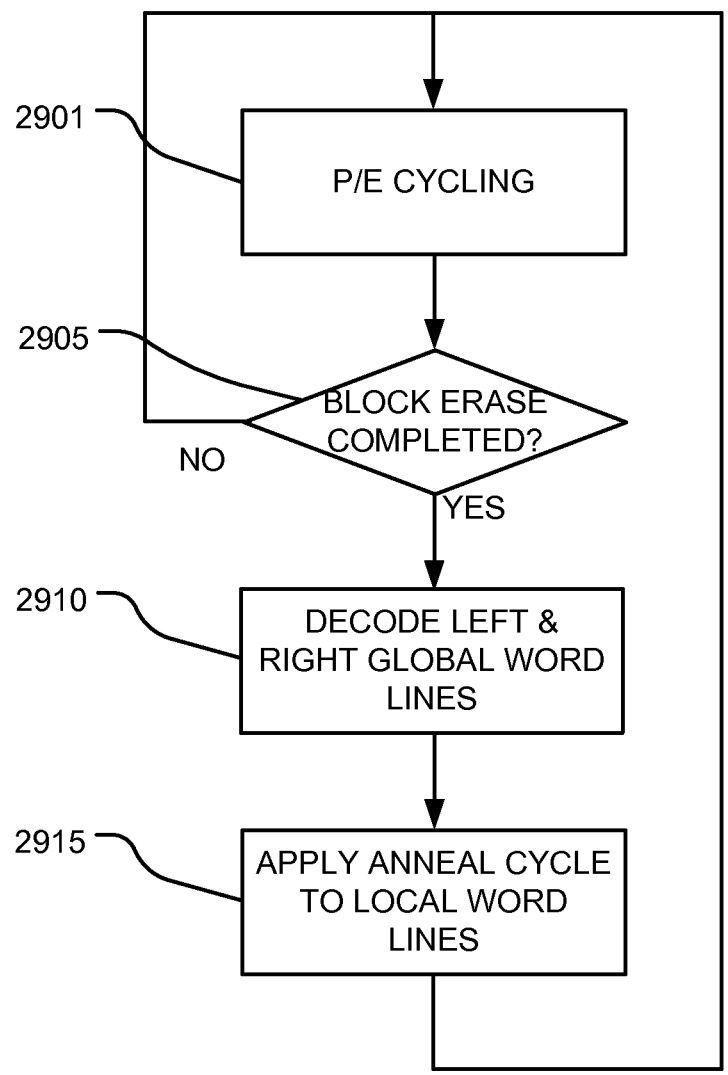
FIG. 29 is a simplified flow diagram of another control sequence for applying thermal anneal cycles with first and second global word lines.

FIG. 29 illustrates another process in which thermal anneal cycles are interleaved among mission function operations (read, program, erase) for the memory device using first and second global word lines. In the process of FIG. 29, program/erase cycling operations are executed during normal operation as represented by block 2901. The control circuitry includes logic to monitor for execution of a block erase function and to perform the subsequent steps described below. The control circuitry determines when a block erase operation has been completed (block 2905). If no block erase operation is completed, then the control circuitry continues monitoring and normal operation. If a block erase operation successfully completes, then the control circuitry decodes first and second global word lines for corresponding local word lines (2910) and controls the plurality of paired word line drivers and word line termination circuits to apply bias voltages to the pairs of global bit lines that induce current flow in selected local word lines (2915).

Figure 30:
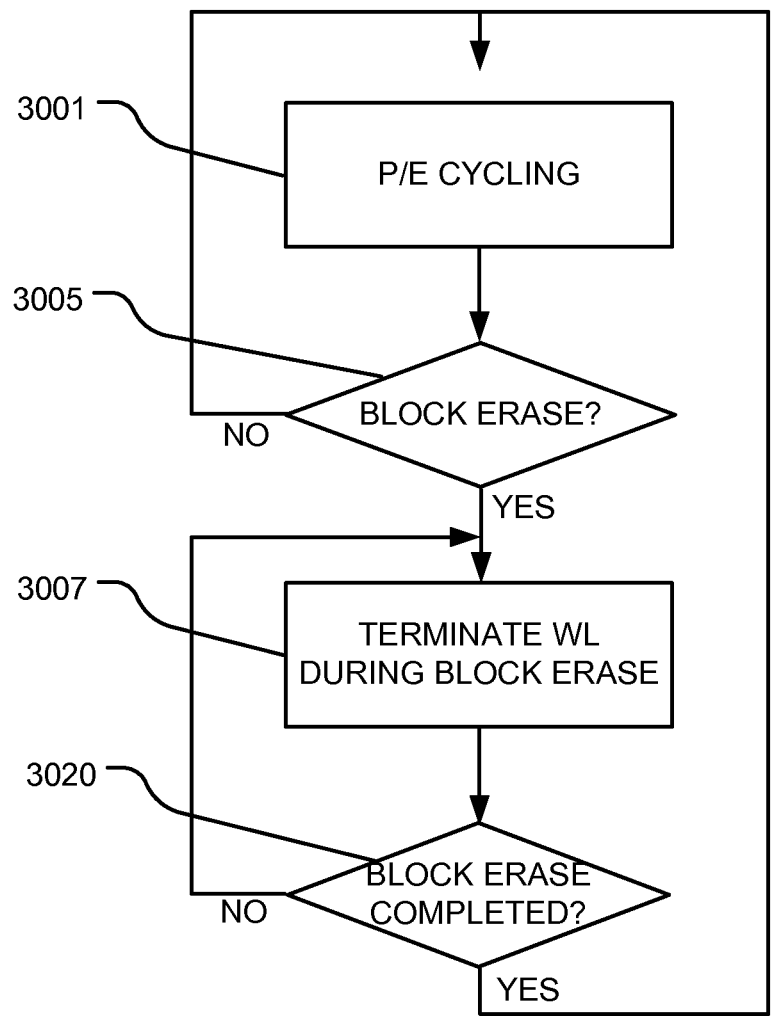
FIG. 30 is a simplified flow diagram of yet another control sequence for applying thermal anneal cycles with first and second global word lines.

FIG. 30 illustrates a representative process in which the thermal anneal is applied during a mission function, a block erase in this example, for the memory device using first and second global word lines. In the process of FIG. 30, normal program/erase cycling for the memory device is taking place as represented by block 3001. The control circuitry includes logic to determine whether a block erase has been requested (block 3005) and to perform the subsequent steps described below. If a block erase has not been requested, the control circuitry continues normal operations and monitoring. If a block erase operation is requested, then the control circuitry terminates the word lines during the block erase operation so that heat generating current is available to the memory cells being erased, or otherwise applies the thermal anneal (block 3007). As mentioned above, this can improve erase performance, as well as allow the dielectric charge trapping structures to recover from program/erase cycling damage. When the block erase function is completed (block 3020), the process returns to normal operations.

Experiments in accordance with the present technology have applied various word line currents and annealing pulses for post program/erase cycled devices, where the memory devices were BE-SONOS dielectric charge trapping memory in a test configuration. Word line currents include 1.2 mA, 1.6 mA, and 2 mA. Annealing pulses range from 0.1 ms (millisecond) to 100 seconds. Memory devices are exercised with 10,000 PE cycles to see damage effects. Results of the experiments in terms of threshold voltage shift during thermal annealing, subthreshold slope recovery, and transconductance are explained in detail below.

Figure 31:
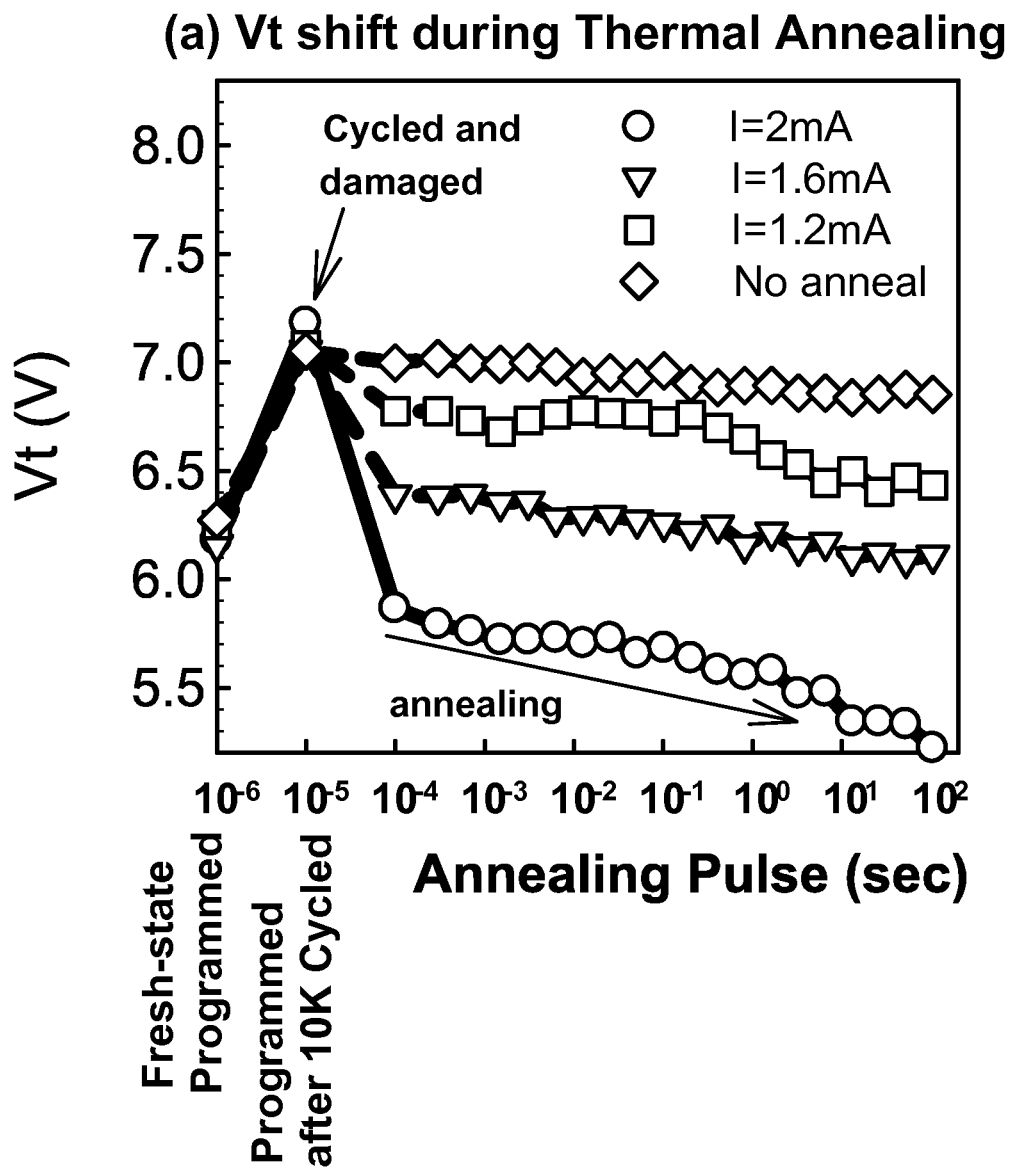
FIG. 31 is a plot of threshold voltage versus annealing pulse width showing experimental results of threshold voltage shift during thermal annealing.

FIG. 31 is a plot of threshold voltage versus annealing pulse width showing experimental results of threshold voltage shift during thermal annealing. The threshold voltage before any program/erase cycling is about 6.2V. Without any annealing, and after 10,000 PE cycles, the programmed threshold voltage shifts to about 7.0V. With annealing currents of 1.2 mA, 1.6 mA, and 2 mA, with a millisecond or less of anneal current, the threshold voltage shifts to about 6.7V, 6.4, and 5.7V, respectively. Accordingly, the experiments demonstrate that the pulse annealing provided by the word line heater can offer very fast threshold voltage recovery time within one millisecond of annealing pulse width when the word line current is 1.6 mA or 2 mA.

Figure 32:
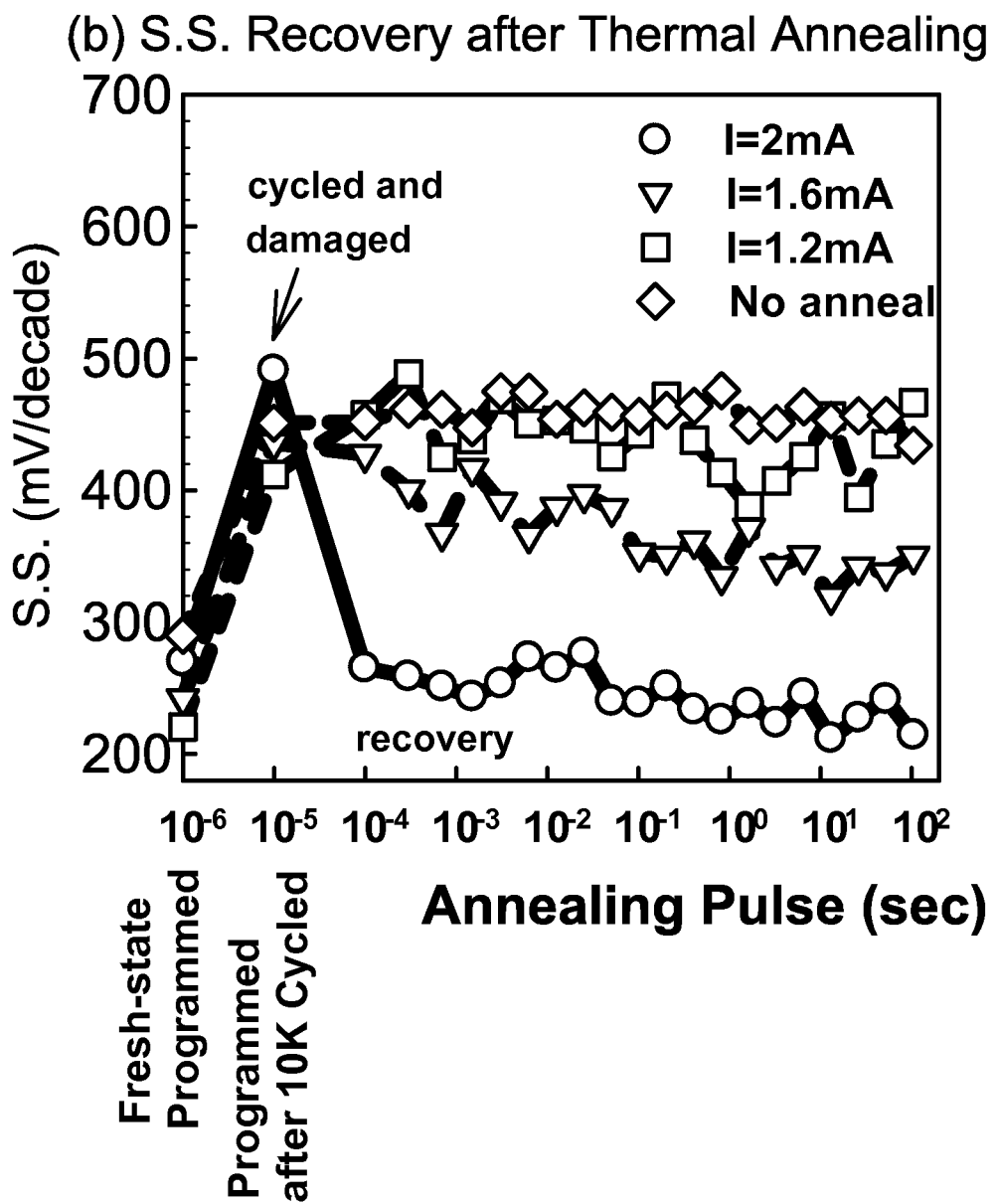
FIG. 32 is a plot of subthreshold slope versus annealing pulse width showing experimental results of subthreshold recovery after thermal annealing.

FIG. 32 is a plot of subthreshold slope versus annealing pulse width showing experimental results of subthreshold recovery after thermal annealing. Corresponding to the experimental results of threshold voltage shift described above, post PE cycled devices exhibit fast subthreshold slope (SS) recovery. Before any program/erase cycling, the memory devices under test exhibit SS approximately between 220 mV/decade and 280 mV/decade. After 10,000 program/erase cycles, without any annealing, the memory cells under test exhibit SS approximately between 410 mV/decade and 490 mV/decade. With annealing currents of 1.2 mA, 1.6 mA, and 2 mA, within a few milliseconds, the memory cells under test exhibit SS of approximately 430 mV/decade, 360 mV/decade, and 250 mV/decade, respectively. Accordingly, the experiments demonstrate that the pulse annealing provided by the word line heater can offer fast subthreshold slope recovery time with a millisecond annealing pulse width and word line current is on the order of 2 mA.

Figure 33:
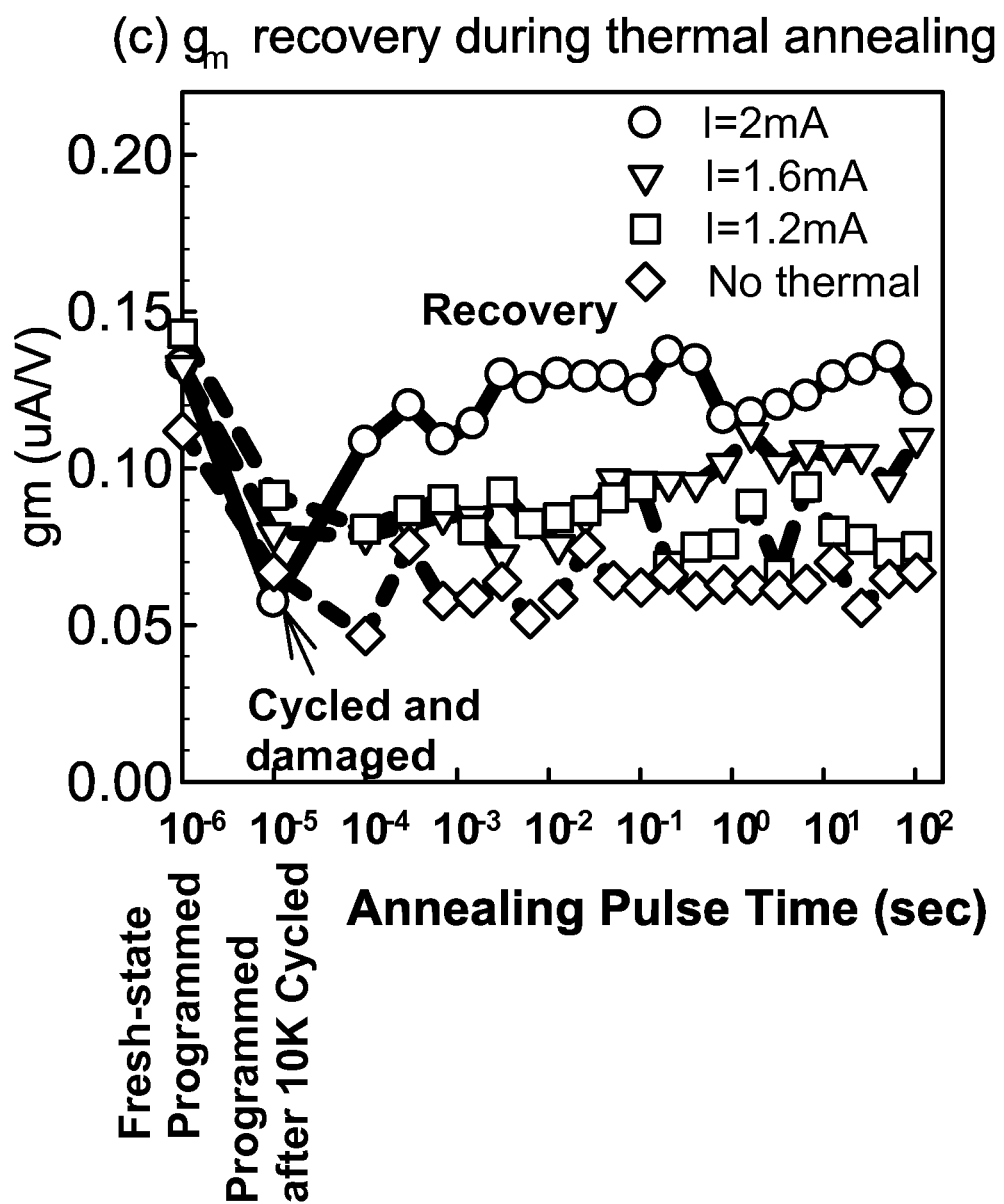
FIG. 33 is a plot of transconductance versus annealing pulse width showing experimental results of transconductance recovery during thermal annealing.

FIG. 33 is a plot of transconductance versus annealing pulse width showing experimental results of transconductance recovery during thermal annealing. Corresponding to the experimental results of threshold voltage shift and subthreshold slope recovery described above, post program/erase cycled devices exhibit fast transconductance ($g_m$) recovery. Before any program/erase cycling, the memory devices under test exhibit $g_m$ approximately between 0.11 μA/V and 0.14 μA/decade. After 10,000 program/erase cycles, without any annealing, the memory devices under test exhibit $g_m$ approximately between 0.4 μA/V and 0.9 μA/V. With annealing currents of 1.2 mA, 1.6 mA, and 2 mA, within a millisecond or so, the memory cells under test exhibit $g_m$ approximately of 0.85 μA/V, 0.8 μA/V, and 1.1 μA/V, respectively. Accordingly, the experiments demonstrate that the pulse annealing provided by the word line heater can offer fast transconductance recovery time.

A 10-million-cycle program/erase cycling endurance test has been carried out to test the endurance improvement made by the present technology. The test applies a thermal annealing after every 10,000 program/erase cycles for up to 10,000,000 program/erase cycles. The program/erase cycling was done in a dumb-mode with a one-shot program operation at +19V for 10 μsec and a one-shot erase operation at −13V for 10 msec. A thermal annealing pulse of 100 msec with a 2 mA gate current flow by voltage drop across the gate is applied after every 10,000 program/erase cycling. Results of the endurance test are explained below.

Figure 34:
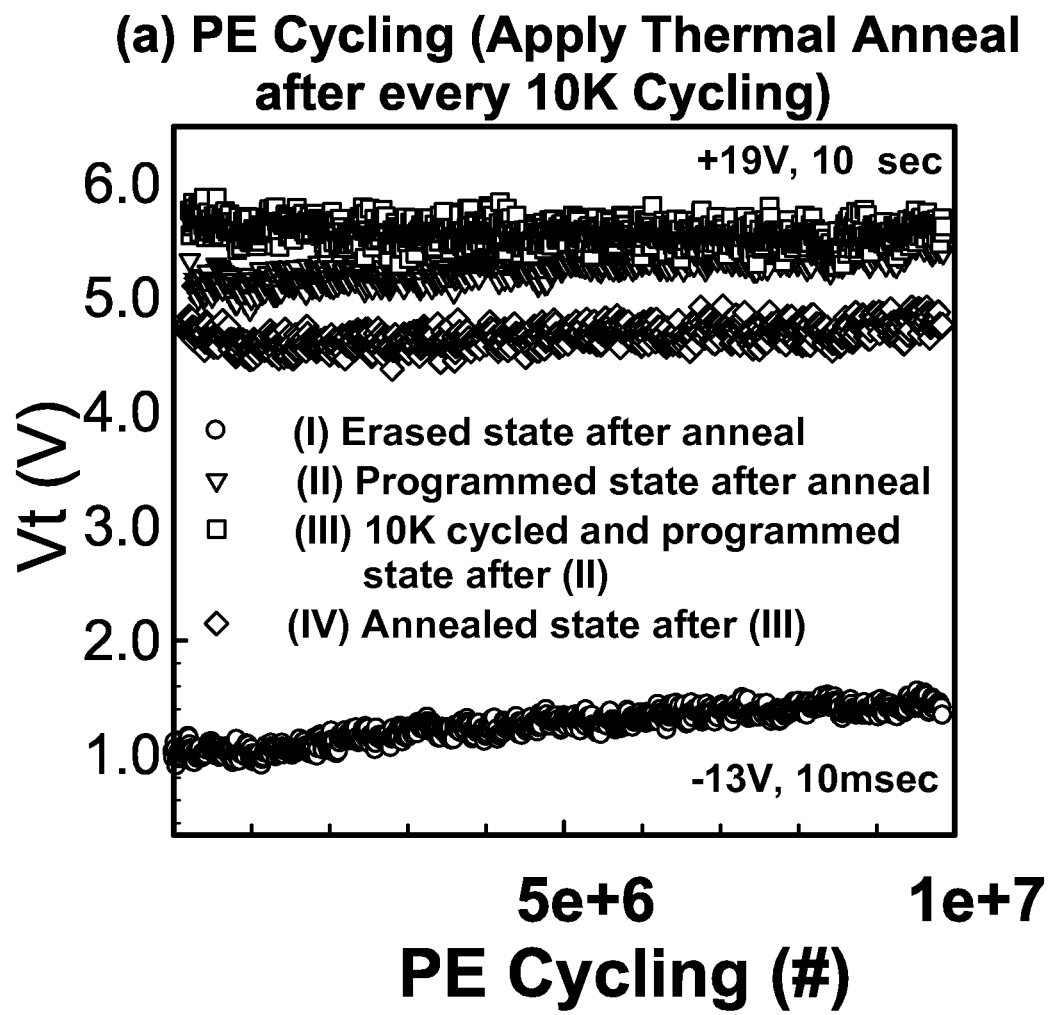
FIG. 34 is a plot of threshold voltage versus program/erase cycle count showing experimental results of thermal annealing.

FIG. 34 is a plot of threshold voltage versus program/erase cycle count showing experimental results of thermal annealing. Results of the endurance test show that the threshold voltage in the programmed state after each 10,000 program/erase cycle drifts up by about 1V due to device degradation. After the thermal annealing pulse is applied, the threshold voltage in the program state drops due to annealing and charge loss.

Figure 35:
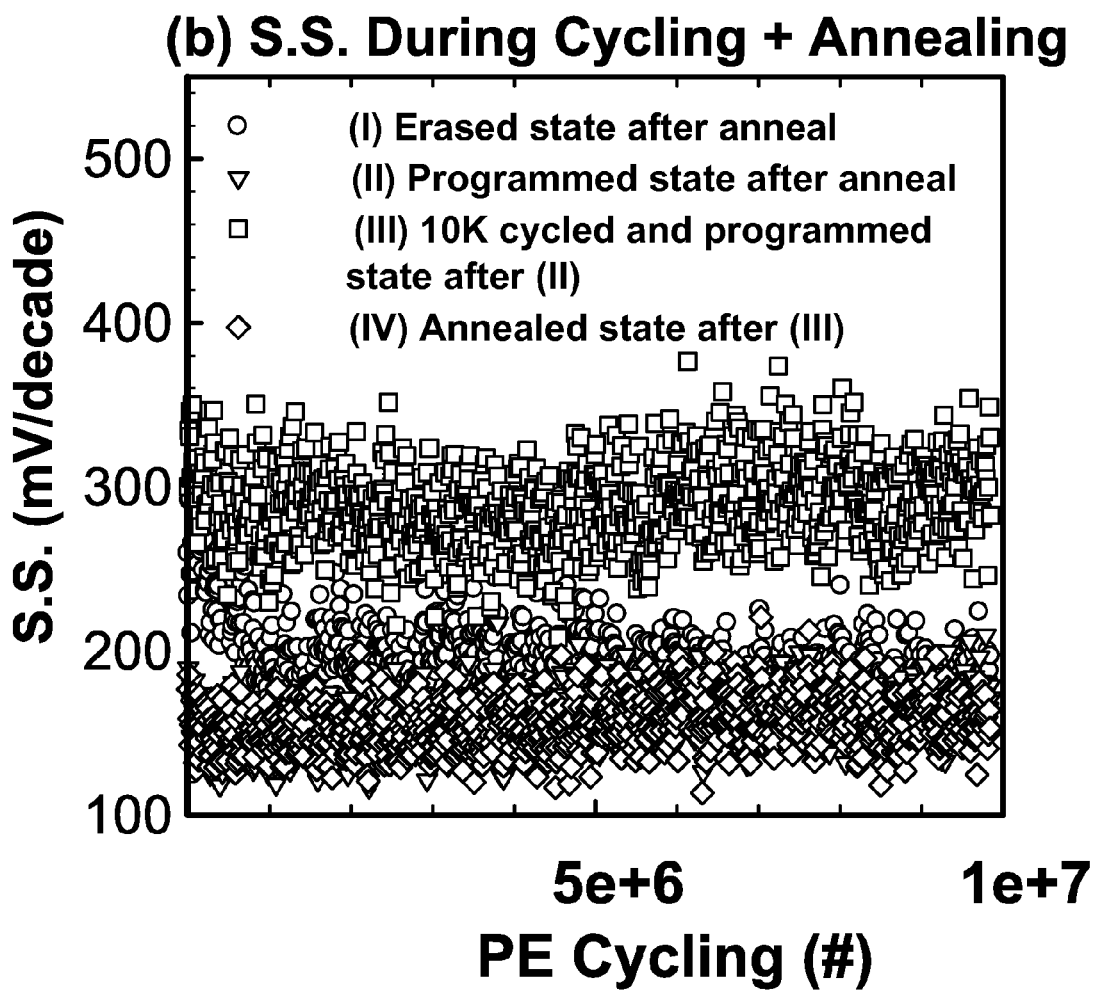
FIG. 35 is a plot of subthreshold slope versus program/erase cycle count showing experimental results of thermal annealing.

FIG. 35 is a plot of subthreshold slope versus program/erase cycle count showing experimental results of thermal annealing. Results of the endurance test show that the subthreshold slope is fully recovered to under 200 mV/decade after thermal annealing.

Figure 36:
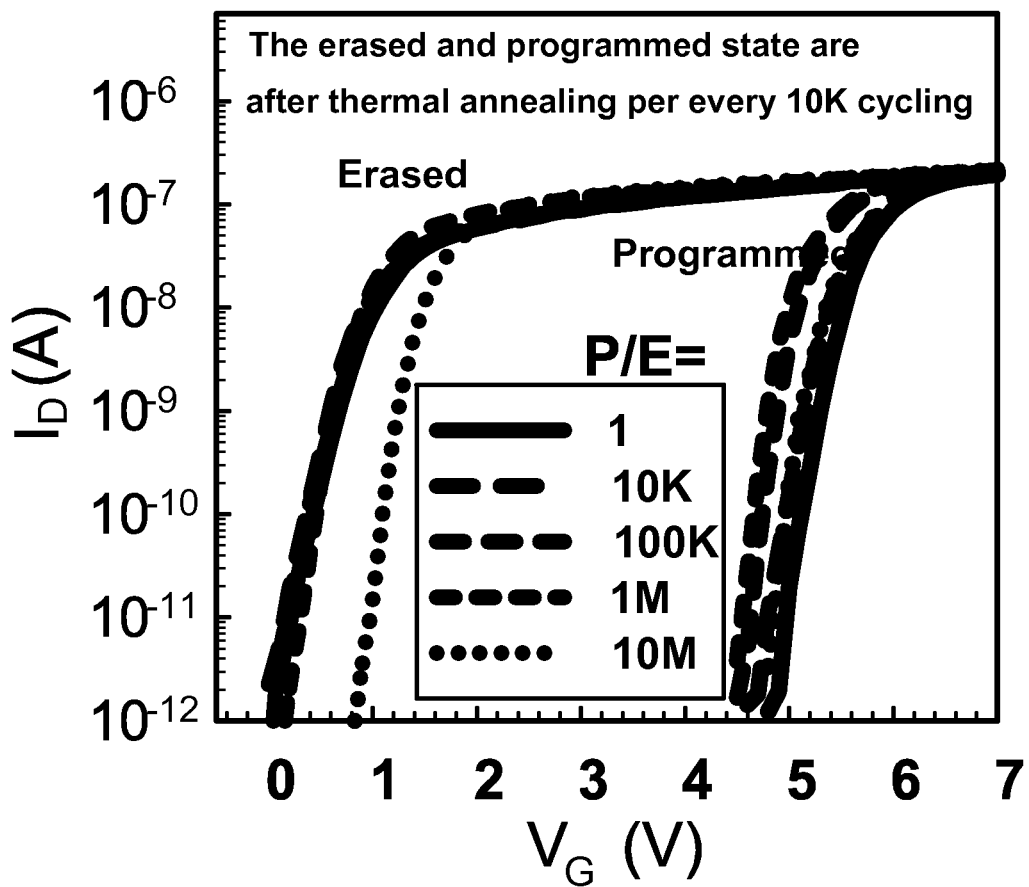
FIG. 36 is a plot of drain current versus control gate voltage showing experimental results of IV curve during program/erase cycling while applying thermal anneal.

FIG. 36 is a plot of drain current versus control gate voltage showing experimental results of IV curve during program/erase cycling while applying thermal anneal. Results of the endurance test show that the corresponding IV curves (drain current versus control gate) for programmed and erased states exhibit no degradation after 10-million program/erase cycles with thermal annealing applied per 10,000 program/erase cycling.

Figure 37:
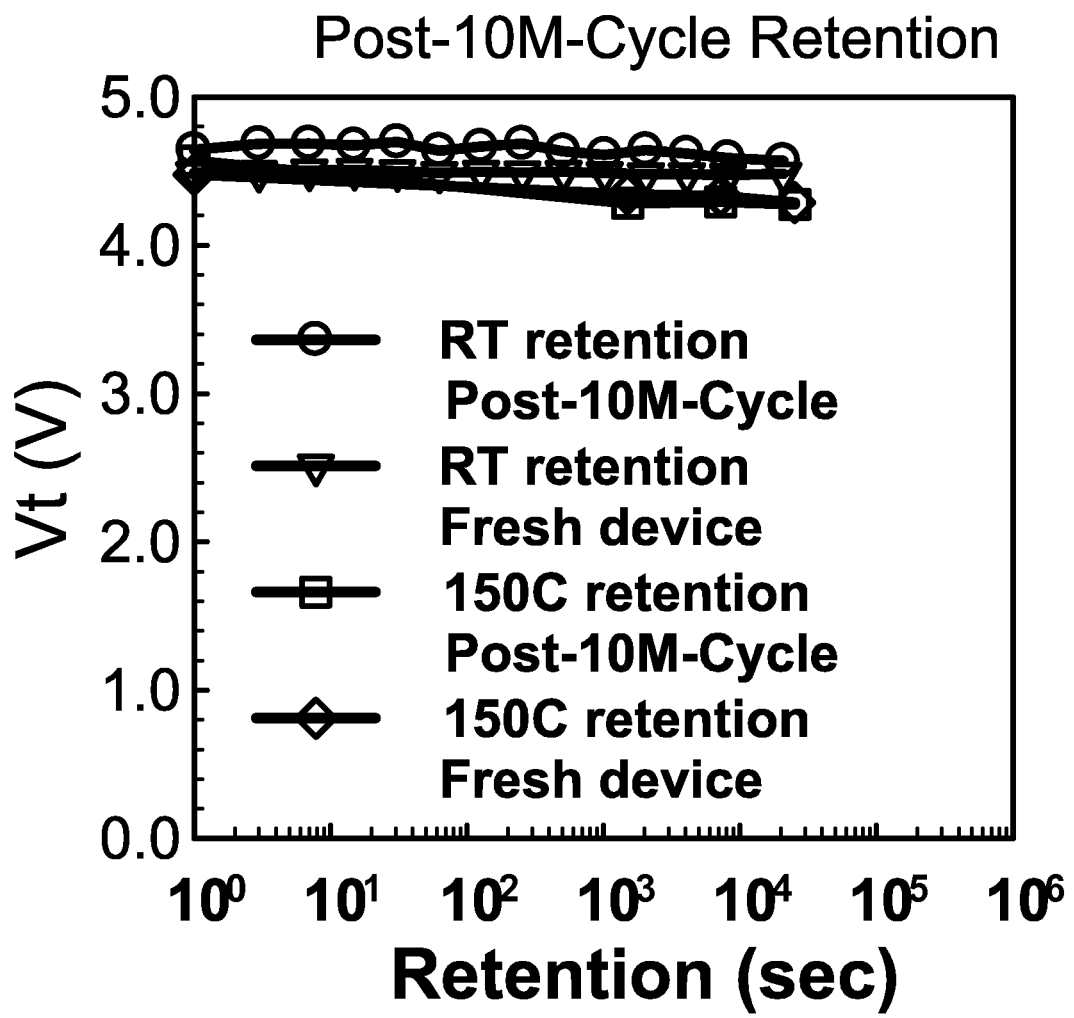
FIG. 37 is a plot of threshold voltage versus retention time showing experimental results of applying thermal anneal.

FIG. 37 is a plot of threshold voltage versus retention time showing experimental results of applying thermal anneal. Experiments are conducted on retention time at room temperature and at 150° C. on fresh memory devices without any program/erase cycling and on memory devices with more than 10 million cycles. A thermal annealing pulse of 2 mA/10 sec has been applied to the memory devices with more than 10 million program/erase cycles. The memory devices with more than 10 million cycles exhibit comparable retention time to the fresh memory devices at room temperature and at 150° C. while the threshold voltage drift of approximately 0.2V is also comparable to the fresh memory devices.

FIGS. 38-45 illustrate various types of flash memory cells to which local word line, global word line configurations, and other structures that allow thermal anneal technologies as described herein, can be applied.

Figure 38:
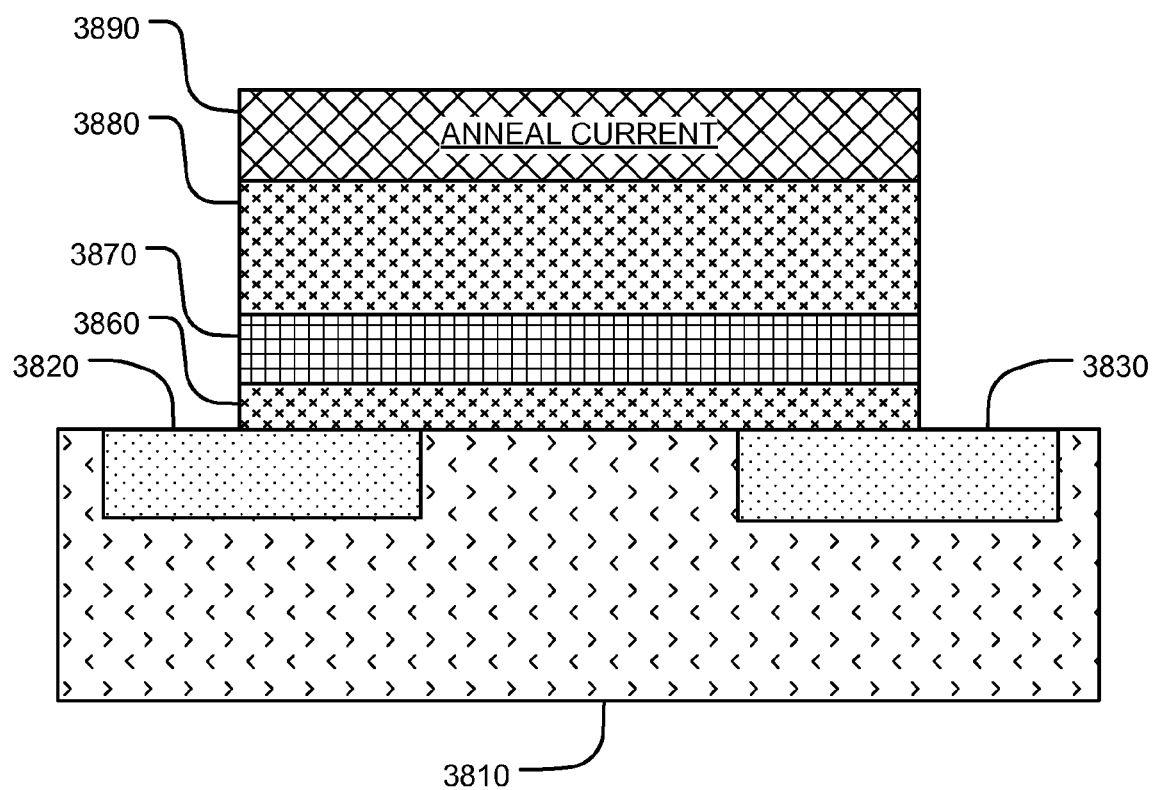
FIG. 38 is a cross-sectional view of a floating gate memory cell arranged for thermal anneal operations.

FIG. 38 is a cross-sectional view of a floating gate memory cell arranged for thermal anneal operations. The memory cell includes a substrate 3810. Source and drain regions 3820 and 3830 are formed in the substrate 3810. A tunnel oxide layer 3860 is formed over the substrate 3810, the source region 3820 and the drain region 3830. A floating gate 3870 is over the tunnel oxide layer 3860. An interpoly oxide layer is over the floating gate 3870. A control gate 3890 is formed on top of the interpoly oxide layer 3880.

For thermal anneal operations, the control gate 3890 may be coupled to a local word line which is coupled to a first global word line and a second global word line via a first switch and a second switch. In operation, both the first global word line and the second global word line can be decoded via the first and second switches to provide bias voltages to the local word line to induce current flow for thermal anneal. In other implementations, diode strapping implemented for example in the ways discussed below with respect to FIGS. 54-58 may be used for inducing thermal anneal. Also channel current may be utilized in some implementations to induce thermal anneal.

Figure 39:
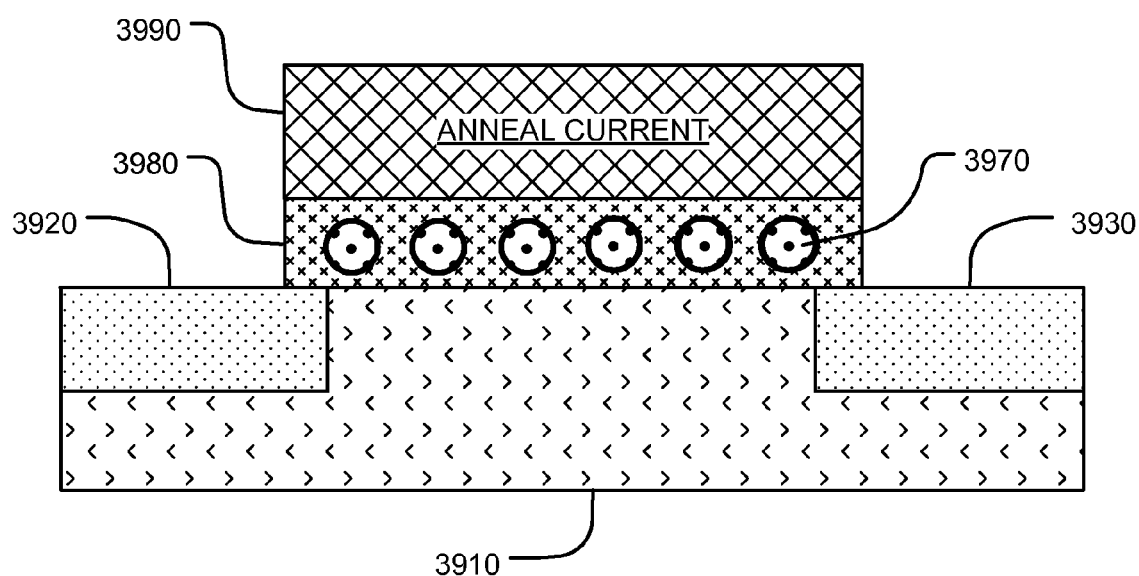
FIG. 39 is a cross-sectional view of a nano-crystal memory cell arranged for thermal anneal operations.

FIG. 39 is a cross-sectional view of a nano-crystal memory cell arranged for thermal anneal operations. The memory cell includes a substrate 3910. Source and drain regions 3920 and 3930 are formed in the substrate 3910. A gate oxide layer 3980 is formed over the substrate 3910, the source region 3920 and the drain region 3930. Nano-crystal particles 3970 are embedded within the gate oxide layer 3980. A control gate 3990 is formed on top of the gate oxide layer 3980.

For thermal anneal operations, the control gate 3990 may be coupled to a local word line which is coupled to a first global word line and a second global word line via a first switch and a second switch. In operation, both the first global word line and the second global word line can be decoded via the first switch and the second switch to provide bias voltages to the local word line to induce current flow for thermal anneal. In other implementations, diode strapping implemented for example in the ways discussed below with respect to FIGS. 54-58 may be used for inducing thermal anneal. Also channel current may be utilized in some implementations to induce thermal anneal.

Figure 40:
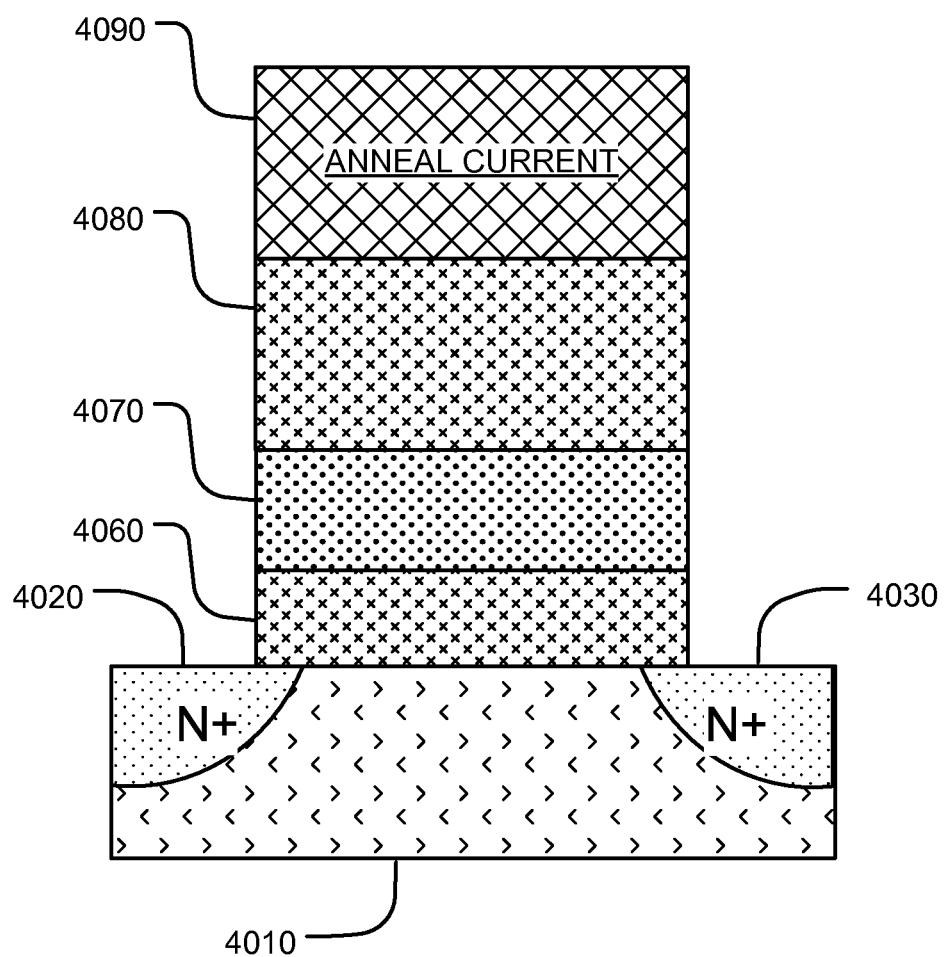
FIG. 40 is a cross-sectional view of a TANOS memory cell arranged for thermal anneal operations.

FIG. 40 is a cross-sectional view of a TANOS (TaN/Al$_2$O$_3$/SiN/SiO$_2$/Si) memory cell arranged for thermal anneal operations. The memory cell includes a substrate 4010. Source and drain regions 4020 and 4030 are formed in the substrate 4010. A tunneling dielectric layer 4060 including SiO$_2$ is formed over the substrate 4010, the source region 4020 and the drain region 4030. A trapping layer 4070 including SiN is formed over the tunneling dielectric layer 4060. A blocking oxide layer 4080 including Al$_2$O$_3$ is formed over the trapping layer 4070. A control gate 4090 is formed on top of the blocking oxide layer 4080.

For thermal anneal operations, the control gate 4090 may be coupled to a local word line which is coupled to a first global word line and a second global word line via a first switch and a second switch. In operation, both the first global word line and the second global word line can be decoded via the first and second switches to provide bias voltages to the local word line to induce current flow for thermal anneal. In other implementations, diode strapping implemented for example in the ways discussed below with respect to FIGS. 54-58 may be used for inducing thermal anneal. Also channel current may be utilized in some implementations to induce thermal anneal.

Figure 41:
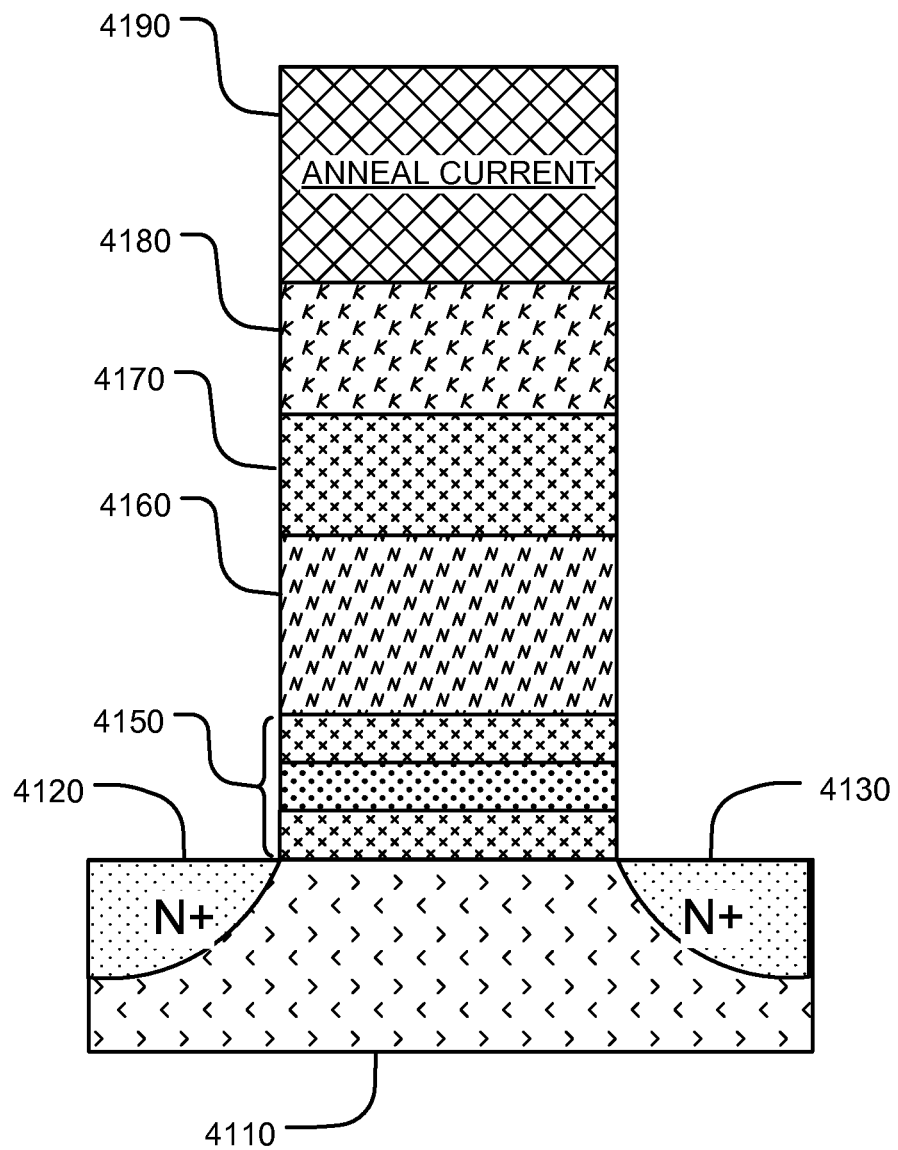
FIG. 41 is a cross-sectional view of a MA-BESONOS memory cell arranged for thermal anneal operations.

FIG. 41 is a cross-sectional view of a MA-BESONOS memory cell arranged for thermal anneal operations. The memory cell includes a substrate 4110. Source and drain regions 4120 and 4130 are formed in the substrate 4110. A bandgap engineered tunneling barrier 4150 including an ONO (oxide-nitride-oxide) tunneling structure is formed over the substrate 4110, the source region 4120 and the drain region 4130. A charge trapping dielectric layer 4160 including SiN (silicon nitride) is formed over the bandgap engineered tunneling barrier 4150. A top oxide layer 4170 is formed over the charge trapping dielectric layer 4160. A high dielectric constant capping layer 4180 is formed over the top oxide layer 4170. A control gate 4190 is formed on top of the high dielectric constant capping layer 4180. The control gate 4190 may be a metal gate or a polysilicon gate.

For thermal anneal operations, the control gate 4190 may be coupled to a local word line which is coupled to a first global word line and a second global word line via a first switch and a second switch. In operation, both the first global word line and the second global word line can be decoded via the first and second switches to provide bias voltages to the local word line to induce current flow for thermal anneal. In other implementations, diode strapping implemented for example in the ways discussed below with respect to FIGS. 54-58 may be used for inducing thermal anneal. Also channel current may be utilized in some implementations to induce thermal anneal.

Figure 42:
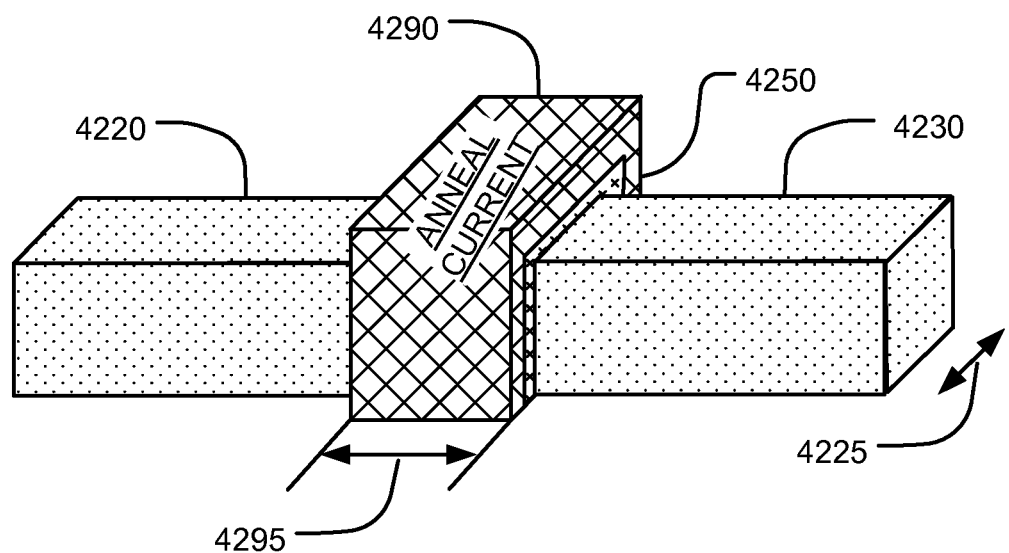
FIG. 42 is a cross-sectional view of a FinFET memory cell arranged for thermal anneal operations.

FIG. 42 is a cross-sectional view of a FinFET memory cell arranged for thermal anneal operations. The memory cell includes source and drain regions 4220 and 4230 formed on a substrate fin protruding from a substrate (not shown). The source and drain regions 4220 and 4230 have a width 4225. An ONO (oxide-nitride-oxide) stack 4250 is formed on the substrate fin. The ONO stack 4250 includes a bottom oxide layer over the substrate fin, a charge trapping layer (SiN) over the bottom oxide, and a top oxide layer over the charge trapping layer. A control gate 4290 is formed over on top of the ONO stack 4250. The control gate 4290 has a length 4295.

For thermal anneal operations, the control gate 4290 may be coupled to a local word line which is coupled to a first global word line and a second global word line via a first switch and a second switch. In operation, both the first global word line and the second global word line can be decoded via the first and second switches to provide bias voltages to the local word line to induce current flow for thermal anneal. In other implementations, diode strapping implemented for example in the ways discussed below with respect to FIGS. 54-58 may be used for inducing thermal anneal. Also, channel current may be utilized in some implementations to induce thermal anneal.

Figure 43:
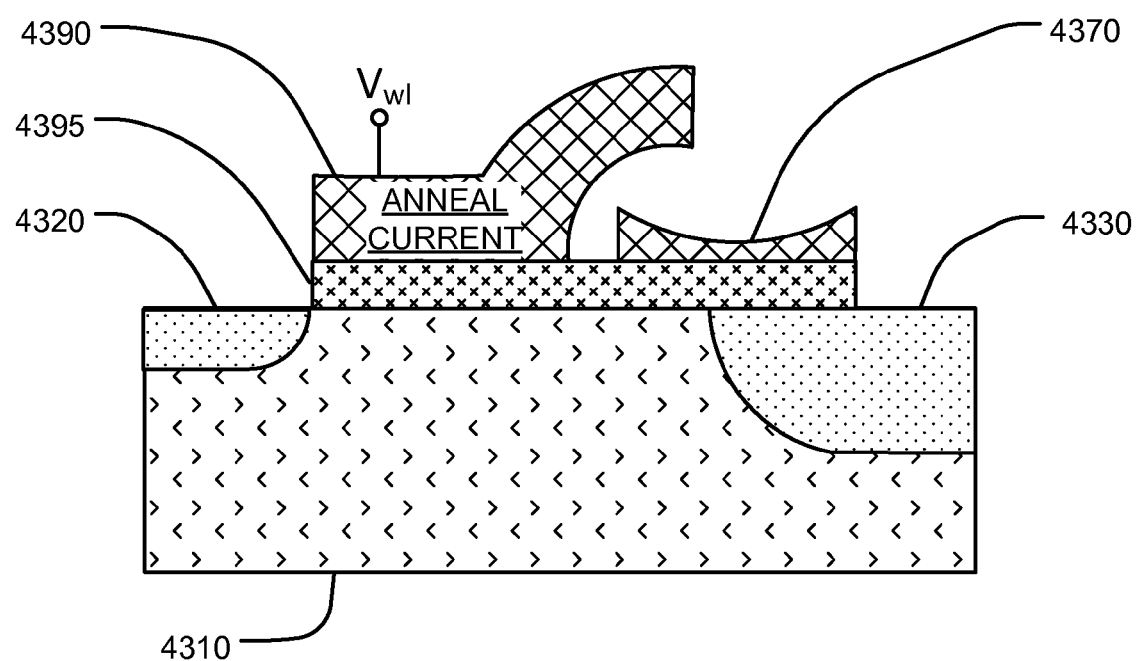
FIG. 43 is a cross-sectional view of a split-gate memory cell arranged for thermal anneal operations.

FIG. 43 is a cross-sectional view of a split-gate memory cell arranged for thermal anneal operations. The memory cell includes a substrate 4310. Source and drain regions 4320 and 4330 are formed in the substrate 4310. A tunnel oxide layer 4395 is formed over the substrate 4310. A gate 4390 is formed over the tunnel oxide layer 4395. A floating gate 4370 is also formed over the tunnel oxide layer 4395.

For thermal anneal operations, the gate 4390 may be coupled to a local word line which is coupled to a first global word line and a second global word line via a first switch and a second switch. In operation, both the first global word line and the second global word line can be decoded via the first and second switches to provide bias voltages to the local word line to induce current flow for thermal anneal. In other implementations, diode strapping implemented for example in the ways discussed below with respect to FIGS. 54-58 may be used for inducing thermal anneal. Also channel current may be utilized in some implementations to induce thermal anneal.

Figure 44:
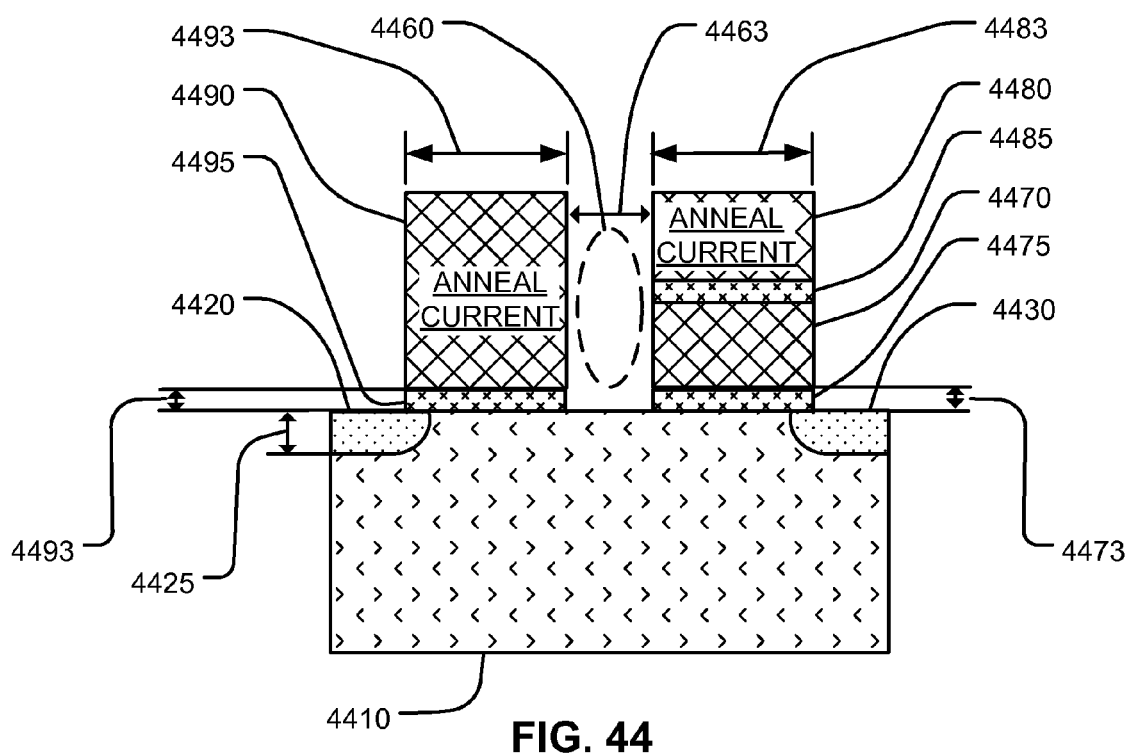
FIG. 44 is a cross-sectional view of another split-gate memory cell arranged for thermal anneal operations.

FIG. 44 is a cross-sectional view of another split-gate memory cell arranged for thermal anneal operations. The memory cell includes a substrate 4410. Source and drain regions 4420 and 4430 are formed in the substrate 4410. A first tunnel oxide layer 4495 is formed over the substrate 4410. An access gate 4490 is formed over the first tunnel oxide layer 4495. A second tunnel oxide layer 4475 is formed over the substrate 4410. A floating gate 4470 is formed over the second tunnel oxide layer 4475. A dielectric layer 4485 is formed over the floating gate 4470. A control gate 4480 is formed over the dielectric layer 4485. An isolation gap 4460 is structured to separate the access gate 4490 from the control gate 4480 and the floating gate 4470.

The access gate 4490 has a width 4493. The control gate 4480 has a width 4483. The isolation gap 4460 has a width 4463. The first tunnel oxide layer 4495 has thickness 4493. The second tunnel oxide layer 4475 has a thickness 4473. The source and drain regions 4420 and 4430 have a thickness 4425.

For thermal anneal operations, the access gate 4490 and/or the control gate 4480 may be coupled to a local word line which is coupled to a first global word line and a second global word line via a first switch and a second switch. In operation, both the first global word line and the second global word line can be decoded via the first and second switches to provide bias voltages to the local word line to induce current flow for thermal anneal. In other implementations, diode strapping implemented for example in the ways discussed below with respect to FIGS. 54-58 may be used for inducing thermal anneal. Also channel current may be utilized in some implementations to induce thermal anneal.

Figure 45:
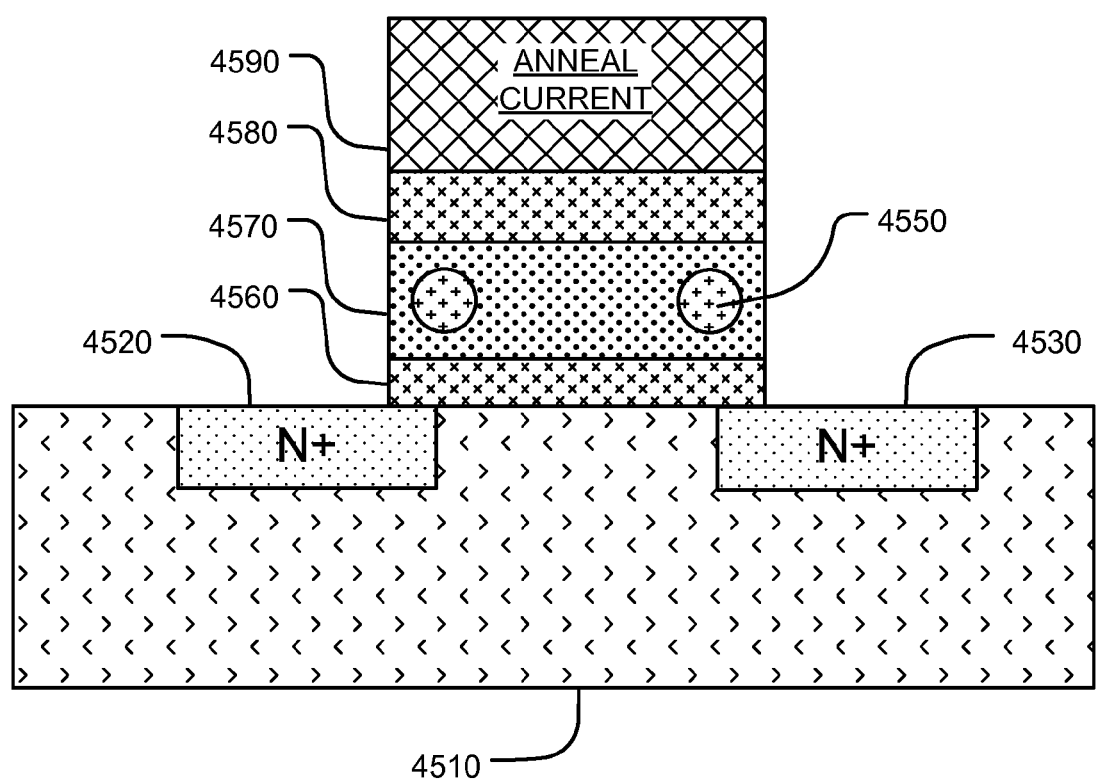
FIG. 45 is a cross-sectional view of a SONOS memory cell arranged for thermal anneal operations.

FIG. 45 is a cross-sectional view of a SONOS (silicon-oxide-nitride-oxide-silicon) memory cell arranged for thermal anneal operations. The memory cell includes a substrate 4510. Source and drain regions 4520 and 4530 are formed in the substrate 4510. A bottom oxide layer 4560 is formed over the substrate 4510, the source region 4520 and the drain region 4530. A charge trapping layer 4570 is over the bottom oxide layer 4560. The charge trapping layer 4570 may include silicon nitride materials such as $Si_3N_4$. Bit lines 4550 are surrounded by the charge trapping layer 4570. A top oxide layer 4580 is over the charge trapping layer 4570. A gate 4590 is formed on top of the top oxide layer 4580.

For thermal anneal operations, the control gate 4590 may be coupled to a local word line which is coupled to a first global word line and a second global word line via a first switch and a second switch. In operation, both the first global word line and the second global word line can be decoded via the first and second switches to provide bias voltages to the local word line to induce current flow for thermal anneal. In other implementations, diode strapping implemented for example in the ways discussed below with respect to FIGS. 54-58 may be used for inducing thermal anneal. Also channel current may be utilized in some implementations to induce thermal anneal.

Figure 46:
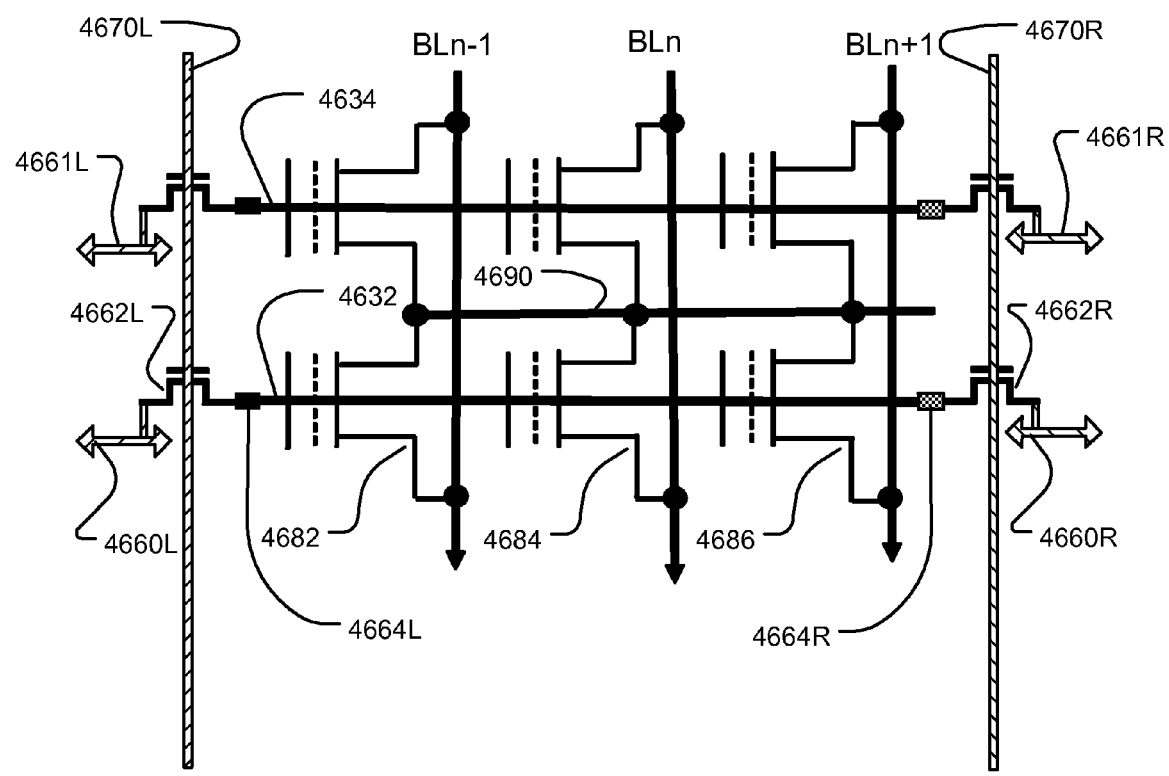
FIG. 46 is a simplified view of a section of a segmented word line NOR memory array, including first global word lines, second global word lines, and local word lines.

FIG. 46 is a simplified view of a section of a segmented word line NOR memory array, including first global word line pairs 4660L, 4660R, second global word line pairs 4661L, 4661R, local word lines 4632, and local word lines 4634. In this example, there is an array of flash memory cells, including cells 4682, 4684, 4686 along local word lines 4632, and corresponding cells along local word line 4634, arranged in a NOR configuration. In this illustration, there are only three cells on each local word line segment. However, as discussed above, each word line segment can be coupled to a large number of cells over the length of the segment determined according to the needs of the thermal annealing processes. A common source line 4690 is coupled to the source terminals of the cells, and to source line termination circuits (not shown) that perform as specified for the particular implementation of the array. Bit lines BLn−1, BLn and BLn+1 are coupled to the drain side of the cells in columns in the array, and to access circuitry design for the particular array.

The local word line 4632 has contact points 4664L on the left side, and 4664R on the right side. Similar termination points are formed on the local word line 4634. Switches that are comprised of transistors 4662L on the left side, and 4662R on the right side are coupled to the corresponding contact points 4664L on the left side, and 4664R on the right side, and coupled to the corresponding global word lines 4660L and 4660R. Control lines 4670L on the left side and 4670R on the right side are coupled to the gates of the transistors 4662L and 4662R in a sector of the array for controlling the application of current to the local word lines as discussed above. In another implementation, the contact points 4664L and 4664R are coupled via diodes to first and second conductors, for example in the ways discussed below with respect to FIGS. 54-58, by which current flow is induced in the local word line 4634.

Figure 47:
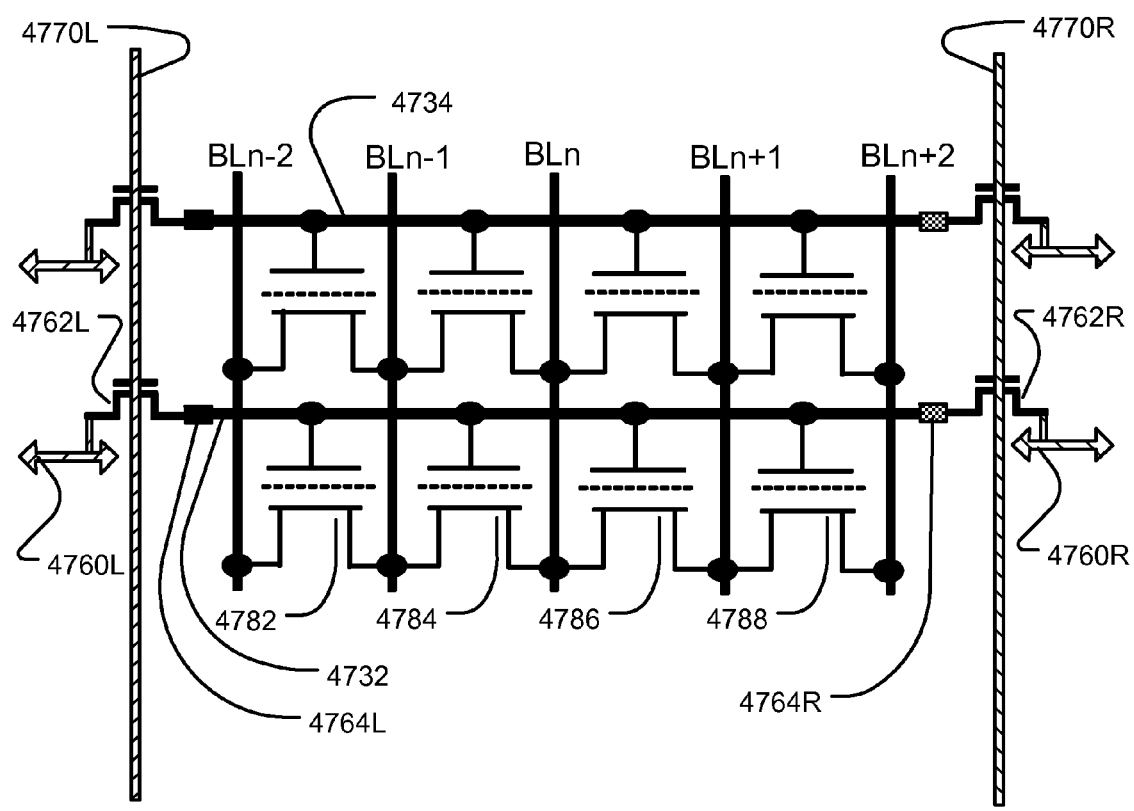
FIG. 47 is a simplified view of a section of a segmented word line virtual ground memory array, including first global word lines, second global word lines, and local word lines.

FIG. 47 is a simplified view of a section of a segmented word line virtual ground memory array, including first global word line pairs 4760L, 4760R, second global word line pairs (not labeled), local word lines 4732, and local word lines 4734. In this example, there is an array of flash memory cells, including cells 4782, 4784, 4786, 4788 along local word line 4732, and corresponding cells along local word line 4734, arranged in a virtual ground configuration. In this illustration, there are only four cells on each local word line segment. However, as discussed above, each word line segment can be coupled to a large number of cells over the length of the segment determined according to the needs of the thermal annealing processes. Bit lines BLn−2, BLn−1, BLn, BLn+1 and BLn+2 are coupled to the opposing sides of the cells in columns in the array, and to access circuitry designed for the particular array.

The local word line segment 4732 has contact points 4764L on the left side, and 4764R on the right side. Similar termination points are formed on the local word line 4734. Switches that are comprised of transistors 4762L on the left side, and 4762R on the right side are coupled to the corresponding contact points 4764L on the left side, and 4764R on the right side, and coupled to the corresponding global word lines 4760L and 4760R. Control lines 4770L on the left side and 4770R on the right side are coupled to the gates of the transistors 4762L and 4762R in a sector of the array for controlling the application of current to the local word lines as discussed above. In another implementation, the contact points 4764L and 4764R are coupled via diodes to first and second conductors, for example in the ways discussed below with respect to FIGS. 54-58, by which current flow is induced in the local word line 4734.

Figure 48:
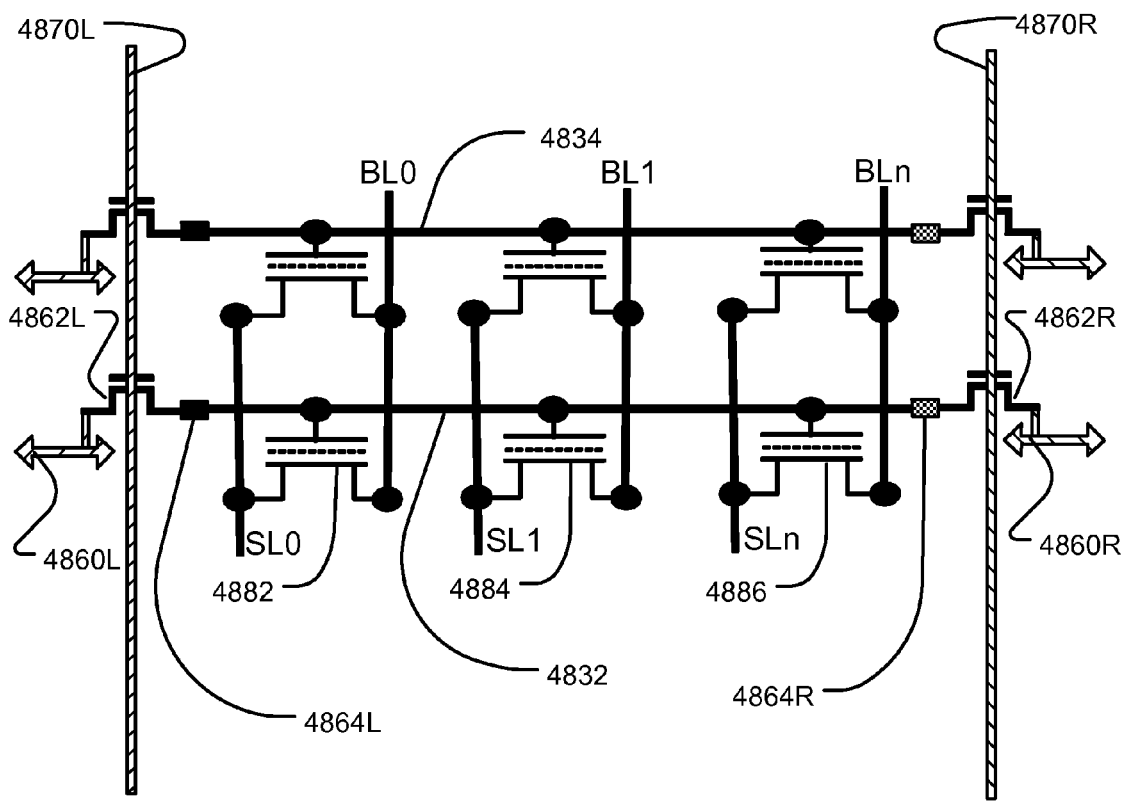
FIG. 48 is a simplified view of a section of a segmented word line AND memory array, including first global word lines, second global word lines, and local word lines.

FIG. 48 is a simplified view of a section of a segmented word line AND memory array, including first global word line pairs 4860L, 4860R, second global word line pairs (not labeled), and local word lines 4832 and 4834. In this example, there is an array of flash memory cells, including cells 4882, 4884, 4886 along local word line segment 4832, and corresponding cells along local word line segment 4834, arranged in an AND array configuration. In this illustration, there are only three cells on each local word line segment. However, as discussed above, each word line segment can be coupled to a large number of cells over the length of the segment determined according to the needs of the thermal annealing processes. Bit lines BL0, BL1, . . . BLn and source lines SL0, SL1, . . . SLn are coupled to the opposing sides of the cells in columns in the array, and to access circuitry designed for the particular array.

The word line segment 4832 has contact points 4864L on the left side, and 4864R on the right side. Similar termination points are formed on the word line segment 4834. Switches that are comprised of transistor 4862L on the left side, and transistor 4862R on the right side are coupled to the corresponding contact points 4864L on the left side, and 4864R on the right side, and coupled to the corresponding global word line pairs 4860L and 4860R. Control lines 4870L on the left side and 4870R on the right side are coupled to the gates of the transistors 4862L and 4862R in a sector of the array for controlling the application of current to the local word lines as discussed above. In another implementation, the contact points 4864L and 4864R are coupled via diodes to first and second conductors, for example in the ways discussed below with respect to FIGS. 54-58, by which current flow is induced in the word line segment 4834.

Figure 49:
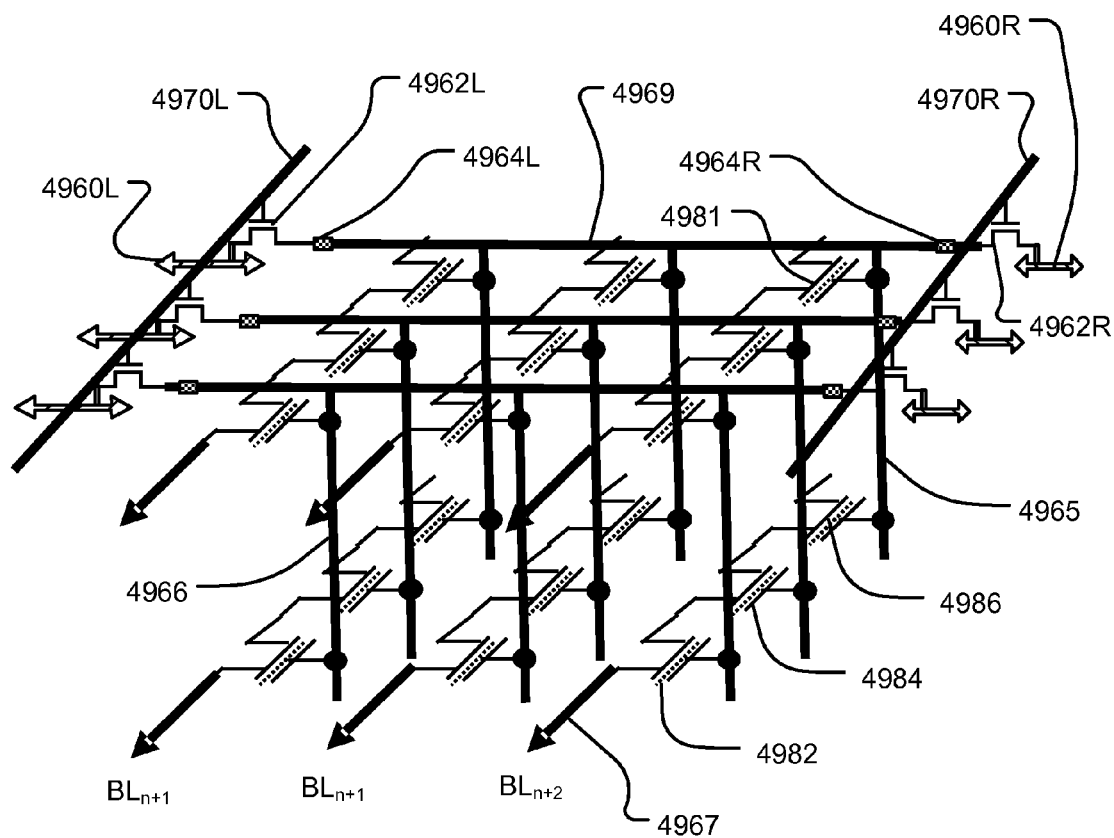
FIG. 49 is a simplified view of a section of a segmented word line 3D memory array using vertical gates, including first global word lines, second global word lines, and local word lines.

FIG. 49 is a simplified view of a section of a segmented word line 3D memory array using vertical gates, arranged for thermal anneal of the memory cells. Implementation of the array shown in FIG. 49 can be made as described in U.S. patent application Ser. No. 13/245,587, entitled Architecture for a 3D Memory Array, filed 26 Sep. 2011, which is incorporated by reference as if fully set forth herein. The 3D array includes a plurality of levels of memory cells, including the level including memory cell 4981 and the level including memory cells 4982, 4984, 4986. Each level includes a plurality of NAND strings that are coupled to corresponding bit lines in each level, such as the bit line 4967 in the level including the memory cells 4982, 4994, 4986. Overlying the stack of memory cell levels is a plurality of word line segments, including the word line segment 4969. The segments include vertical extensions, including the extensions 4965 and 4966, which couple to the gates of the memory cells in the various levels. Thus, the extension 4965 of the word line segment 4969 is coupled to the control gates of the memory cells 4981 and 4986 in the first and second levels respectively.

The word line segment 4969 has contact points 4964L on the left side, and 4964R on the right side. Similar termination points are formed on the other word line segments. Switches that are comprised of transistor 4962L on the left side, and transistor 4962R on the right side are coupled to the corresponding contact points 4864L on the left side, and 4864R on the right side, and coupled to the corresponding global word lines 4960L and 4960R. Control lines 4970L on the left side and 4970R on the right side are coupled to the gates of the transistors 4962L and 4962R in a sector of the array for controlling the application of current to the local word lines as discussed above. In another implementation, the contact points 4964L and 4964R are coupled via diodes to first and second conductors, for example in the ways discussed below with respect to FIGS. 54-58, by which current flow is induced in the word line segment 4969. It may be desirable to apply current to the bit lines in combination with the current to the word lines in this implementation, and to adjust the amount of current applied to the bit lines based on the level of the corresponding memory cells.

Figure 50:
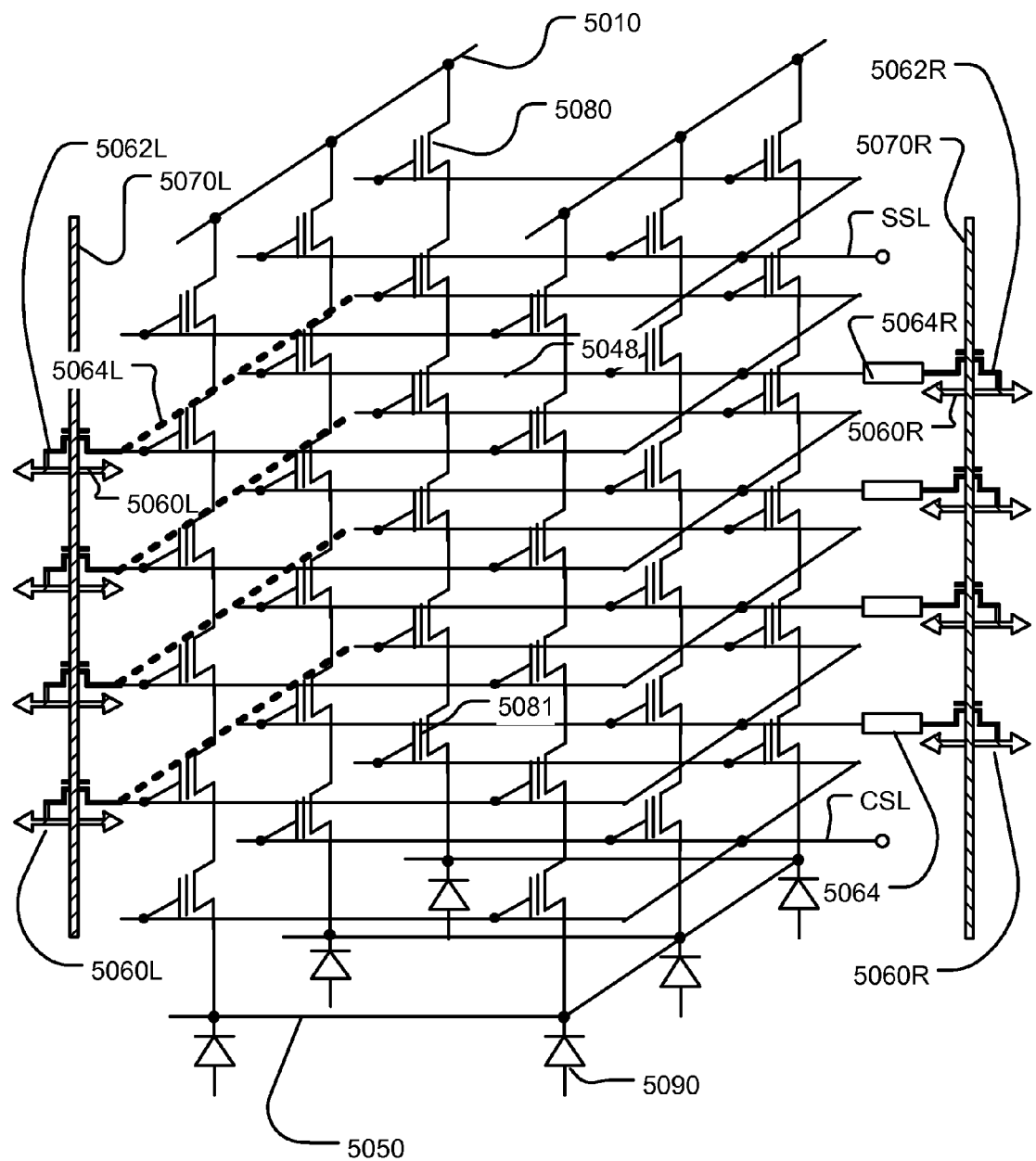
FIG. 50 is a simplified view of a section of a segmented word line 3D memory array using vertical bit lines, including first global word lines, second global word lines, and local word lines.

FIG. 50 illustrates a vertical NAND string 3D array that is arranged for thermal annealing. In the implementation shown in FIG. 50, there are a plurality of vertical NAND strings, including the string having a string select transistor 5080, along with string select transistors for a plurality of other NAND strings, coupled to a string select line SSL. Memory cells are arranged in series between the string select transistor (e.g. 5080), and a common source select transistor such as the common source transistor 5081 coupled to the same NAND string as string select transistor 5080. A common source line 5050 terminates the plurality of vertical NAND strings. Diodes, such as a diode 5090, can be used to isolate the common source line 5050 from the substrate. A plurality of bit lines, including a bit line 5010, are configured over the top of the array, and coupled to the corresponding vertical NAND strings using the string select transistors, and the common source select transistors. A plurality of word line structures, including a word line structure 5048 just beneath the string select transistor layer, are configured in corresponding levels of the array The word line structure 5048 has contact points 5064L on the left side which couples three prongs of the word line structure together, and 5064R on the right side. Similar termination points are formed on the other word line structures in the other levels. Switches that in the level including word line structure 5048, are comprised of transistor 5062L on the left side, and transistor 5062R on the right side are coupled to the corresponding contact points 5064L on the left side, and 5064R on the right side, and coupled to the corresponding global word lines 5060L and 50560R. Control lines 5070L on the left side and 5070R on the right side are coupled to the gates of the transistors 5062L and 5062R in a sector of the array for controlling the application of current to the local word lines as discussed above. In another implementation, the contact points 5064L and 5064R are coupled via diodes to first and second conductors, for example in the ways discussed below with respect to FIGS. 54-58, by which current flow is induced in a word line. It may be desirable to apply current to the bit lines in combination with the current to the word lines in this implementation, and to adjust the amount of current applied to the bit lines based on the level of the corresponding memory cells.

Figure 51:
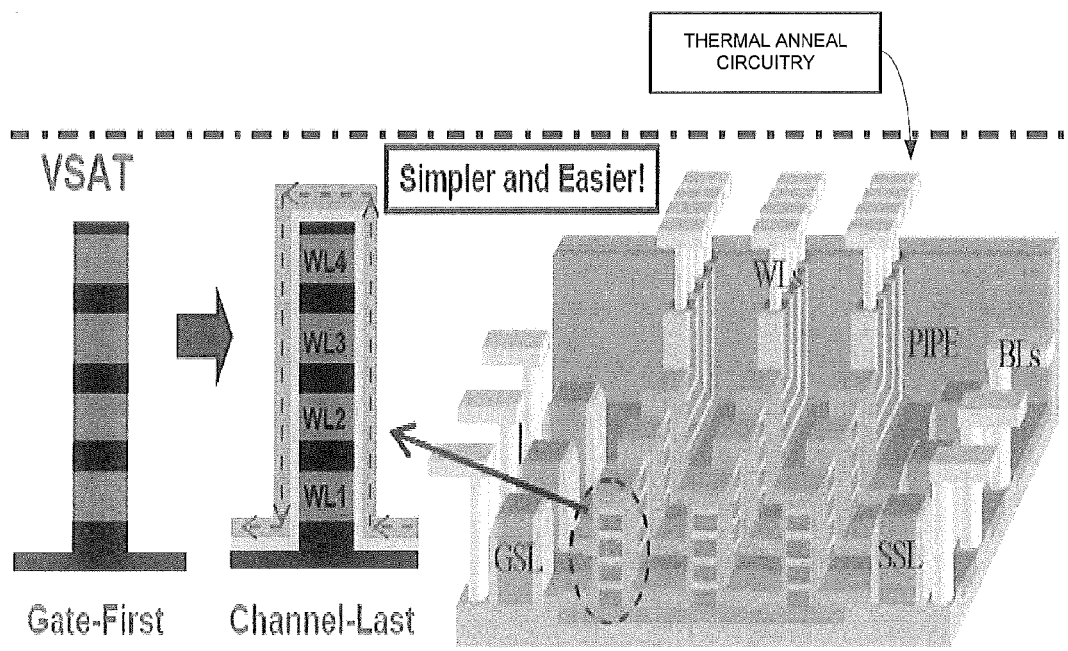
FIG. 51 is a simplified view of a section of a segmented word line 3D vertical-stacked-array-transistor (VSAT) memory array, arranged for thermal anneal.

FIG. 51 is a simplified view of a section of a segmented word line 3D vertical-stacked-array-transistor (VSAT) memory array modified for application of thermal anneal as described herein, based upon that described in Kim, et al., "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, pages 186-187, which article is incorporated by reference as if fully set forth herein. The structure of FIG. 51 can be implemented using a "gate-first and channel-last process," in which the gates are deposited over multilayer Si mesas, simultaneously forming the PIPE structure. Kim et al. states, "After creating a Si mesa by a dry-etching process, multiple layers of doped-polysilicon and nitride films are deposited on top. Doped-polysilicon and nitride films are used as gate electrodes and isolation material between the gates, respectively. The active region is defined after patterning the multiple layers, and a subsequent dry-etching process. All the gate electrodes are exposed on the same plane after a CMP process, allowing easy access to the gate electrodes. The tunneling-oxide, charge-trapping-nitride, and control oxide films are deposited in turn on the active region, followed by a polysilicon deposition process of the channel material. Finally, to isolate vertical strings, an etching process is carried out."

Thermal anneal biasing can be added, making contacts to the channel layer for example in this structure. Alternatively, the word lines can be segmented or diode strapped, to provide for anneal current.

Figure 52:
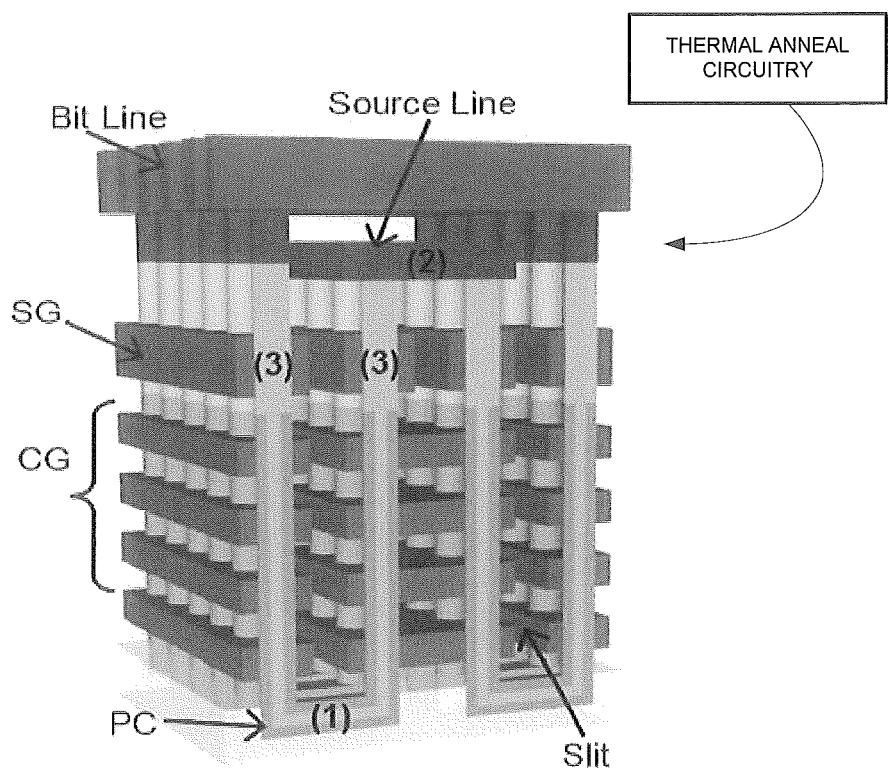
FIG. 52 is a simplified view of a section of a segmented word line 3D pipe-shaped bit cost scalable (P-BiCS) memory array, arranged for thermal anneal.

FIG. 52 is a simplified view of a section of a segmented word line 3D pipe-shaped bit cost scalable (P-BiCS) memory array, modified for application of thermal anneal as described herein, based upon that described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pages 136-137, which article is incorporated by reference as if fully set forth herein. The basic structure P-BiCS flash memory is shown in FIG. 52. As stated by Katsumata, et al., "Two adjacent NAND strings are connected at the bottoms by so-called pipe-connection (PC) which is gated by the bottom electrode. One of the terminals for the U-shaped pipe is connected to the bit line (BL), and the other is bound by the source line (SL). The SL consists of the meshed wiring of the third level metal and accessed by the first and the second level metal like a conventional planar technology, therefore the resistance of the SL is sufficiently low. Both of the SG transistors are placed below the SL and the BL. The control-gate (CG) is isolated by the slits and faces to each other as a couple of combs pattern. The memory films consist of a block film, a charge trap film and the oxide-based film as a tunnel film. The implementation of the oxide-based tunnel-film is because the sequential processing from the deposition of the tunnel film to the body silicon is applicable . . . . "

Thermal anneal biasing can be added, making contacts to the channel layer for example in this structure. Alternatively, the word lines can be segmented or diode strapped, to provide for anneal current.

Figure 53:
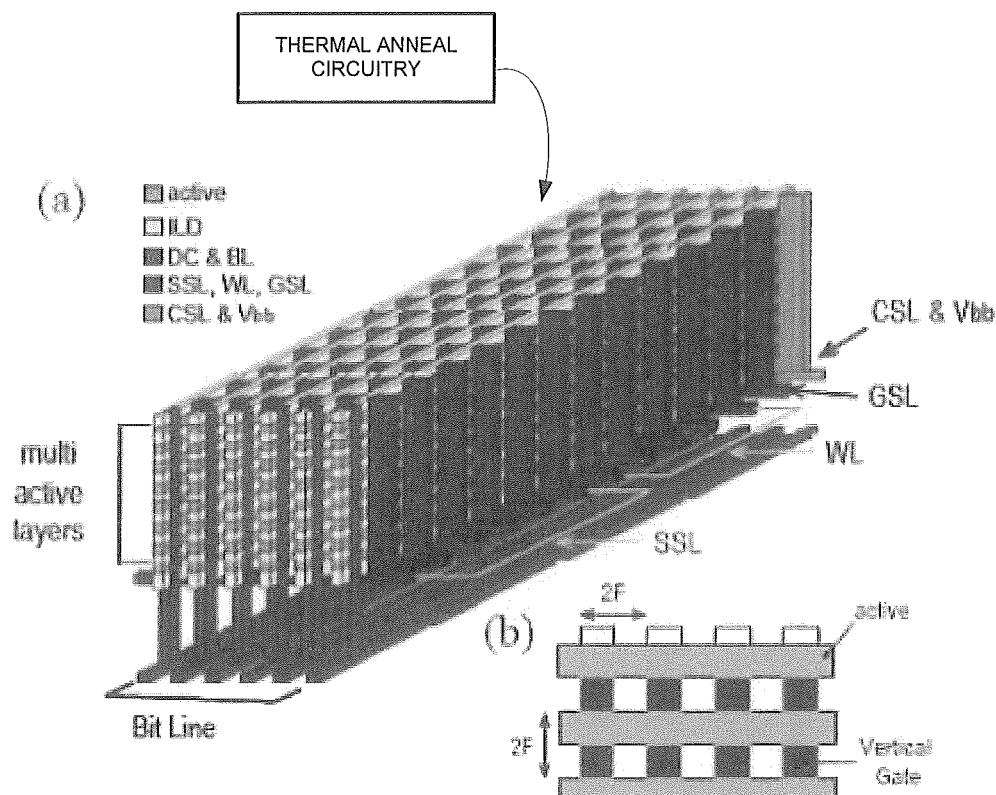
FIG. 53 is a simplified view of a section of an alternative segmented word line 3D memory array, arranged for thermal anneal.

FIG. 53 is a simplified view of a section of an alternative segmented word line 3D memory array modified for application of thermal anneal as described herein, based upon that described in Kim, et al., "Multi-Layered Vertical Gate NAND Flash Overcoming Stacking Limit for Terabit Density Storage," 2009 Symposium on VLSI Technology Digest of Technical Papers, pages 188-189, which article is incorporated by reference as if fully set forth herein. VG-NAND Flash includes word lines WL, bit lines BL, common source lines CSL, with a horizontal active string with pattern. Vertical gates VG for SSL, WL, GSL are used. Charge Trapping Layers are disposed between an active body and the vertical gate. Vertical Plugs apply DC to the source and active body (Vbb). The WLs and BLs are formed at the beginning of fabrication before making the cell array. Source and active body (Vbb) are electrically tied to CSL for enabling body erase operation. A positive bias is applied to CSL during erase. Each layer can be identical to a planar NAND flash except for SSL changes. Thermal anneal bias can be applied for example to the NAND strings using the bit lines or the word lines.

Figure 54:
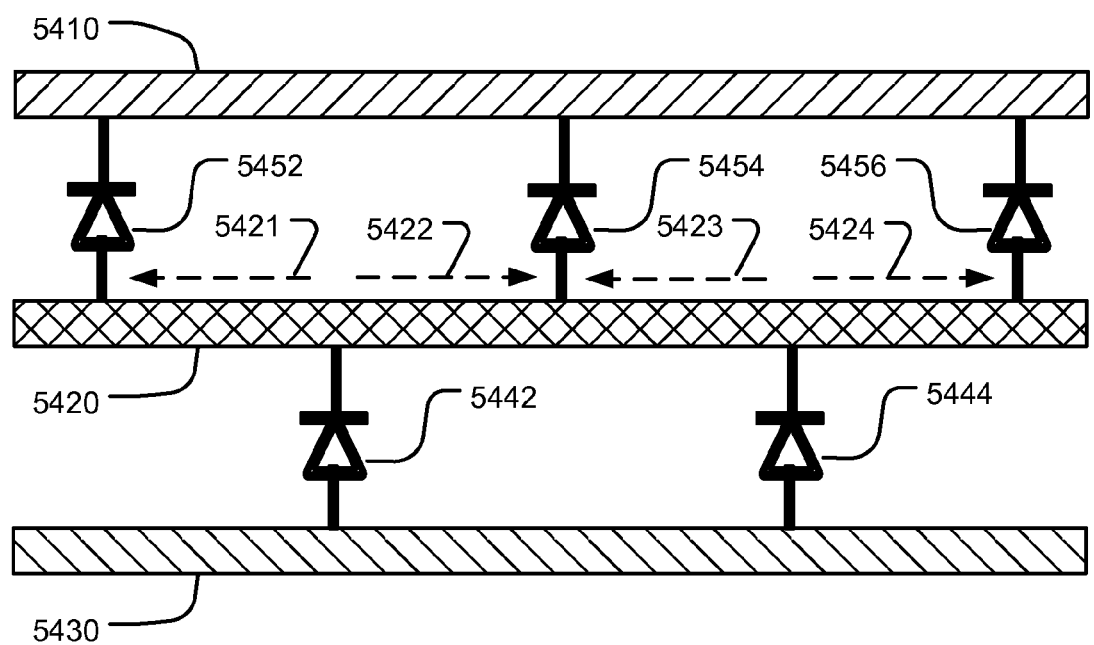
FIG. 54 is a simplified view of a local word line between first and second conductors with diode strapping.

FIG. 54 is a simplified view of a word line 5420 between first and second conductors 5430 and 5410, which act as two "heat plate" conductors, with diode strapping. The word line 5420 can be implemented using a metal structure (in this and in other implementations of the technology described herein), based on refractory or "high temperature" material like tungsten, which is suitable for the temperatures used for the anneal processes described herein. The diode strapping is implemented using a first plurality of diodes 5452, 5454, 5456 having their anodes coupled to the word line 5420 and their cathodes coupled to the first conductor 5410; and using a second plurality of diodes 5442, 5444, having their cathodes coupled to the word line 5420 and their anodes coupled to the second conductor 5430. The diodes can be implemented using P+/N− and N+/P− diodes in some implementations. Alternatively, the diodes can be implemented using Schottky diodes with metal/semiconductor interfaces. The distance between the locations in which the diodes contact the word lines can be selected according to the implementation of the memory array, so as to establish suitable heating efficiency. For example, a distance of about 150 microns between the locations of P+/N− and N+/P− diodes can be suitable for the reasons calculated above in connection with the physically segmented word line implementations. The actual spacing can be designed based on resistance of the structure used to deliver the bias voltages, the resistance of the word lines, and Joule heating efficiency for the particular memory structure to which the technology is applied.

In this arrangement, the diode strapping supports current flow from the second conductor 5430 through segments of the word line 5420, to the first conductor 5410, but blocks current flow in the reverse. The first plurality of diodes are coupled to the word line and a first plurality of spaced-apart locations along the word line, and the second plurality of diodes are coupled to the word line at a second plurality of spaced-apart locations along the word line that are interleaved with the locations in the first plurality of locations. Thus, when the second conductor 5430 is biased at a voltage sufficiently above the voltage of the first conductor 5410, current flows via the second plurality of diodes to spaced-apart locations along the word line 5420, current flows from these locations to the contact locations for the first plurality of diodes as illustrated by the arrows 5421, 5422, 5423, and 5424 in the figure. This implementation allows applying bias voltages that induce current for thermal anneal by electrically segmenting the word lines, and without requiring physical segmentation. Also, the layout area for diodes can be significantly lower than that required to implement the switch transistors described in other implementations set forth herein.

The first conductor 5410 and the second conductor 5430 can be implemented using a variety of configurations, including configurations in which each of the first and second conductors has a pitch similar to that of each word line, and configurations in which the first and second conductors are plates having widths substantially greater than an individual word line and each of which couple to a number of word lines.

Figure 55:
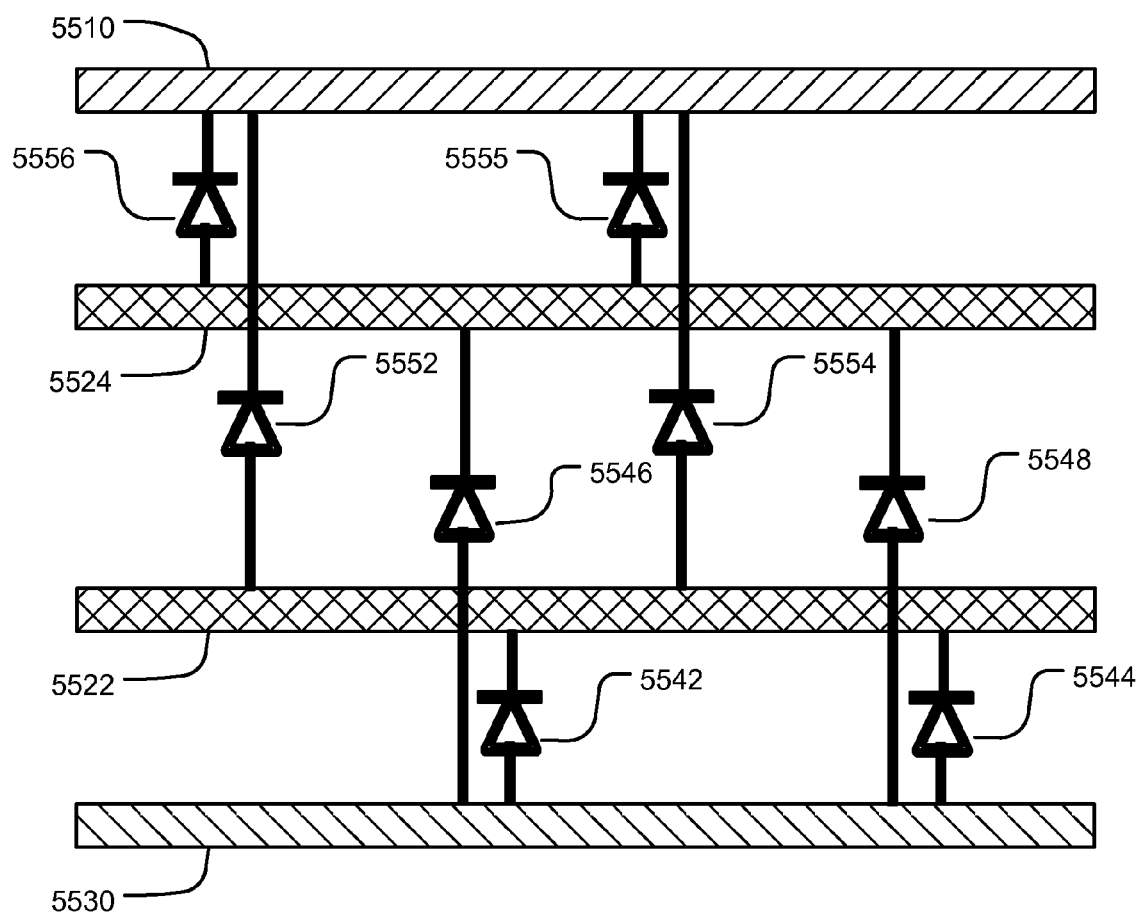
FIG. 55 is a simplified view of multiple local word lines between first and second conductors with diode strapping.

FIG. 55 is a simplified view of multiple local word lines between two "heat plate" conductors with diode strapping. In this example, a first conductor 5510 and a second conductor 5530 are used for biasing a first word line 5522 and a second word line 5524 using diode strapping. The diode strapping circuit for the particular word line 5524 includes a first plurality of diodes 5556 and 5555 having their cathodes coupled to the first conductor 5510 and having their anodes coupled to the word line 5524, and the second plurality of diodes 5546 and 5548 having their anodes coupled to the word line 5524 and their cathodes coupled to the second conductor 5530. The diode strapping circuit for the particular word line 5522 includes a first plurality of diodes 5552 and 5554 having their anodes coupled to the word line 5522 and their cathodes coupled to the first conductor 5510, and a second plurality of diodes 5542 and 5544 having their anodes coupled to the second conductor 5530 and their cathodes coupled to the word line 5522. Thus, FIG. 55 illustrates an implementation in which one pair of first and second conductors is utilized with diode strapping circuits for at least two word lines.

Figure 56:
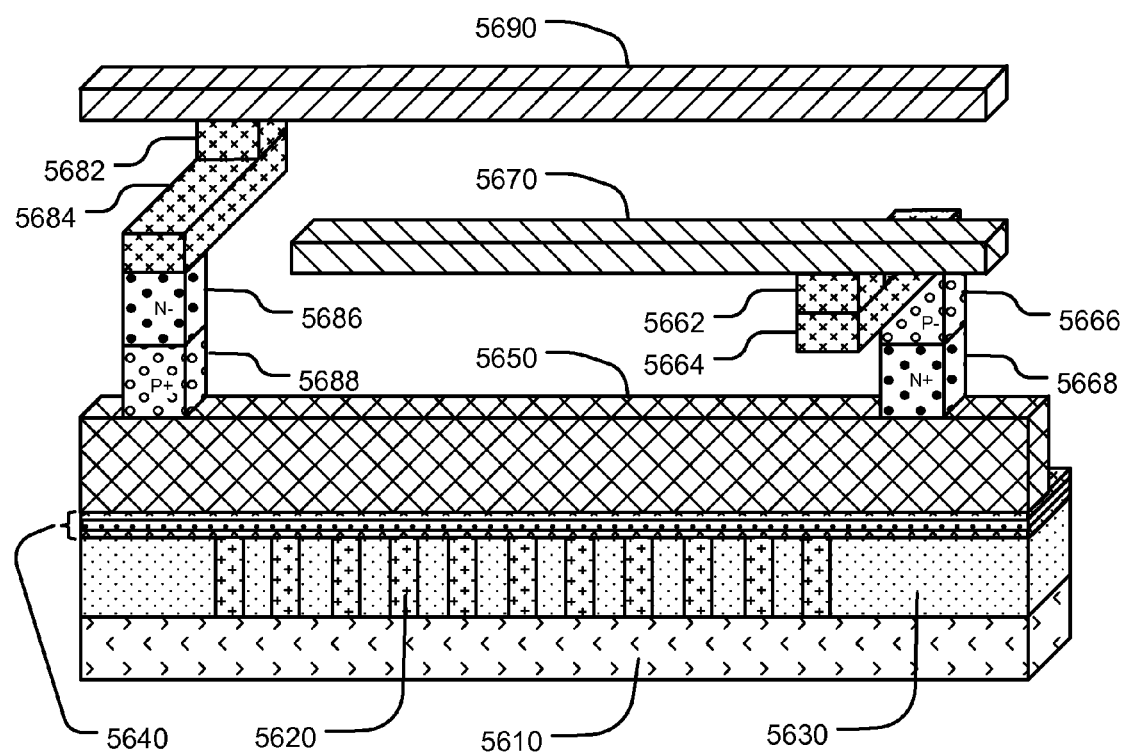
FIG. 56 is a 3D view of a local word line between first and second conductors with diode strapping.

FIG. 56 is a 3D view of one example of a structure for diode strapping a word line with two "heat plate" conductors. The structure includes a substrate 5610 on which an array of memory cells is formed. The substrate can comprise a semiconductor or an insulator as suits the needs for a particular implementation. The memory cells can include semiconductor bodies 5620 which extend into and out of the page within an insulating layer 5630 on the substrate 5610, and in which the memory cell channels are formed. A multilayer charge trapping structure 5640, having one of the structures described above, overlies the semiconductor body 5620. A word line 5650, preferably implemented using a metal or other conducting material which can be used to provide current flow at manageable bias levels, overlies the charge trapping structure 5640. In a patterned metal layer which overlies the memory array, a first conductor 5670 and a second conductor 5690 are implemented and act as the "heat plate" conductors for delivering current to segments of the word line using diode strapping.

As illustrated, in a first contact location on the word line, a P-N diode is formed including a P-type semiconductor element 5688 preferably having relatively high (P+) doping concentration, and in contact with the word line. The element 5688 acts as the anode of the diode. An N-type semiconductor element 5686 preferably having relatively low (N−) doping concentration, is formed on the P-type semiconductor element 5688, to form a diode. The element 5686 acts as the cathode of the diode. A crossbar conductor 5684 contacts the semiconductor element 5686 which facilitates connection of the diode to the conductor 5690 in an overlying layer. In this implementation, a plug 5682 which extends through an insulating layer (not shown) makes contact between the crossbar conductor 5684 and the "heat plate" conductor 5690.

Likewise, in a second contact location on the word line, an N-P diode is formed, including an N-type semiconductor element 5668 preferably having a relatively high (N+) doping concentration, and in contact with the word line. The element 5668 acts as the cathode of the diode. A P-type semiconductor element 5666, preferably having a relatively low (P−) doping concentration, is formed on the N-type semiconductor element 5668, to form a diode. The element 5666 act as the anode of the diode. A crossbar conductor 5664 contacts the semiconductor element 5666, which facilitates connection of the diode to the conductor 5670 in an overlying layer. In this implementation, a plug 5662 which extends through an insulating layer (not shown) can make contact between the plug 5662 and the "heat plate" conductor 5670.

As can be seen, the diodes in the diode strapping circuits can be coupled to the word lines and to the first and second conductors in a variety of circuit configurations, which can be selected according to the structure of the memory array. Also, each of the "heat plate" conductors can be used for biasing a plurality of word lines.

Figure 57:
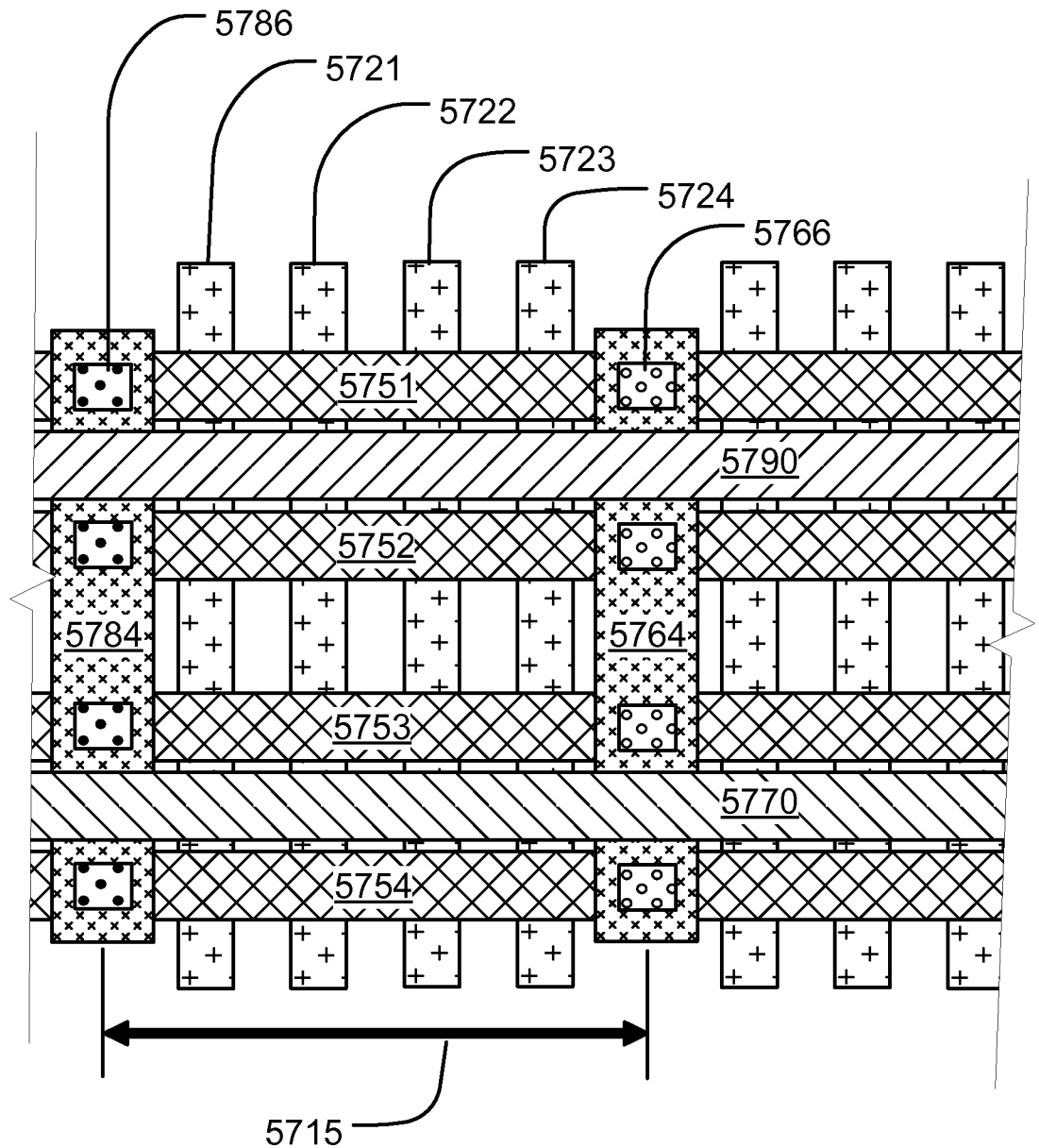
FIG. 57 is a layout schematic of multiple local word lines with diode strapping.

FIG. 57 is a layout view of a plurality of word lines with diode strapping that share a single pair of "heat plate" conductors, including the first conductor 5770 and the second conductor 5790. In this layout illustration, the structure is described from the lower layers towards the upper layers. In the lower illustrated layer, there are a plurality of semiconductor strips 5721, 5722, 5723, 5724 . . . in the semiconductor body (not shown) which can for example comprise the fins of a finFET type NAND string structure on a substrate (not shown). In the next layer, a plurality of word lines 5751, 5752,

5753, 5754 extend orthogonally across the strips 5721, 5722, 5723, 5724. In a layer over the word lines 5751, 5752, 5753, 5754, a first plurality of P-N diodes (e.g. diode 5786) and a second plurality of N-P diodes (e.g. diode 5766) are coupled at spaced-apart locations along the word lines. In a layer over the first and second pluralities of diodes, crossbar conductors 5784 and 5764 are implemented (cutouts on the crossbar conductors illustrate the locations of the underlying diodes). Finally, overlying the crossbar conductors 5784 and 5764, the first and second "heat plate" conductors 5790 in 5770 are implemented. The widths of the "heat plate" conductors can be substantially greater than those illustrated, limited only by the pitch of the plurality of word lines to which they are coupled.

Flash memory arrays, and other types of memory arrays, can require relatively high positive and negative voltages to be applied across the memory cells for programming and erase operations. This creates a situation in which neighboring word lines, including word lines that may be coupled via diode strapping to the same pair of "heat plate" conductors, can have substantially different bias voltages applied. Thus, the biasing of the "heat plate" conductors can be controlled to facilitate blocking of current flow during normal operation. In one implementation, the "heat plate" conductors are left in a floating or unconnected condition so that no current flow along the length of the conductors is allowed. In another implementation, the "heat plate" conductors can be biased at voltage levels that reverse bias the diode strapping diodes during operation.

FIG. 58 is a simplified view of multiple local word lines between two "heat plate" conductors with diode strapping, showing elimination of sneak paths during normal operation of the array. In FIG. 58, the structure described in FIG. 55 is reproduced having the same reference numerals. In addition, current paths 5800 and 5801 between the word line 5522 and the word line 5524 via the first conductor 5510 are illustrated for reference. Also, current paths 5802 and 5803 between the word line 5522 and the word line 5524 via the second conductor 5530 are illustrated for reference. In one example bias configuration that could occur during programming of a flash memory device, the word line 5524 could be applied about +20 volts for programming, while the unselected word line 5522 could be applied about +10 volts as a pass voltage level. These two word lines 5522 and 5524 are coupled via diode strapping to the same pair of conductors 5510 and 5530. However, the current paths 5800 and 5801 are blocked by the opposing diodes 5552 and 5556, and by opposing diodes 5554 and 5555, respectively. To accomplish this blocking effect, the first conductor 5510 can be applied a voltage greater than +20 volts, or in the alternative left floating. Also the current paths 5802 and 5803 are blocked by the opposing diodes 5542 and 5546, and by the opposing diodes 5544 and 5548. To accomplish this blocking effect, the second conductor 5530 can be applied a voltage lower than +10 volts, or in the alternative left floating.

Thus, during normal operation of the array, for reading, programming or erasing in flash memory, the heat plate conductors can be either floating by deselecting a heat plate driver, or biased to ensure reverse bias of the diodes. Preferably, the floating heat plate should be utilized. Capacitive coupling causes floating heat plate conductors to be boosted to voltage levels that do not interfere with a blocking action. The capacitive coupling between the word lines and the heat plate conductors should be small, because the diode capacitance at spaced-apart locations should be relatively small. Thus, the word line RC delay characteristics should not be affected significantly using diode strapping technologies.

Figure 59:
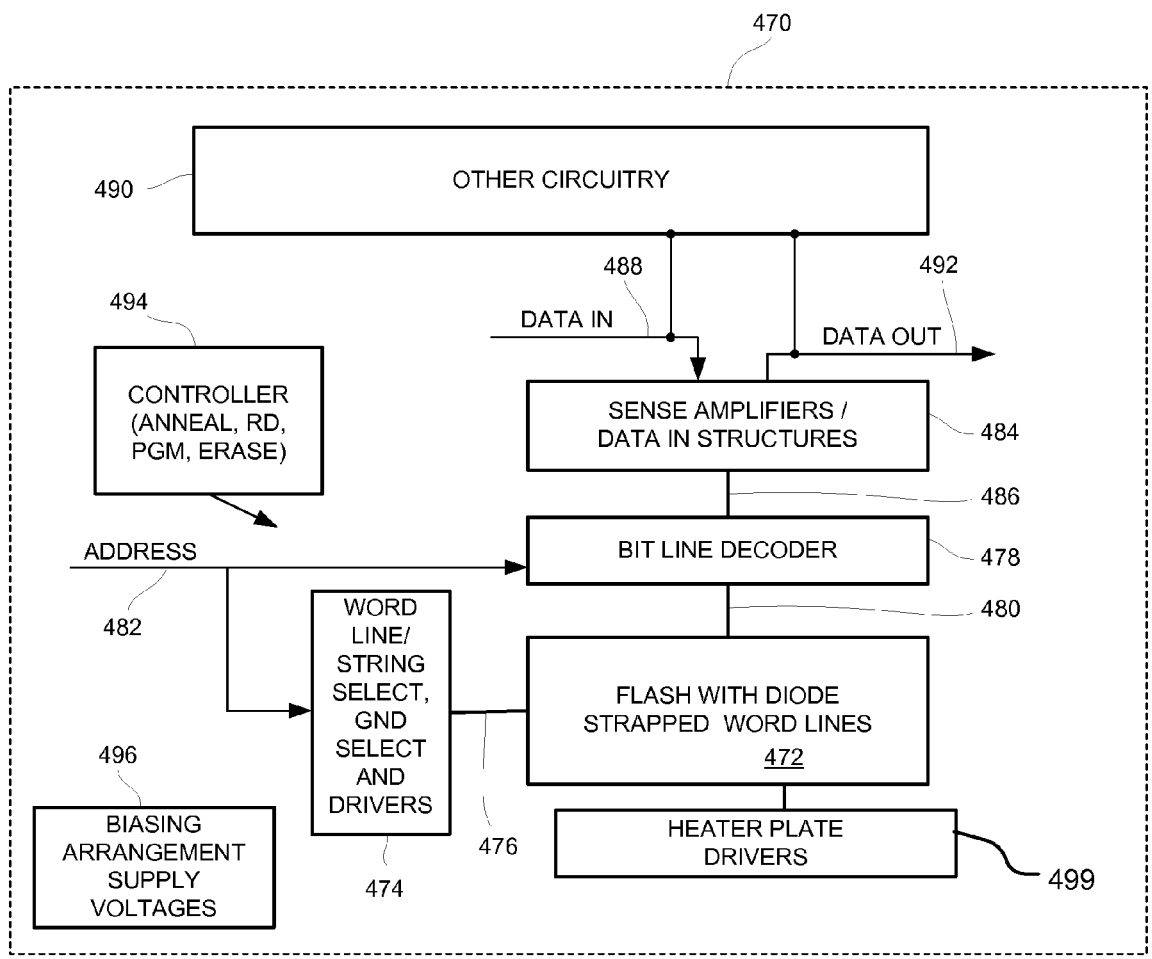
FIG. 59 is a block diagram of an integrated circuit memory, including a diode strapped word line, flash memory array arranged for thermal anneal operations.

FIG. 59 is a simplified block diagram of an integrated circuit employing thermal anneal for flash memory as described herein. The integrated circuit 470 includes a memory array 472 implemented using flash memory cells on an integrated circuit substrate, in which the word lines are diode strapped using a technique for example, like that described with reference to FIG. 54-58. A ground select and string select decoder 474 (including appropriate drivers) are coupled to, and in electrical communication with string select lines and ground select lines, arranged along rows in the memory array 472. Also, the decoder 474 includes word line drivers coupled to word lines 476. A bit line (column) decoder and drivers 478 is coupled to and in electrical communication with a plurality of bit lines 480 arranged along columns in the memory array 472 for reading data from, and writing data to, the memory cells in the memory array 472. Addresses are supplied on bus 482 to the word line decoder and string select decoder 474 and to the bit line decoder 478.

In the example, current flow on the word lines is used to induce heat for thermally annealing the dielectric charge trapping structures, and heater plate drivers 499 are included. The word line termination decoder 450 can be responsive to addresses and control signals that indicate or are produced during an operating mode for the device to selectively connect word lines to termination circuits, or to enable termination circuits coupled to selected word lines, as discussed above.

Sense amplifiers and data-in structures in block 484, including current sources for the read, program and erase modes, are coupled to the bit line decoder 478 via data bus 486. Data is supplied via the data-in line 488 from input/output ports on the integrated circuit 470 or from other data sources internal or external to the integrated circuit 470, to the data-in structures in block 484. Data is supplied via the data-out line 492 from the sense amplifiers in block 484 to input/output ports on the integrated circuit 470, or to other data destinations internal or external to the integrated circuit 470.

A controller 494 implemented in this example, using a bias arrangement state machine, controls the application of bias arrangement supply voltages and current sources 496, such as read, program, erase, erase verify, program verify voltages or currents for the word lines and bit lines, and controls the word line/source line operation using an access control process. The controller 494 includes logic used to enable thermal annealing, including to control the use of global word line pairs for applying the bias conditions to the local word lines for performing thermal anneal operations.

The controller 494 can be implemented using special purpose logic circuitry as known in the art. In alternative implementations, the controller 494 comprises a general purpose processor, which may be implemented on the same integrated circuit, which executes a computer program to control the operations of the device. In yet other implementations, a combination of special-purpose logic circuitry and a general-purpose processor may be utilized for implementation of the controller 494.

In the illustrated implementation, other circuitry 490 is included on the integrated circuit 470, such as a general purpose processor or special purpose application circuitry, or a combination of modules providing system-on-a-chip functionality supported by the memory cell array.

Also, in some implementations, the controller includes program/erase cycle counters, and registers for setting up parameters to be applied in the configuration of thermal anneal processes. The controller can execute the procedures described herein, with reference to FIGS. 9-11 and 28-30, along with other processes and mission function operations of read and write. In applying the process of FIG. 11 to the circuit of FIG. 59, the word line termination step is replaced with a step of applying biasing voltages to the word lines using the diode strapping circuits. In applying the processes of FIGS. 28-30 to the circuit of FIG. 59, the step of decoding the left and right global word lines is replaced with a step of biasing the first and second heater plates for selected sectors of the array. In applying the process of FIG. 30 to the circuit of FIG. 59, the step of terminating the word lines during block erase can also be omitted in some implementations.

A thermally assisted flash memory has been described. The technology is suitable for use with flash devices having NAND architectures, as well as devices using other architectures. Because of the increased endurance possible, flash memory can be used in register configurations as well. Heat can be generated for thermal annealing using resistive heating caused by current flow in the word lines for example, in a manner that it easily implemented in integrated circuit devices. By applying the thermal annealing operations, improved endurance and/or increased erase speeds can be achieved.

While the present technology is disclosed by reference to the preferred implementations and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory on an integrated circuit, comprising:
    a word line having an axis along which the word line is coupled to a plurality of memory cells;
    the plurality of memory cells, the plurality of memory cells in combination having a first length in a direction along the axis;
    a first conductor having a second length greater than the first length;
    a second conductor having a third length greater than the first length;
    a first plurality of diodes coupling the word line to the first conductor;
    a second plurality of diodes coupling the word line to the second conductor; and
    circuitry to induce current flow between first conductor and the second conductor, through the first plurality of diodes and the second plurality of diodes.

2. The memory of claim 1, wherein diodes in the first plurality of diodes have anodes coupled to the word line, and diode in the second plurality of diodes have cathodes coupled to the word line.

3. The memory of claim 1, wherein the word line comprises a metal conductor.

4. The memory of claim 1, wherein the word line is disposed in a first layer of the integrated circuit, and the first conductor and the second conductor are disposed in a second layer either above or below the first layer, and the first and second pluralities of diodes are vertical diodes between the first and second layers.

5. The memory of claim 1, including control circuitry to control the circuitry to apply bias voltages that induce said current flow to the first and second conductors after and coordinated with a block erase.

6. The memory of claim 1, including control circuitry to control the circuitry to apply bias voltages to the first and second conductors to induce said current flow interleaved in time among read, program and erase operations.

7. The memory of claim 1, including control circuitry to control the circuitry to apply bias voltages to the first and second diodes in which one of the bias voltages is a negative voltage.

8. The memory of claim 1, including control circuitry to maintain a count of program and erase cycles, program cycles or erase cycles, and when the count reaches a threshold, to cause the circuitry to apply bias voltages to the first and second conductors.

9. The memory of claim 1, wherein the memory cells comprise NAND memory cells.

10. The memory of claim 1, wherein the memory cells comprise semiconductor bodies on an insulating substrate.

11. The memory of claim 1, wherein the memory cells comprise floating gate flash memory cells.

12. The memory of claim 1, wherein the memory cells comprise flash memory cells having dielectric charge trapping structures including a tunneling layer, a charge trapping layer and a blocking layer, and wherein the tunneling layer includes a first layer of silicon oxide or silicon oxynitride less than 2 nm thick, a second layer of silicon nitride less than 3 nm thick, and a third layer comprising silicon oxide or silicon oxynitride less than 4 nm thick.

13. The memory of claim 1, wherein at least one diode of the first and second pluralities of diodes is a Schottky diode.

14. A memory on an integrated circuit, comprising:
    a plurality of word lines and a plurality of bit lines coupled to an array of memory cells, a word line in the plurality of word lines having an axis along which the word line if coupled to a plurality of memory cells in the array;
    the array of memory cells including the plurality of memory cells, the plurality of memory cells in combination having a first length in a direction along the axis;
    a pair of conductors coupled to the word line, the pair including a first conductor having a second length greater than the first length and a second conductor having a third length greater than the first length;
    a first plurality of diodes coupling the word line to the first conductor;
    a second plurality of diodes coupling the word line to the second conductor; and
    circuitry to apply bias voltages to the pair of conductors that induce current flow between first conductor and the second conductor, through the first plurality of diodes and the second plurality of diodes.

15. The memory of claim 14, wherein diodes in the first plurality of diodes have anodes coupled to the word line, and diode in the second plurality of diodes have cathodes coupled to the word line.

16. The memory of claim 14, wherein the word line comprises a metal conductor.

17. The memory of claim 14, wherein the word line is disposed in a first layer of the integrated circuit, and the first conductor and the second conductor are disposed in a second layer either above or below the first layer, and the first and second pluralities of diodes are vertical diodes between the first and second layers.

18. The memory of claim 14, including control circuitry to control the circuitry to apply bias voltages that induce said current flow to the first and second conductors after and coordinated with a block erase.

19. The memory of claim 14, including control circuitry to control the circuitry to apply bias voltages to the first and second conductors to induce said current flow interleaved in time among read, program and erase operations.

20. The memory of claim 14, including control circuitry to control the circuitry to apply bias voltages to the first and second diodes in which one of the bias voltages is a negative voltage.

21. The memory of claim 14, including control circuitry to maintain a count of program and erase cycles, program cycles or erase cycles, and when the count reaches a threshold, to cause the circuitry to apply bias voltages to the first and second conductors.

22. The memory of claim 14, wherein the memory cells comprise NAND memory cells.

23. The memory of claim 14, wherein the memory cells comprise semiconductor bodies on an insulating substrate.

24. The memory of claim 14, wherein the memory cells comprise floating gate flash memory cells.

25. The memory of claim 14, wherein the memory cells comprise flash memory cells having dielectric charge trapping structures including a tunneling layer, a charge trapping layer and a blocking layer, and wherein the tunneling layer includes a first layer of silicon oxide or silicon oxynitride less than 2 nm thick, a second layer of silicon nitride less than 3 nm thick, and a third layer comprising silicon oxide or silicon oxynitride less than 4 nm thick.

26. The memory of claim 14, wherein at least one diode of the first and second pluralities of diodes is a Schottky diode.

\* \* \* \* \*